United States Patent
Lee et al.

(10) Patent No.: US 12,201,009 B2
(45) Date of Patent: Jan. 14, 2025

(54) ORGANIC LIGHT EMITTING DIODE AND ORGANIC LIGHT EMITTING DEVICE INCLUDING THE SAME

(71) Applicant: LG DISPLAY CO., LTD., Seoul (KR)

(72) Inventors: Dong-Ryun Lee, Paju-si (KR); Hye-Gun Ryu, Paju-si (KR); Ik-Rang Choe, Paju-si (KR); Jun-Yun Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 616 days.

(21) Appl. No.: 17/519,297

(22) Filed: Nov. 4, 2021

(65) Prior Publication Data

US 2022/0149280 A1    May 12, 2022

(30) Foreign Application Priority Data

Nov. 10, 2020    (KR) .................. 10-2020-0149128

(51) Int. Cl.
| | |
|---|---|
| *H10K 85/30* | (2023.01) |
| *H10K 50/11* | (2023.01) |
| *H10K 50/19* | (2023.01) |
| *H10K 101/30* | (2023.01) |
| *H10K 101/40* | (2023.01) |

(52) U.S. Cl.
CPC ........... *H10K 85/322* (2023.02); *H10K 50/11* (2023.02); *H10K 50/19* (2023.02); *H10K 2101/30* (2023.02); *H10K 2101/40* (2023.02)

(58) Field of Classification Search
CPC ..................................... H10K 85/322
See application file for complete search history.

(56) References Cited

U.S. PATENT DOCUMENTS

| | | |
|---|---|---|
| 2019/0312207 A1 | 10/2019 | Hatakeyama et al. |
| 2020/0052226 A1 | 2/2020 | Seo et al. |

(Continued)

FOREIGN PATENT DOCUMENTS

| | | |
|---|---|---|
| CN | 110612304 A | 12/2019 |
| CN | 110828676 A | 2/2020 |

(Continued)

OTHER PUBLICATIONS

Partial Translation First Office Action Report dated Aug. 30, 2023, issued in China Patent Application No. 202111318695.4 Note: US2020259096A1, CN110828676A, and WO2020040298A1 cited therein are already of record.

(Continued)

*Primary Examiner* — Vu A Nguyen
(74) *Attorney, Agent, or Firm* — Morgan, Lewis & Bockius LLP

(57) ABSTRACT

An organic light emitting diode (OLED) including at least one emitting material layer (EML) disposed between two electrodes and comprising a first compound including a fused ring of boron and oxygen as a nuclear atom and a second compound including a fused ring of born and nitrogen as a nuclear atom and an organic light emitting device including the OLED is disclosed. The first compound and the second compound may be the same emitting material layer or adjacently disposed emitting material layers. The OLED can lower its driving voltage and improve its luminous efficiency using the first and second compounds with adjusting their energy levels.

22 Claims, 21 Drawing Sheets

(56) References Cited

U.S. PATENT DOCUMENTS

2020/0190115 A1*  6/2020  Hatakeyama .......... H10K 50/11
2020/0194689 A1   6/2020  Seo et al.
2020/0207760 A1   7/2020  Seo et al.
2020/0259096 A1   8/2020  Hatakeyama et al.
2021/0167289 A1   6/2021  Choe et al.

FOREIGN PATENT DOCUMENTS

| CN | 111377916 A | 7/2020 |
|---|---|---|
| CN | 105431439 B | 9/2020 |
| EP | 3109253 A1 | 12/2016 |
| JP | 2020-025099 A | 2/2020 |
| JP | 2020-136284 A | 8/2020 |
| KR | 10-2019-0116976 A | 10/2019 |
| KR | 10-2010-0016538 A | 2/2020 |
| KR | 10-2021-0066706 A | 6/2021 |
| TW | 202021962 A | 6/2020 |
| WO | 2018-212169 A1 | 11/2018 |
| WO | 2020-040298 A1 | 2/2020 |
| WO | 2020-045681 A1 | 3/2020 |

OTHER PUBLICATIONS

Second Office Action dated Aug. 21, 2023, issued in corresponding Taiwan Patent Application No. 110140910.
Office Action dated Sep. 20, 2022, issued in corresponding Japanese Patent Application No. 2021-180958.
Extended European Search Report dated Apr. 4, 2022, issued in corresponding European Patent Application No. 21205248.4.
Office Action dated Nov. 19, 2024, issued in corresponding Korean Patent Application No. 10-2020-0149128.

* cited by examiner

ORGANIC LIGHT EMITTING DIODE AND ORGANIC LIGHT EMITTING DEVICE INCLUDING THE SAME

CROSS-REFERENCE TO RELATED APPLICATIONS

This application claims the benefit under 35 U.S.C. § 119(a) to Korean Patent Application No. 10-2020-0149128, filed in the Republic of Korea on Nov. 10, 2020, the entire contents of which are incorporated herein by reference into the present application.

BACKGROUND

Technical Field

The present disclosure relates to an organic light emitting diode, and more specifically, to an organic light emitting diode having excellent luminous properties and an organic light emitting device having the diode.

Discussion of the Related Art

As display devices have become larger, there exists a need for a flat display device with lower spacing occupation. Among the flat display devices, a display device using an organic light emitting diode (OLED) has come into the spotlight.

The OLED can be formed as a thin film having a thickness less than 2000 Å and can be implement unidirectional or bidirectional images as electrode configurations. Also, the OLED can be formed on a flexible transparent substrate such as a plastic substrate so that OLED can implement a flexible or foldable display with ease. In addition, the OLED has advantages over LCD (liquid crystal display device), for example, the OLED can be driven at a lower voltage of 10 V or less and has very high color purity.

In the OLED, when electrical charges are injected into an emitting material layer between an electron injection electrode (i.e., cathode) and a hole injection electrode (i.e., anode), electrical charges are recombined to form excitons, and then emit light as the recombined excitons are shifted to a stable ground state.

Conventional fluorescent materials have shown low luminous efficiency because only the singlet excitons are involved in the luminescence process thereof. The phosphorescent materials in which triplet excitons as well as the singlet excitons are involved in the luminescence process have relatively high luminous efficiency compared to the fluorescent material. However, the metal complex as the representative phosphorescent material has too short luminous lifespan to be applicable into commercial devices.

SUMMARY

Accordingly, embodiments of the present disclosure are directed to an OLED and an organic light emitting device including the OLED that substantially obviates one or more of the problems due to the limitations and disadvantages of the related art.

An aspect of the present disclosure is to provide an OLED that can lower its driving voltage and enhance its luminous efficiency, color purity and luminous lifespan and an organic light emitting device including the diode.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concept, as embodied and broadly described, an organic light emitting diode comprises: a first electrode; a second electrode facing the first electrode; an emissive layer disposed between the first and second electrodes and including at least one emitting material layer, wherein the at least one emitting material layer includes a first compound and a second compound, and wherein the first compound has the following structure of Formula 1 or 1' and the second compound has the following structure of Formula 4 or 4':

[Formula 1]

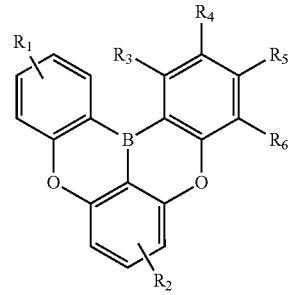

[Formula 1']

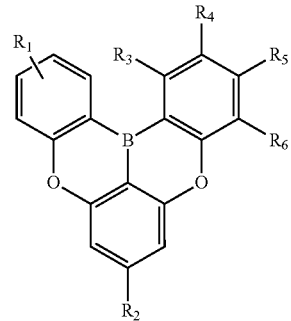

wherein each of $R_1$ and $R_2$ is independently selected from the group consisting of protium, deuterium, tritium, boryl, an unsubstituted or substituted amino group, an unsubstituted or substituted $C_1$-$C_{20}$ alkyl group, an unsubstituted or substituted $C_1$-$C_{20}$ alkyl amino group, an unsubstituted or substituted $C_6$-$C_{30}$ aromatic group and an unsubstituted or substituted $C_3$-$C_{30}$ hetero aromatic group; each of $R_3$ to $R_6$ is independently selected from the group consisting of protium, deuterium, tritium, boryl, an unsubstituted or substituted $C_1$-$C_{20}$ alkyl group, an unsubstituted or substituted $C_1$-$C_{20}$ alkyl amino group, an unsubstituted or substituted $C_6$-$C_{30}$ aromatic group and an unsubstituted or substituted $C_3$-$C_{30}$ hetero aromatic group, or adjacent two of $R_3$ to $R_6$ form an unsubstituted or substituted fused ring including boron and oxygen, and wherein adjacent at least two of $R_3$ to $R_6$ form an unsubstituted or substituted fused ring including boron and oxygen;

[Formula 4]

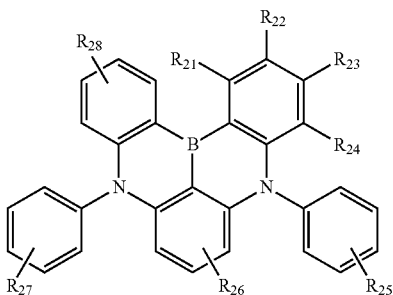

[Formula 4']

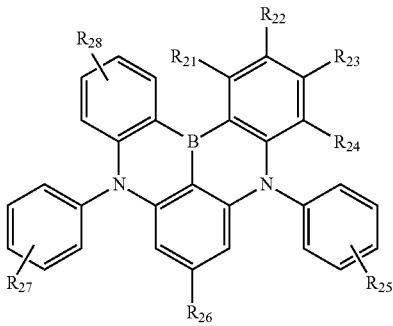

wherein each of $R_{21}$ to $R_{24}$ is independently selected from the group consisting of protium, deuterium, tritium, boryl, an unsubstituted or substituted amino group, an unsubstituted or substituted $C_1$-$C_{20}$ alkyl group, an unsubstituted or substituted $C_1$-$C_{20}$ alkyl amino group, an unsubstituted or substituted $C_6$-$C_{30}$ aromatic group and an unsubstituted or substituted $C_3$-$C_{30}$ hetero aromatic group, or adjacent two of $R_{21}$ to $R_{24}$ form an unsubstituted or substituted fused ring having boron and nitrogen and wherein adjacent at least two of $R_{21}$ to $R_{24}$ form an unsubstituted or substituted fused ring having boron and nitrogen; each of $R_{25}$ to $R_{28}$ is independently selected from the group consisting of protium, deuterium, tritium, boryl, an unsubstituted or substituted $C_1$-$C_{20}$ alkyl group, an unsubstituted or substituted $C_1$-$C_{20}$ alkyl amino group, an unsubstituted or substituted $C_6$-$C_{30}$ aromatic group and an unsubstituted or substituted $C_3$-$C_{30}$ hetero aromatic group.

As an example, a Highest Occupied Molecular Orbital (HOMO) energy level of the first compound and a HOMO energy level of the second compound satisfy the following relationship (1):

$$|HOMO^{DF2} - HOMO^{DF1}| < 0.3 \text{ eV} \quad (1).$$

wherein $HOMO^{DF2}$ is a HOMO energy level of the second compound and $HOMO^{DF1}$ is a HOMO energy level of the first compound.

In one exemplary aspect, an energy level bandgap between a singlet energy level and a triplet energy level of the second compound is less than an energy level bandgap between a singlet energy level and a triplet energy level of the first compound.

For example, the at least one emitting material layer may have a mono-layered structure.

Alternatively, the at least one emitting material layer includes a first emitting material layer disposed between the first and second electrodes and a second emitting material layer disposed between the first electrode and the first emitting material layer or between the first emitting material layer and the second electrode, and wherein the first emitting material layer includes the first compound and the second emitting material layer includes the second compound.

Optionally, the at least one emitting material layer may further comprise a third emitting material layer disposed oppositely to the second emitting material layer with respect to the first emitting material layer.

In another aspect, an organic light emitting device, such as an organic light emitting display device or an organic light emitting luminescent device comprises a substrate and the OLED disposed over the substrate, as described above.

It is to be understood that both the foregoing general description and the following detailed description are exemplary and explanatory and are intended to provide further explanation of the inventive concepts as claimed.

BRIEF DESCRIPTION OF THE DRAWING

The accompanying drawings, which are included to provide a further understanding of the disclosure, are incorporated in and constitute a part of this application, illustrate embodiments of the disclosure and together with the description serve to explain principles of the disclosure.

DETAILED DESCRIPTION

Reference and discussions will now be made below in detail to aspects, embodiments and examples of the disclosure, some examples of which are illustrated in the accompanying drawings.

The present disclosure relates to an organic light emitting diode (OLED) into which a first compound and a second compound having adjusted energy levels are applied in an identical EML or adjacently disposed EMLs and an organic light emitting device having the OLED. The OLED may be applied into an organic light emitting device such as an organic light emitting display device and an organic light emitting luminescent device. As an example, a display device applying the OLED will be described.

Figure 1:
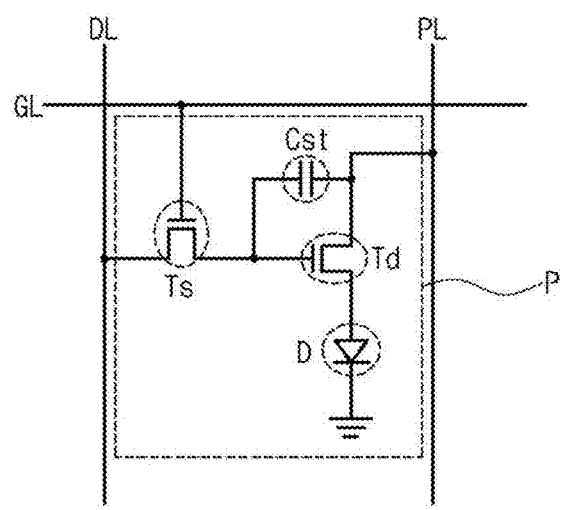
FIG. 1 is a schematic circuit diagram of an organic light emitting display device in accordance with the preset disclosure.

FIG. 1 is a schematic circuit diagram of an organic light emitting display device in accordance with the preset disclosure. As illustrated in FIG. 1, a gate line GL, a data line DL and power line PL, each of which cross each other to define a pixel region P, in the organic light emitting display device. A switching thin film transistor Ts, a driving thin film transistor Td, a storage capacitor Cst and an organic light emitting diode D are formed within the pixel region P. The pixel region P may include a first pixel region P1, a second pixel region P2 and a third pixel region P3 (see, FIG. 15).

The switching thin film transistor Ts is connected to the gate line GL and the data line DL, and the driving thin film transistor Td and the storage capacitor Cst are connected between the switching thin film transistor Ts and the power line PL. The organic light emitting diode D is connected to the driving thin film transistor Td. When the switching thin film transistor Ts is turned on by a gate signal applied into the gate line GL, a data signal applied into the data line DL is applied into a gate electrode of the driving thin film transistor Td and one electrode of the storage capacitor Cst through the switching thin film transistor Ts.

The driving thin film transistor Td is turned on by the data signal applied into the gate electrode so that a current proportional to the data signal is supplied from the power line PL to the organic light emitting diode D through the driving thin film transistor Td. And then, the organic light emitting diode D emits light having a luminance proportional to the current flowing through the driving thin film transistor Td. In this case, the storage capacitor Cst is charge with a voltage proportional to the data signal so that the voltage of the gate electrode in the driving thin film transistor Td is kept constant during one frame. Therefore, the organic light emitting display device can display a desired image.

Figure 2:
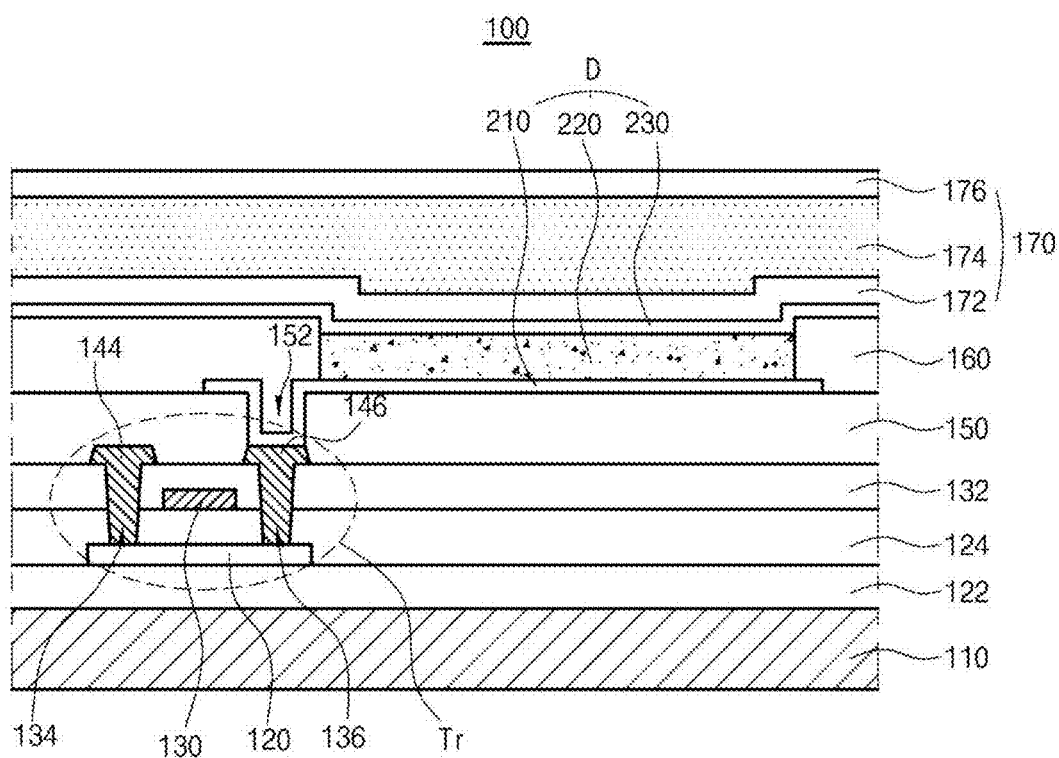
FIG. 2 is a schematic cross-sectional view illustrating an organic light emitting display device in accordance with an exemplary aspect of the present disclosure.

FIG. 2 is a schematic cross-sectional view of an organic light emitting display device 100 in accordance with an exemplary aspect of the present disclosure. All components of the organic light emitting device in accordance with all aspects of the present disclosure are operatively coupled and configured. As illustrated in FIG. 2, the organic light emitting display device 100 includes a substrate 110, a thin-film transistor Tr on the substrate 110, and an organic light emitting diode (OLED) D over the substrate 110 and connected to the thin film transistor Tr.

The substrate 110 may include, but is not limited to, glass, thin flexible material and/or polymer plastics. For example, the flexible material may be selected from the group, but is not limited to, polyimide (PI), polyethersulfone (PES), polyethylenenaphthalate (PEN), polyethylene terephthalate (PET), polycarbonate (PC) and combination thereof. The substrate 110, over which the thin film transistor Tr and the OLED D are arranged, form an array substrate.

A buffer layer 122 may be disposed over the substrate 110, and the thin film transistor Tr is disposed over the buffer layer 122. The buffer layer 122 may be omitted.

A semiconductor layer 120 is disposed over the buffer layer 122. In one exemplary aspect, the semiconductor layer 120 may include, but is not limited to, oxide semiconductor materials. In this case, a light-shield pattern may be disposed under the semiconductor layer 120, and the light-shield pattern can prevent light from being incident toward the semiconductor layer 120, and thereby, preventing the semiconductor layer 120 from being deteriorated by the light. Alternatively, the semiconductor layer 120 may include, but is not limited to, polycrystalline silicon. In this case, opposite edges of the semiconductor layer 120 may be doped with impurities.

A gate insulating layer 124 formed of an insulating material is disposed on the semiconductor layer 120. The gate insulating layer 124 may include, but is not limited to, an inorganic insulating material such as silicon oxide ($SiO_x$) or silicon nitride ($SiN_x$).

A gate electrode 130 made of a conductive material such as a metal is disposed over the gate insulating layer 124 so as to correspond to a center of the semiconductor layer 120. While the gate insulating layer 124 is disposed over a whole area of the substrate 110 in FIG. 2, the gate insulating layer 124 may be patterned identically as the gate electrode 130.

An interlayer insulating layer 132 formed of an insulating material is disposed on the gate electrode 130 with covering over an entire surface of the substrate 110. The interlayer insulating layer 132 may include, but is not limited to, an inorganic insulating material such as silicon oxide ($SiO_x$) or silicon nitride ($SiN_x$), or an organic insulating material such as benzocyclobutene or photo-acryl.

The interlayer insulating layer 132 has first and second semiconductor layer contact holes 134 and 136 that expose both sides of the semiconductor layer 120. The first and second semiconductor layer contact holes 134 and 136 are disposed over opposite sides of the gate electrode 130 with spacing apart from the gate electrode 130. The first and second semiconductor layer contact holes 134 and 136 are formed within the gate insulating layer 124 in FIG. 2. Alternatively, the first and second semiconductor layer contact holes 134 and 136 are formed only within the interlayer insulating layer 132 when the gate insulating layer 124 is patterned identically as the gate electrode 130.

A source electrode 144 and a drain electrode 146, which are formed of conductive material such as a metal, are disposed on the interlayer insulating layer 132. The source electrode 144 and the drain electrode 146 are spaced apart from each other with respect to the gate electrode 130, and contact both sides of the semiconductor layer 120 through the first and second semiconductor layer contact holes 134 and 136, respectively.

The semiconductor layer 120, the gate electrode 130, the source electrode 144 and the drain electrode 146 constitute the thin film transistor Tr, which acts as a driving element. The thin film transistor Tr in FIG. 2 has a coplanar structure in which the gate electrode 130, the source electrode 144 and the drain electrode 146 are disposed over the semiconductor layer 120. Alternatively, the thin film transistor Tr may have an inverted staggered structure in which a gate electrode is disposed under a semiconductor layer and a source and drain electrodes are disposed over the semiconductor layer. In this case, the semiconductor layer may comprise amorphous silicon.

A gate line GL and a data line DL, which cross each other to define a pixel region P, and a switching element Ts, which is connected to the gate line GL and the data line DL, may be further formed in the pixel region P of FIG. 1. The switching element Ts is connected to the thin film transistor Tr, which is a driving element. Besides, a power line PL is spaced apart in parallel from the gate line GL or the data line DL, and the thin film transistor Tr may further include a storage capacitor Cst configured to constantly keep a voltage of the gate electrode for one frame.

In addition, the organic light emitting display device 100 may include a color filter layer that comprises dyes or pigments for transmitting specific wavelength light of light emitted from the OLED D. For example, the color filter layer can transmit light of specific wavelength such as red (R), green (G), blue (B) and/or white (W). Each of red, green, and blue color filter may be formed separately in each pixel region. In this case, the organic light emitting display device 100 can implement full-color through the color filter.

For example, when the organic light emitting display device 100 is a bottom-emission type, the color filter layer may be disposed on the interlayer insulating layer 132 with corresponding to the OLED D. Alternatively, when the organic light emitting display device 100 is a top-emission type, the color filter layer may be disposed over the OLED D, that is, a second electrode 230.

A passivation layer 150 is disposed on the source and drain electrodes 144 and 146 over the whole substrate 110. The passivation layer 150 has a flat top surface and a drain contact hole 152 that exposes the drain electrode 146 of the thin film transistor Tr. While the drain contact hole 152 is disposed on the second semiconductor layer contact hole 136, it may be spaced apart from the second semiconductor layer contact hole 136.

The OLED D includes a first electrode 210 that is disposed on the passivation layer 150 and connected to the drain electrode 146 of the thin film transistor Tr. The OLED D further includes an emissive layer 220 and a second electrode 230 each of which is disposed sequentially on the first electrode 210.

The first electrode 210 is disposed in each pixel region. The first electrode 210 may be an anode and include a conductive material having a relatively high work function value. For example, the first electrode 210 may include, but is not limited to, a transparent conductive material such as indium tin oxide (ITO), indium zinc oxide (IZO), indium tin zinc oxide (ITZO), tin oxide (SnO), zinc oxide (ZnO), indium cerium oxide (ICO), aluminum doped zinc oxide (AZO), and the like.

In one exemplary aspect, when the organic light emitting display device 100 is a bottom-emission type, the first electrode 210 may have a mono-layered structure of a transparent conductive material. Alternatively, when the organic light emitting display device 100 is a top-emission type, a reflective electrode or a reflective layer may be disposed under the first electrode 210. For example, the reflective electrode or the reflective layer may include, but are not limited to, silver (Ag) or aluminum-palladium-copper (APC) alloy. In the OLED D of the top-emission type, the first electrode 210 may have a triple-layered structure of ITO/Ag/ITO or ITO/APC/ITO. In addition, a bank layer 160 is disposed on the passivation layer 150 in order to cover edges of the first electrode 210. The bank layer 160 exposes a center of the first electrode 210.

An emissive layer 220 is disposed on the first electrode 210. In one exemplary aspect, the emissive layer 220 may have a mono-layered structure of an emitting material layer (EML). Alternatively, the emissive layer 220 may have a multiple-layered structure of a hole injection layer (HIL), a hole transport layer (HTL), an electron blocking layer (EBL), an EML, a hole blocking layer (HBL), an electron transport layer (ETL) and/or an electron injection layer (EIL) (see, FIGS. 3, 8, 11 and 14). In one aspect, the emissive layer 220 may have one emitting part. Alternatively, the emissive layer 220 may have multiple emitting parts to form a tandem structure.

The second electrode 230 is disposed over the substrate 110 above which the emissive layer 220 is disposed. The second electrode 230 may be disposed over a whole display area and may include a conductive material with a relatively low work function value compared to the first electrode 210. The second electrode 230 may be a cathode. For example, the second electrode 230 may include, but is not limited to, aluminum (Al), magnesium (Mg), calcium (Ca), silver (Ag), alloy thereof or combination thereof such as aluminum-magnesium alloy (Al—Mg). When the organic light emitting display device 100 is a top-emission type, the second electrode 230 is thin so as to have light-transmissive (semi-transmissive) property.

In addition, an encapsulation film 170 may be disposed over the second electrode 230 in order to prevent outer moisture from penetrating into the OLED D. The encapsulation film 170 may have, but is not limited to, a laminated structure of a first inorganic insulating film 172, an organic insulating film 174 and a second inorganic insulating film 176.

Moreover, the organic light emitting display device 100 may have a polarizer in order to decrease external light reflection. For example, the polarizer may be a circular polarizer. When the organic light emitting display device 100 is a bottom-emission type, the polarizer may be disposed under the substrate 110. Alternatively, when the organic light emitting display device 100 is a top-emission type, the polarizer may be disposed over the encapsulation film 170. In addition, a cover window may be attached to the encapsulation film 170 or the polarizer. In this case, the substrate 110 and the cover window may have a flexible property, thus the organic light emitting display device 100 may be a flexible display device.

Figure 3:
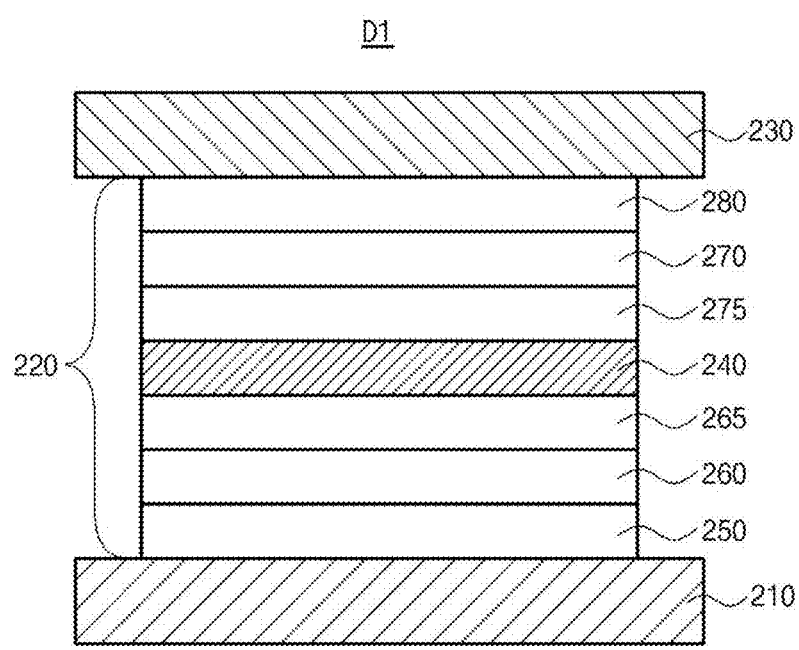
FIG. 3 is a schematic cross-sectional view illustrating an OLED in accordance with an exemplary aspect of the present disclosure.

Now, we will describe the OLED in more detail. FIG. 3 is a schematic cross-sectional view illustrating an OLED in accordance with an exemplary aspect of the present disclosure. As illustrated in FIG. 3, the OLED D1 comprises first and second electrodes 210 and 230 facing each other, and an emissive layer 220 having single emitting part disposed between the first and second electrodes 210 and 230. The organic light emitting display device 100 includes a red pixel region, a green pixel region and a blue pixel region, and the OLED D1 may be disposed in the blue pixel region.

The emissive layer 220 comprises an EML 240 disposed between the first and second electrodes 210 and 230. Also, the emissive layer 220 may comprise at least one of an HTL 260 disposed between the first electrode 210 and the EML 240 and an ETL 270 disposed between the second electrode 230 and the EML 240. In addition, the emissive layer 220 may further comprise at least one of an HIL 250 disposed between the first electrode 210 and the HTL 260 and an EIL 280 disposed between the second electrode 230 and the ETL 270. Alternatively, the emissive layer 220 may further comprise a first exciton blocking layer, i.e. an EBL 265 disposed between the HTL 260 and the EML 240 and/or a second exciton blocking layer, i.e. a HBL 275 disposed between the EML 240 and the ETL 270.

The first electrode 210 may be an anode that provides a hole into the EML 240. The first electrode 210 may include, but is not limited to, a conductive material having a relatively high work function value, for example, a transparent conductive oxide (TCO). In an exemplary aspect, the first electrode 210 may include, but is not limited to, ITO, IZO, ITZO, SnO, ZnO, ICO, AZO, and the like.

The second electrode 230 may be a cathode that provides an electron into the EML 240. The second electrode 230 may include, but is not limited to, a conductive material having a relatively low work function values, i.e., a highly reflective material such as Al, Mg, Ca, Ag, alloy thereof, combination thereof, and the like.

The EML 240 may comprise a first compound (Compound 1) DF1, a second compound (Compound 2) DF2 and, optionally a third compound (Compound 3) H. For example, the first compound DF1 may be a first delayed fluorescent material, the second compound DF2 may be a second delayed fluorescent material, and the third compound H may be host.

When holes and electrons meet each other to form excitons in the EML 240, a singlet exction with a paired spin state and a triplet exciton with an unpaired spin state are generated in a ratio of 1:3 in theory. Since the fluorescent materials of the related art can utilize only the singlet excitons, they exhibit low luminous efficiency. The phosphorescent materials can utilize the triplet excitons as well as the singlet excitons, while they show too short luminous lifespan to be applicable to commercial devices.

Each of the first compound DF1 and the second compound DF2 may be delayed fluorescent material having thermally activated delayed fluorescence (TADF) properties that can solve the problems accompanied by the conventional art fluorescent and/or phosphorescent materials. The delayed fluorescent material has very narrow energy level bandgap $\Delta E_{ST}^{DF1}$ or $\Delta E_{ST}^{DF2}$ between a singlet energy level $S_1^{DF1}$ or $S_1^{DF2}$ and a triplet energy level $T_1^{DF1}$ or $T_1^{DF2}$ (see, FIG. 7). Accordingly, the excitons of singlet energy level $S_1^{DF1}$ or $S_1^{DF2}$ as well as the excitons of triplet energy level $T_1^{DF1}$ or $T_1^{DF2}$ in the first compound DF1 and the second compound DF2 of the delayed fluorescent material can be transferred to an intermediate energy level state, i.e. ICT (intramolecular charge transfer) state ($S_1^{DF1}$ or $S_1^{DF2} \rightarrow ICT \leftarrow F\ T_1^{DF1}$ or $T_1^{DF2}$), and then the intermediate state excitons can be shifted to a ground state (ICT→$S_0$).

Since the delayed fluorescent material has the electron acceptor moiety spacing apart from the electron donor moiety within the molecule, it exists as a polarized state having a large dipole moment within the molecule. As interaction between highest occupied molecular orbital (HOMO) and lowest unoccupied molecular orbital (LUMO) in the delayed fluorescent material becomes little in the state where the dipole moment is polarized, the triplet excitons as well as the singlet excitons can be converted to ICT state.

The delayed fluorescent material must have an energy level bandgap $\Delta E_{ST}^{DF1}$ or $\Delta E_{ST}^{DF2}$ equal to or less than about 0.3 eV, for example, from about 0.05 to about 0.3 eV, between the singlet energy level $S_1^{DF1} S_1^{DF2}$ and the triplet energy level $T_1^{DF1}$ or $T_1^{DF2}$ so that exciton energy in both the singlet energy level $S_1^{DF1}$ or $S_1^{DF2}$ and the triplet energy level $T_1^{DF1}$ or $T_1^{DF2}$ can be transferred to the ICT state. The material having little energy level bandgap $\Delta E_{ST}^{DF1}$ or $\Delta E_{ST}^{DF2}$ between the singlet energy level $S_1^{DF1}$ or $S_1^{DF2}$ and the triplet energy level $T_1^{DF1}$ or $T_1^{DF2}$ can exhibit common fluorescence with Inter system Crossing (ISC) in which the excitons of singlet energy level $S_1^{DF1}$ or $S_1^{DF2}$ can be shifted to its ground state $S_0$, as well as delayed fluorescence with Reverser Inter System Crossing (RISC) in which the excitons of triplet energy level $T_1^{DF1}$ or $T_1^{DF2}$ can be converted upwardly to the excitons of singlet energy level $S_1^{DF1}$ or $S_1^{DF2}$, and then the exciton of singlet energy level $S_1^{DF1}$ or $S_1^{DF2}$ transferred from the triplet energy level $T_1^{DF1}$ or $T_1^{DF2}$ can be transferred to the ground state $S_0$. In other words, 25% excitons at the singlet energy level $S_1^{DF1}$ or $S_1^{DF2}$ and 75% excitons at the triplet energy level or $T_1^{DF2}$ of the first compound DF1 and the second compound DF2 of the delayed fluorescent materials are converted to ICT state, and then the converted excitons are shifted to the ground state $S_0$ with luminescence. Therefore, the delayed fluorescent material may have 100% internal quantum efficiency in theory.

The first compound DF1 may be delayed fluorescent material including a fused ring comprising boron and oxygen as a nuclear atom. The first compound DF1 of the delayed fluorescent material may have the following structure of Formula 1:

[Formula 1]

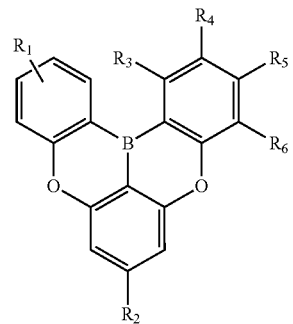

In Formula 1, each of $R_1$ and $R_2$ is independently selected from the group consisting of protium, deuterium, tritium, boryl, an unsubstituted or substituted amino group, an unsubstituted or substituted $C_1$-$C_{20}$ alkyl group, an unsubstituted or substituted $C_1$-$C_{20}$ alkyl amino group, an unsubstituted or substituted $C_6$-$C_{30}$ aromatic group and an unsubstituted or substituted $C_3$-$C_{30}$ hetero aromatic group; each of $R_3$ to $R_6$ is independently selected from the group consisting of protium, deuterium, tritium, boryl, an unsubstituted or substituted $C_1$-$C_{20}$ alkyl group, an unsubstituted or substituted $C_1$-$C_{20}$ alkyl amino group, an unsubstituted or substituted $C_6$-$C_{30}$ aromatic group and an unsubstituted or substituted $C_3$-$C_{30}$ hetero aromatic group, or adjacent two of $R_3$ to $R_6$ form an unsubstituted or substituted fused ring including boron and oxygen, and wherein adjacent at least two of $R_3$ to $R_6$ form an unsubstituted or substituted fused ring including boron and oxygen.

For example, each of the $C_6$-$C_{30}$ aromatic group and the $C_3$-$C_{30}$ hetero aromatic group that can constitute each of $R_1$ to $R_6$ in Formula 1 may be independently unsubstituted or substituted with at least one of a $C_1$-$C_{10}$ alkyl group, a $C_6$-$C_{30}$ aryl group and a $C_3$-$C_{30}$ hetero aryl group.

As an example, the $C_6$-$C_{30}$ aromatic group, which can be constitute each of $R_1$ to $R_6$ in Formula 1, may comprise independently, but is not limited to, be a $C_6$-$C_{30}$ aryl group, a $C_7$-$C_{30}$ aryl alkyl group, a $C_6$-$C_{30}$ aryl oxy group and a $C_6$-$C_{30}$ aryl amino group. Alternatively, the $C_3$-$C_{30}$ hetero aromatic group, which can be constitute each of $R_1$ to $R_6$, may comprise independently, but is not limited to, a $C_3$-$C_{30}$ hetero aryl group, a $C_4$-$C_{30}$ hetero aryl alkyl group, a $C_3$-$C_{30}$ hetero aryl oxy group and a $C_3$-$C_{30}$ hetero aryl amino group.

For example, the $C_6$-$C_{30}$ aryl group, which can constitute each of $R_1$ to $R_6$, may comprise independently, but is not limited to, a non-fused or fused aryl group such as phenyl, biphenyl, terphenyl, naphthyl, anthracenyl, pentalenyl, indenyl, indeno-indenyl, heptalenyl, biphenylenyl, indacenyl, phenalenyl, phenanthrenyl, benzo-phenanthrenyl, dibenzo-phenanthrenyl, azulenyl, pyrenyl, fluoranthenyl, triphenylenyl, chrysenyl, tetraphenylenyl, tetracenyl, pleiadenyl, picenyl, pentaphenylenyl, pentacenyl, fluorenyl, indeno-fluorenyl and spiro-fluorenyl.

Alternatively, the $C_3$-$C_{30}$ hetero aryl group, which can constitute each of $R_1$ to $R_6$, may comprise independently, but is not limited to, an unfused or fused hetero aryl group such as pyrrolyl, pyridinyl, pyrimidinyl, pyrazinyl, pyridazinyl, triazinyl, tetrazinyl, imidazolyl, pyrazolyl, indolyl, iso-indolyl, indazolyl, indolizinyl, pyrrolizinyl, carbazolyl, benzo-carbazolyl, dibenzo-carbazolyl, indolo-carbazolyl, indeno-carbazolyl, benzo-furo-carbazolyl, benzo-thieno-carbazolyl, carbolinyl, quinolinyl, iso-quinolinyl, phthalazinyl, quinoxalinyl, cinnolinyl, quinazolinyl, quinolizinyl, purinyl, benzo-quinolinyl, benzo-iso-quinolinyl, benzo-quinazolinyl, benzo-quinoxalinyl, acridinyl, phenazinyl, phenoxazinyl, phenothiazinyl, phenanthrolinyl, perimidinyl, phenanthridinyl, pteridinyl, naphthyridinyl, furanyl, pyranyl, oxazinyl, oxazolyl, oxadiazolyl, triazolyl, dioxanyl, benzo-furanyl, dibenzo-furanyl, thiopyranyl, xanthenyl, chromenyl, iso-chromenyl, thiazinyl, thiophenyl, benzo-thiophenyl, dibenzo-thiophenyl, difuro-pyrazinyl, benzo-furo-dibenzo-furanyl, benzothieno-benzo-thiophenyl, benzothieno-dibenzo-thiophenyl, benzothieno-benzo-furanyl, benzothieno-dibenzo-furanyl, N-substituted spiro-fluorenyl, spiro-fluoreno-acridinyl and spiro-fluoreno-xanthenyl.

Figure 4:
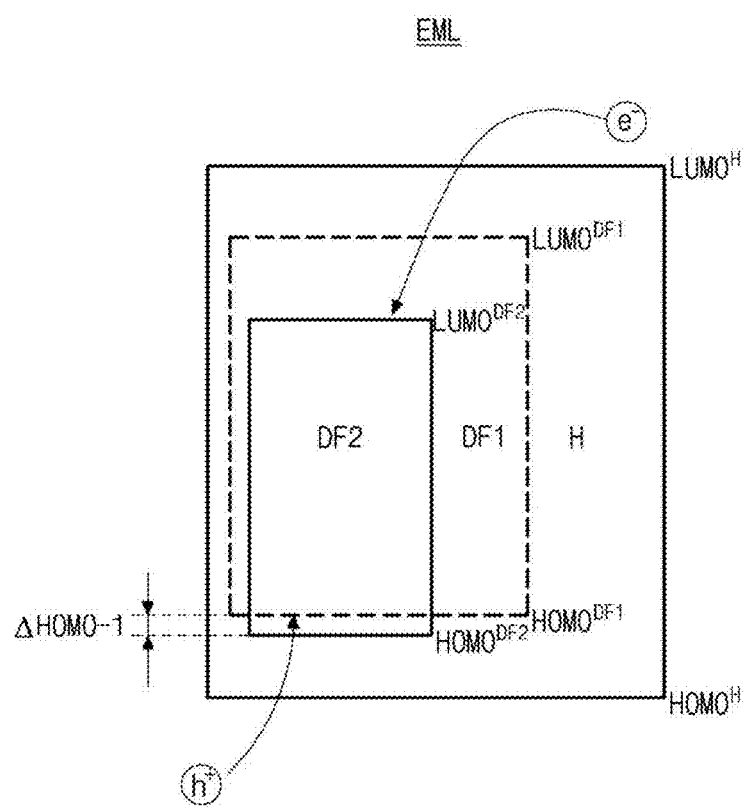
FIG. 4 is a schematic diagram illustrating energy levels among luminous materials in an EML are adjusted so that charges are transferred effectively to the second compound.

In Formula 1, adjacent at least two of $R_3$ to $R_6$ form a fused ring including born and nitrogen so that the first compound having the structure of Formula 1 has delayed fluorescent property. As the fused ring including boron and oxygen within the molecule, an energy level bandgap $E_g$ between a HOMO energy level $HOMO^{DF1}$ and a LUMO energy level $LUMO^{DF1}$ of the first compound DF1 may be larger than an energy level bandgap $E_g$ between a HOMO energy level $HOMO^{DF2}$ and a LUMO energy level $LUMO^{DF2}$ of the second compound DF2 (FIG. 4). Accordingly, the OLED D1 can implement hyper fluorescence as sufficient exciton energy is transferred to the second compound DF2 from the first compound DF1.

In an exemplary aspect, at least one, for example, at least two, of $R_1$, $R_2$ and the fused ring including boron and oxygen and formed by adjacent two of $R_3$ to $R_6$ may be a fused hetero aromatic group or ring including one or two nitrogen atoms as a nuclear atom. As an example, such a fused hetero aromatic group may comprise, but is not limited to, a carbazolyl moiety, an acridinyl moiety, an acridonyl moiety, a phenazinyl moiety, a phenoxazinyl moiety and a phenothiazinyl moiety.

In an exemplary aspect, at least one, for example, at least two, of $R_1$, $R_2$ and the fused ring including boron and oxygen and formed by adjacent two of $R_3$ to $R_6$ may comprise a carbazolyl group, an acridinyl group, an acridonyl group, a phenazinyl group, a phenoxazinyl group and a phenothiazinyl group, each of which is not fused other rings. Alternatively, at least one, for example, at least two, of $R_1$, $R_2$ and the fused ring including boron and oxygen and formed by adjacent two of $R_3$ to $R_6$ may comprise a carbazolyl group, an acridinyl group, an acridonyl group, a phenazinyl group, a phenoxazinyl group and a phenothiazinyl group, each of which is independently fused other rings. In this case, the other ring fused to the such fused hetero aromatic group may comprise a benzene ring, a naphthalene ring, an indene ring, a pyridine ring, an indole ring, a furan ring, a benzo-furan ring, a dibenzo-furan ring, a thiophene ring, a benzo-thiophene ring, a dibenzo-thiophene ring and/or combination thereof.

For example, at least one, for example, at least two, of $R_1$, $R_2$ and the fused ring including boron and oxygen and formed by adjacent two of $R_3$ to $R_6$ may comprise, but is not limited to, an indeno-carbazolyl group, an indolo-carbazolyl group, a benzo-furo-carbazolyl group and/or benzo-thieno-carbazolyl group. Alternatively, at least one, for example, at least two, of $R_1$, $R_2$ and the fused ring including boron and oxygen and formed by adjacent two of $R_3$ to $R_6$ may form a spiro structure. For example, at least one, for example, at least two, of $R_1$, $R_2$ and the fused ring including boron and oxygen and formed by adjacent two of $R_3$ to $R_6$ may comprise, but is not limited to, a spiro-fluoreno-acridinyl group. For example, at least one, for example, at least two, of $R_1$, $R_2$ and the fused ring including boron and oxygen and formed by adjacent two of $R_3$ to $R_6$ may comprise, but is not limited to, a carbazolyl moiety and/or an acridinyl moiety each of which is unsubstituted or substituted with at least one of a $C_1$-$C_{10}$ alkyl group, a $C_6$-$C_{30}$ aryl group and $C_3$-$C_{30}$ hetero aryl group.

For example, the fused hetero aryl group constituting each of $R_1$ to $R_6$ may be unsubstituted or substituted with at least one selected from a $C_1$-$C_{10}$ alkyl group (e.g. a $C_1$-$C_5$ alkyl group such as tert-butyl group), a $C_6$-$C_{30}$ aryl group (e.g. a $C_6$-$C_{15}$ aryl group such as phenyl) and a $C_3$-$C_{30}$ hetero aryl group (e.g. a $C_3$-$C_{is}$ hetero aryl group such as pyridyl).

In an exemplary aspect, $R_4$ and $R_5$ in Formula 1 may form a fused ring including boron and oxygen. The first compound DF1 having that structure may have, but is not limited to, the following structure of Formula 2A or 2B:

[Formula 2A]

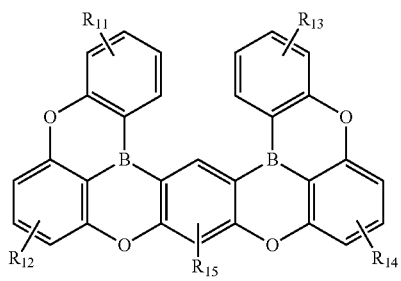

[Formula 2B]

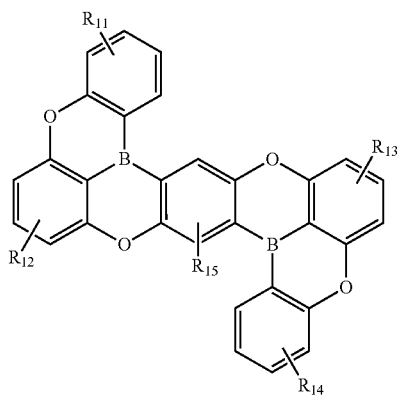

In Formula 2A or 2B, each of $R_{11}$ to $R_{15}$ is independently selected from the group consisting of protium, deuterium, tritium, boryl, an unsubstituted or substituted amino group, an unsubstituted or substituted $C_1$-$C_{20}$ alkyl group, an unsubstituted or substituted $C_1$-$C_{20}$ alkyl amino group, an unsubstituted or substituted $C_6$-$C_{30}$ aromatic group and an unsubstituted or substituted $C_3$-$C_{30}$ hetero aromatic group, and wherein at least one of $R_{11}$ to $R_{14}$ is selected from the group consisting of an unsubstituted or substituted carbazolyl moiety, an unsubstituted or substituted acridinyl moiety, an unsubstituted or substituted acridonyl moiety, an unsubstituted or substituted phenazinyl moiety, an unsubstituted or substituted phenoxazinyl moiety and an unsubstituted or substituted phenothiazinyl moiety.

As an example, each of the $C_6$-$C_{30}$ aromatic group and the $C_3$-$C_{30}$ hetero aromatic group of $R_{11}$ to $R_{15}$, for example, each of the carbazolyl moiety, the acridinyl moiety, the acridonyl moiety, the phenazinyl moiety, the phenoxazinyl moiety and the phenothiazinyl moiety of $R_{11}$ to $R_{14}$, may be independently unsubstituted or substituted with at least one of a $C_1$-$C_{10}$ alkyl group, a $C_6$-$C_{30}$ aryl group and a $C_3$-$C_{30}$ hetero aryl group.

The organic compound having the structure of Formula 2A or 2B has the delayed fluorescent property and has a singlet energy level, a triplet energy level, a HOMO energy level and a LUMO energy level that can transfer sufficient exciton energies to the second compound DF2, as described below. As an example, the first compound DF1 having the structure of Formula 2A or 2B may be selected from, but is not limited to, the following compounds of the Formula 3:

[Formula 3]

1-1

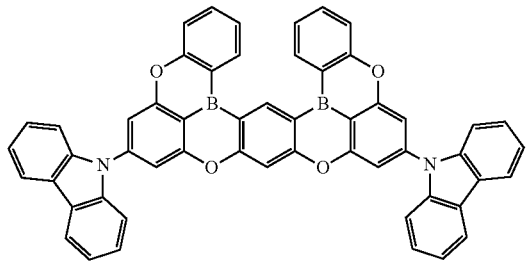

1-2

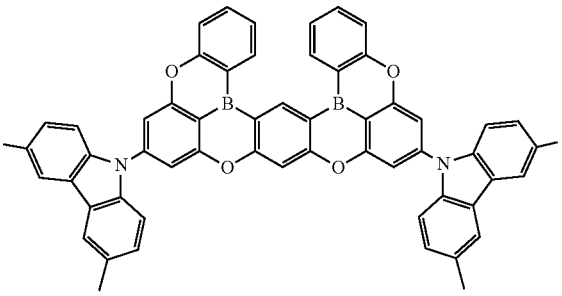

1-3

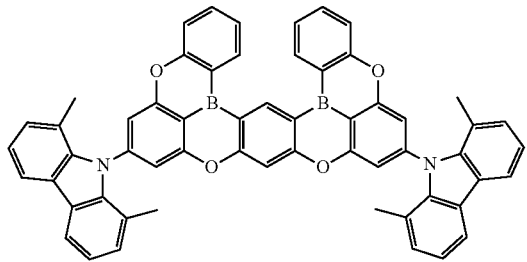

1-4

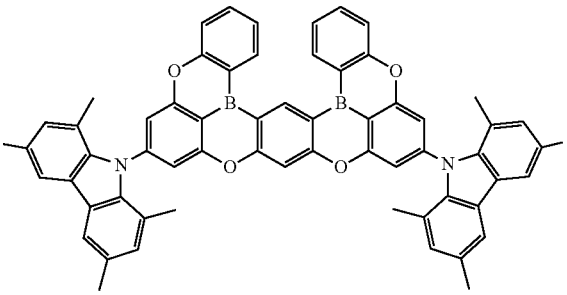

1-5
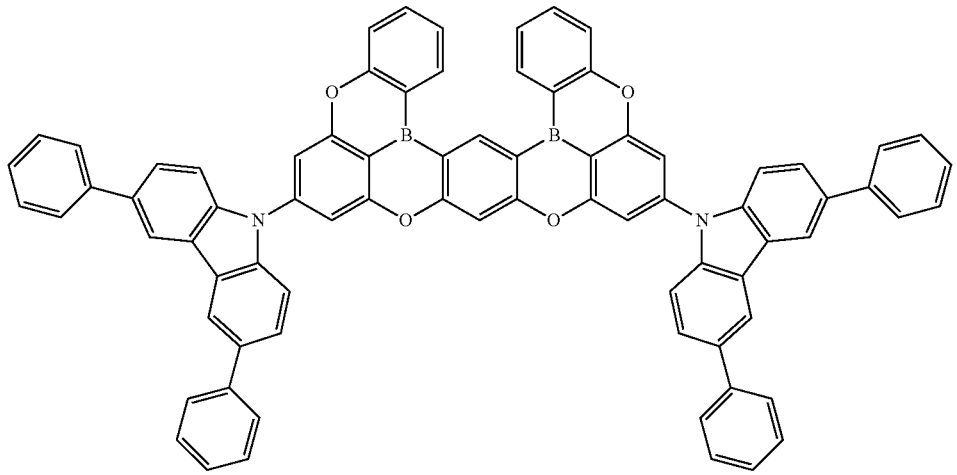
1-6
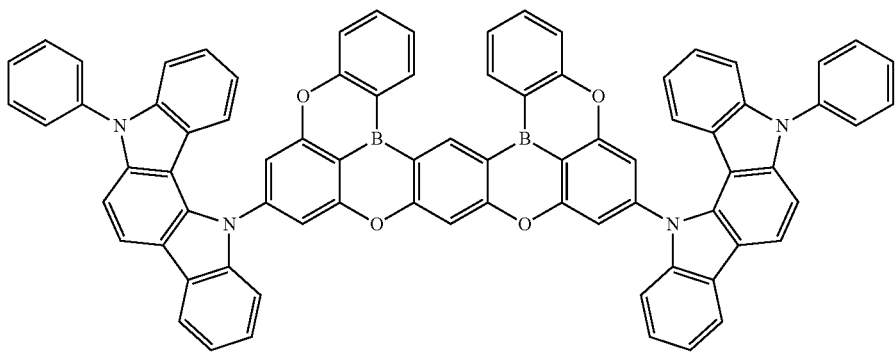
1-7
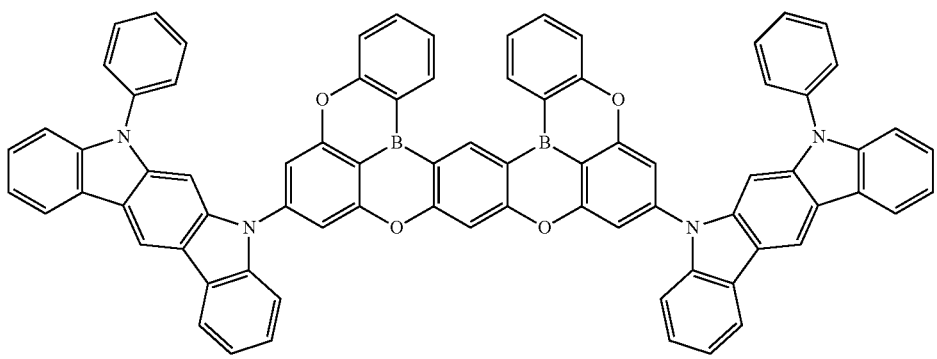
1-8
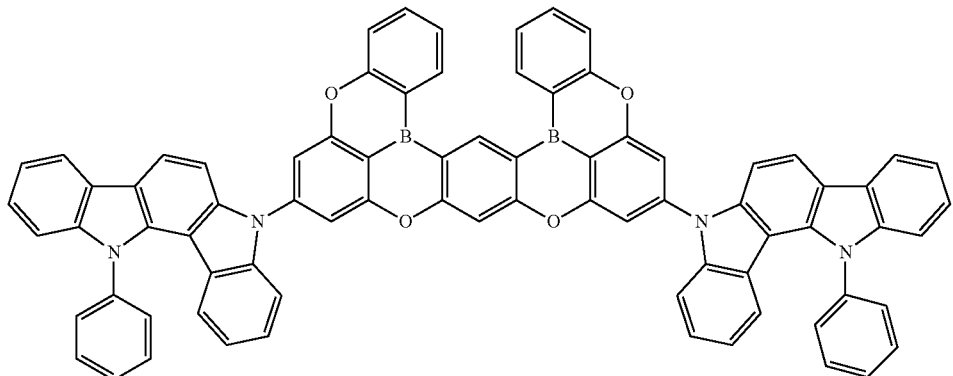

-continued
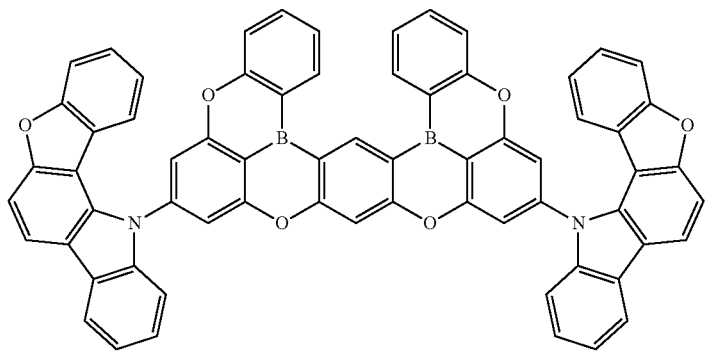
1-9
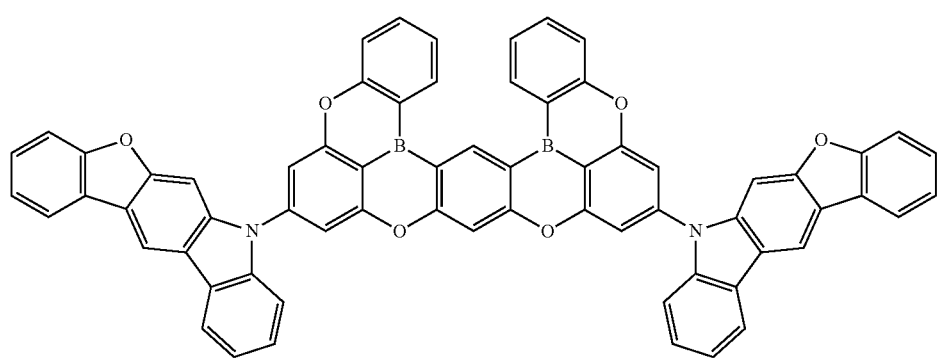
1-10
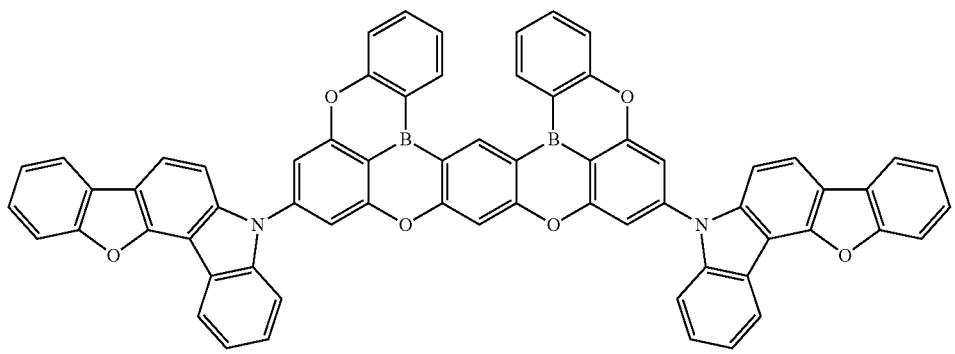
1-11
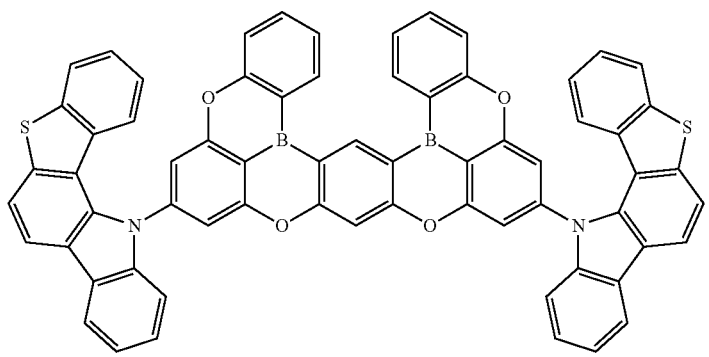
1-12

1-13
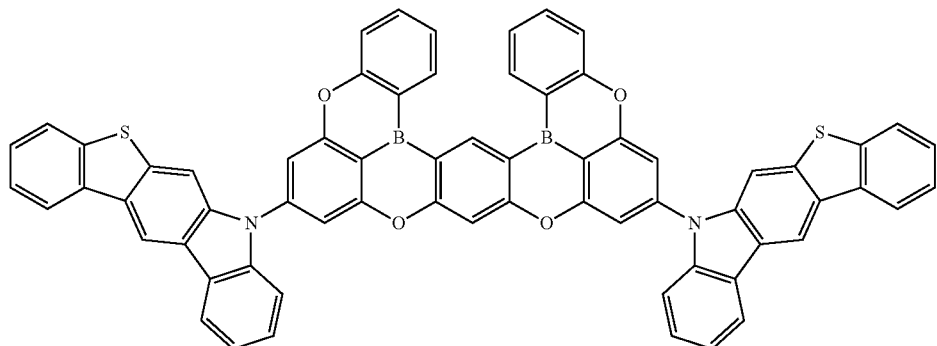
1-14
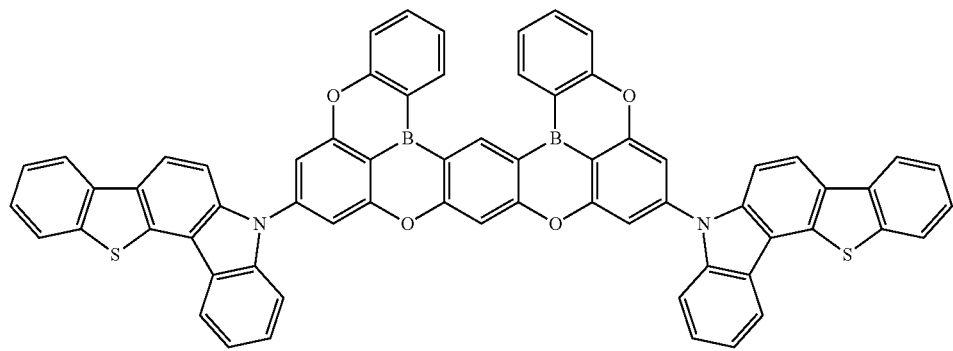
1-15
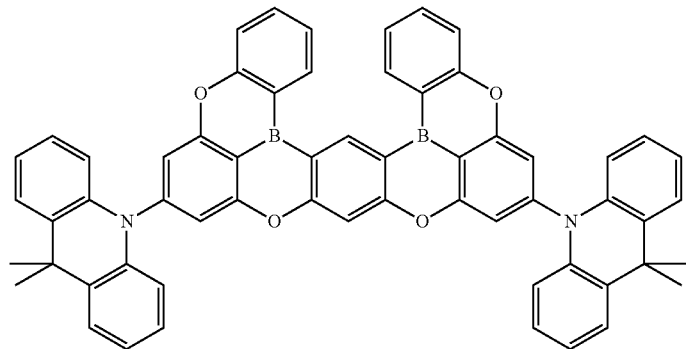
1-16
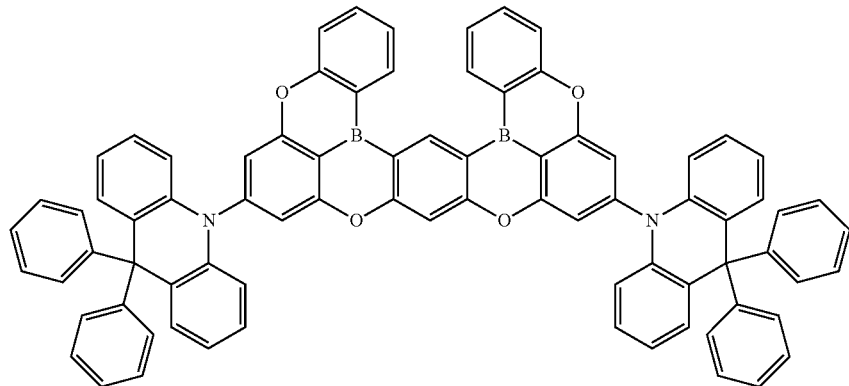

1-17
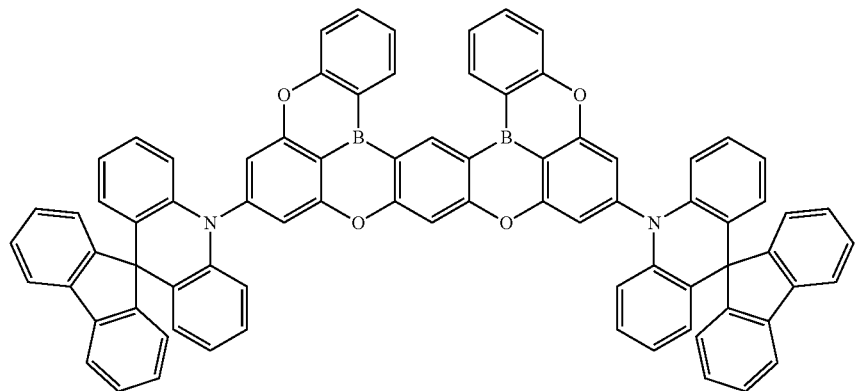
1-18
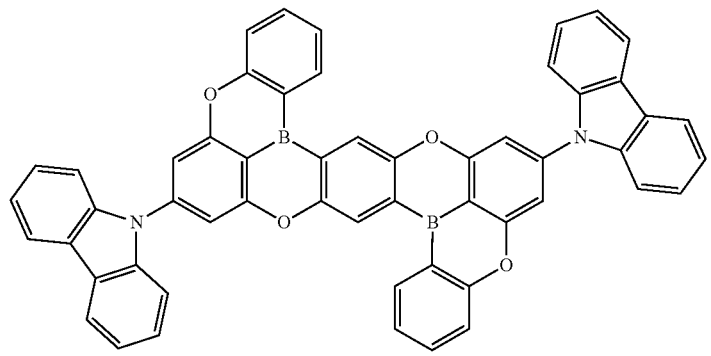
1-19
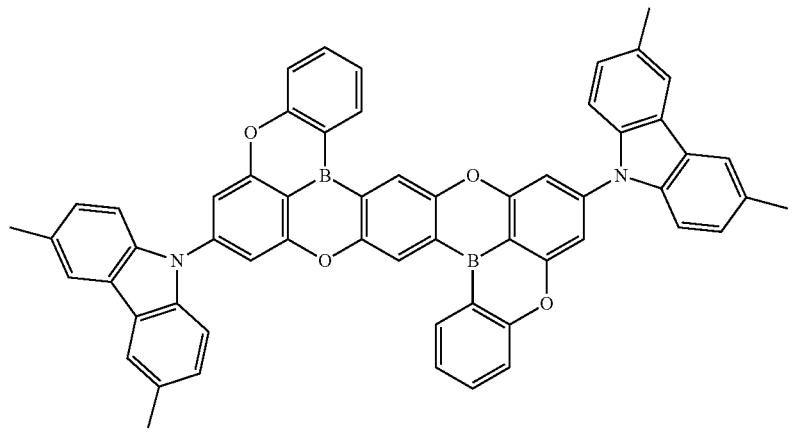
1-20
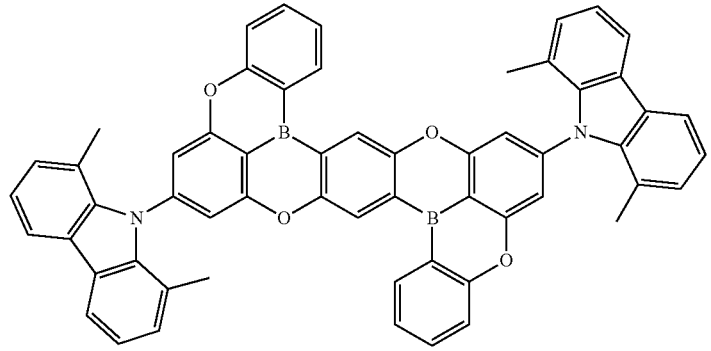

-continued
1-21
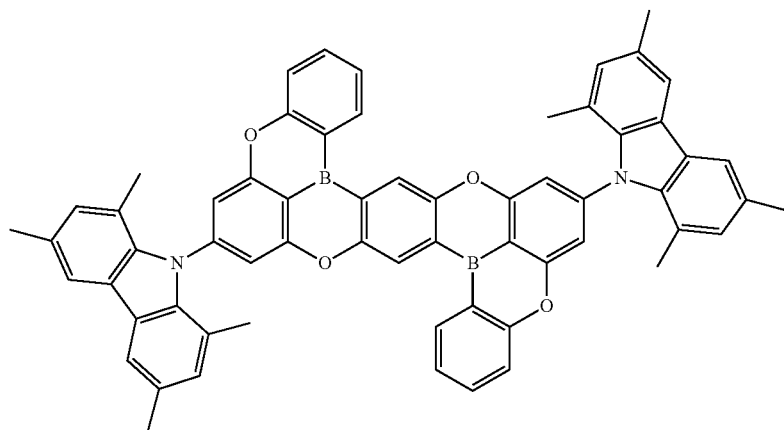
1-22
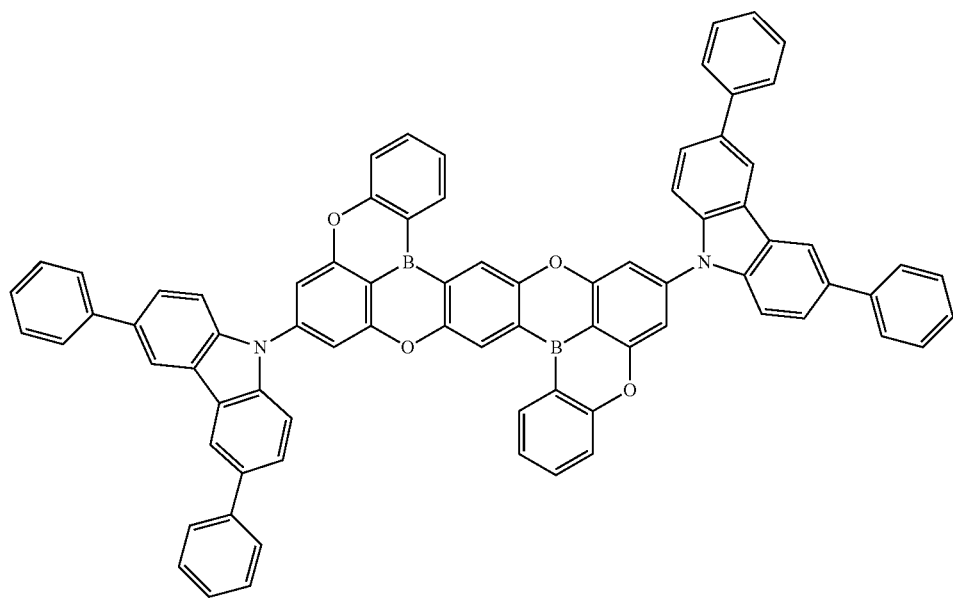
1-23
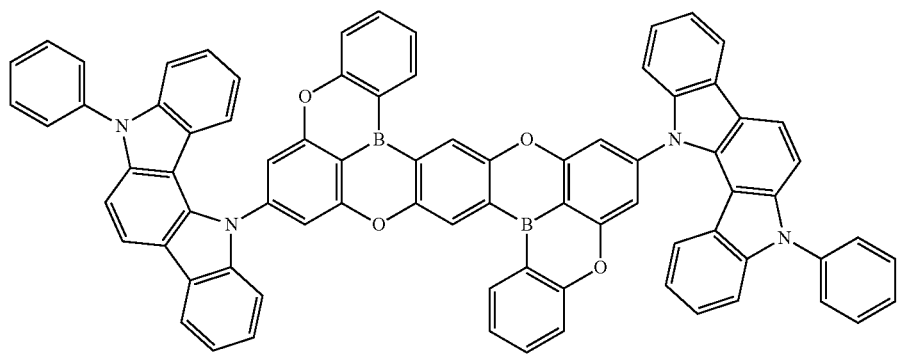

1-24
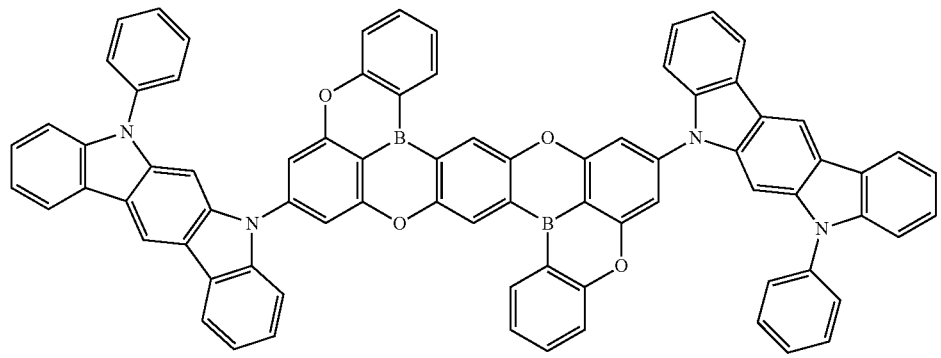
1-25
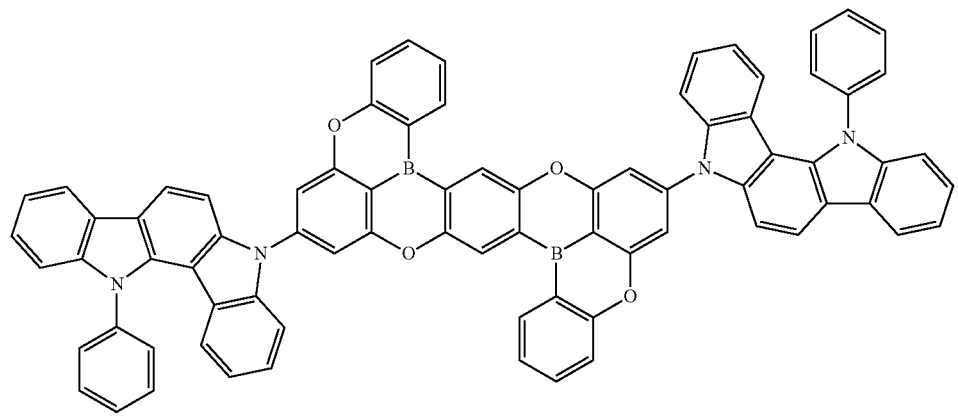
1-26
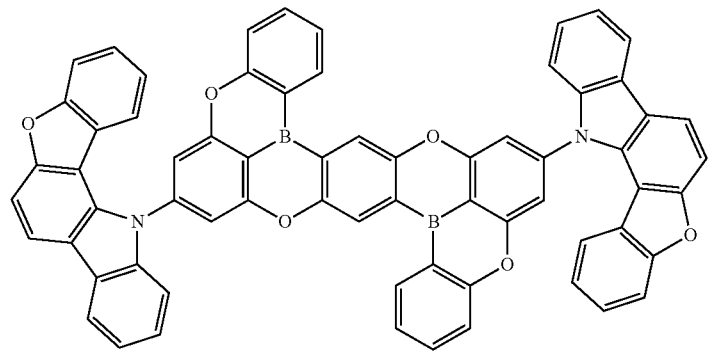
1-27
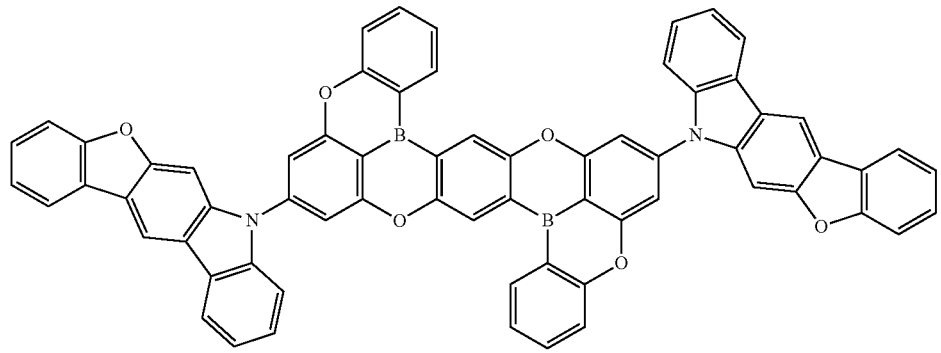

-continued
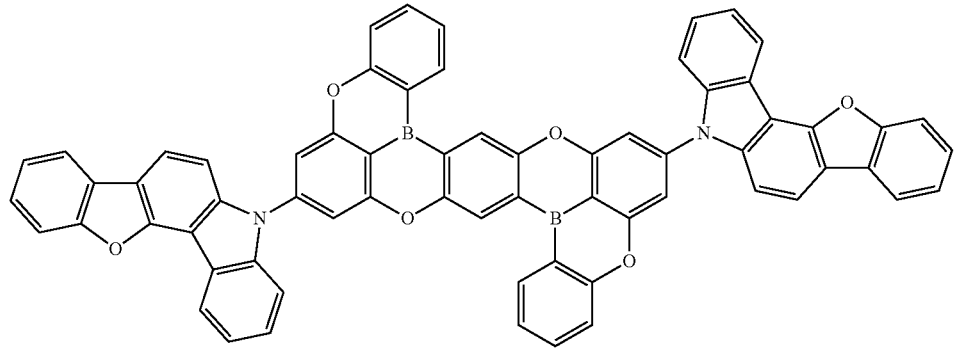
1-28
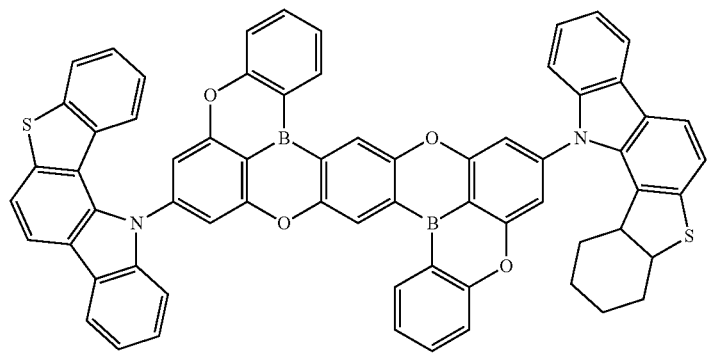
1-29
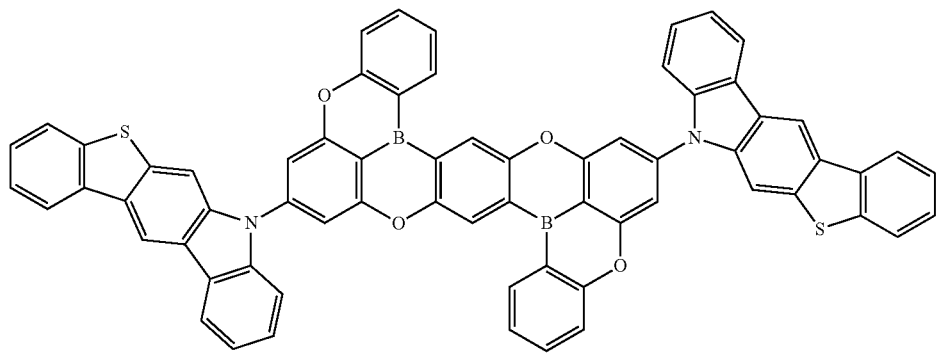
1-30
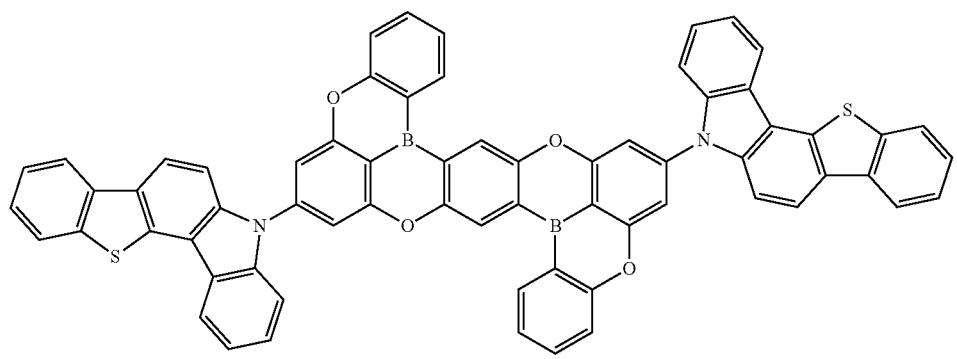
1-31

1-32

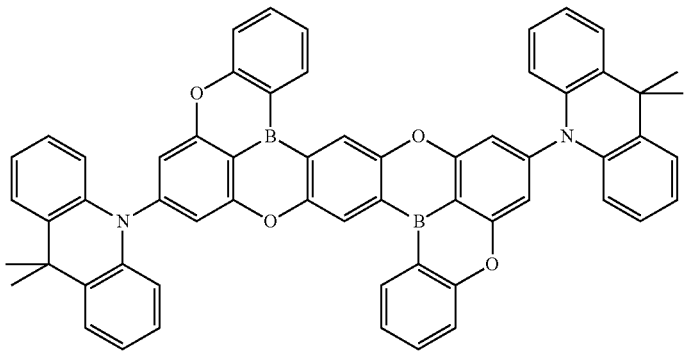

1-33

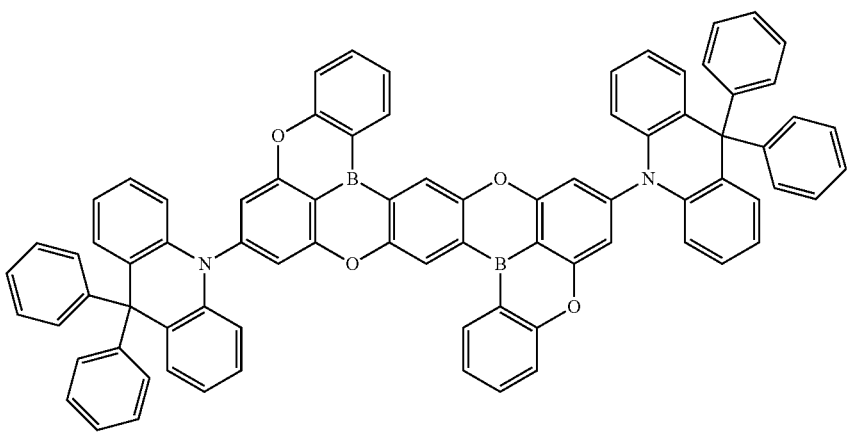

1-34

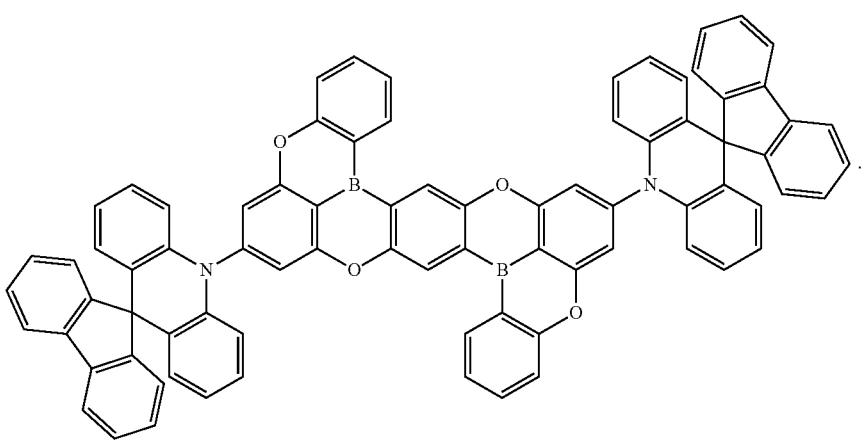

The first compound DF1 of the delayed fluorescent material has very narrow energy level bandgap $\Delta E_{ST}^{DF1}$ (e.g. less than or equal to about 0.3 eV) between a singlet energy level $S_1^{DF1}$ and a triplet energy level $T_1^{DF1}$ (see, FIG. 7) and has excellent quantum efficiency because the triplet exciton energy of the first compound DF1 can be converted to its singlet exciton energy by RISC mechanism.

However, the first compound DF1 having the structure of Formulae 1 to 3 has a distorted chemical conformation owing to the electron acceptor moiety and the electron donor moiety and requires addition charge transfer transition (CT transition) because of utilizing triplet excitons. The first compound DF1 having the structure of Formulae 1 to 3 has very wide FWHM (full-width at half maximum) owing to the luminescence property caused by the CT luminous mechanism, thus its color purity is very limited.

Also, a part of exciton energy at the singlet energy level $S_1^{DF1}$ of the first compound DF1 is converted to its triplet energy level $T_1^{DF1}$ by ISC (Inter System Crossing), and as a result, triplet excitons that are not converted upwardly to its singlet energy level $S_1^{DF1}$ and resident at the triplet energy level $T_1^{DF1}$ are generated. As those triplet excitons interact with peripheral triplet excitons and/or polarons, they are quenched by TTA (triplet-triplet annihilation) or TPA (triplet-polaron annihilation). In other words, when the EML 240 only includes the first compound DF1, the triplet exciton energy of the first compound DF1 cannot contribute to the emissions. In addition, the luminous lifespan of the OLED D1 may be decreased owing to the quenching such as TTA and/or TPA.

The EML 240 includes the second compound DF2 of the second delayed fluorescent material in order to maximize the luminous property of the first compound DF1 of the first delayed fluorescent material and to implement hyper fluorescence. As described above, the first compound DF1 and the second compound DF2 having the delayed fluorescent property can utilize the triplet exciton energy as well as the singlet exciton energy. When the EML 240 includes the second compound DF2 of the second delayed fluorescent material having proper energy levels compared to the first compound DF1 of the first delayed fluorescent material, the exciton energy emitted from the first compound DF1 is absorbed by the second compound DF2, and then the exciton energy absorbed by the second compound DF2 generates 100% singlet exciton with maximizing its luminous efficiency.

The singlet exciton energy of the first compound DF1 of the first delayed fluorescent material, which includes the singlet exciton energy of the first compound DF1 converted from its own triplet exciton energy and initial singlet exciton energy in the EML 240, is transferred to the second compound DF2 of the second delayed fluorescent material in the same EML 240 via Forster resonance energy transfer (FRET) mechanism, and the ultimate emission is occurred at the second compound DF2. A compound having an absorption spectrum widely overlapped with a photoluminescence spectrum of the first compound DF1 may be used as the second compound DF2 so that the exciton energy generated at the first compound DF1 may be efficiently transferred to the second compound DF2. The second compound DF2 has relatively narrow FWHM, and thus can improve color purity.

The second compound DF2 in the EML 240 may be blue delayed fluorescent material. For example, the second compound DF2 in the EML 240 may be a boron-based compound with its FWHM equal to or less than about 35 nm. As an example, the second compound DF2 of the boron-based compound may have the following structure of Formula 4:

[Formula 4]

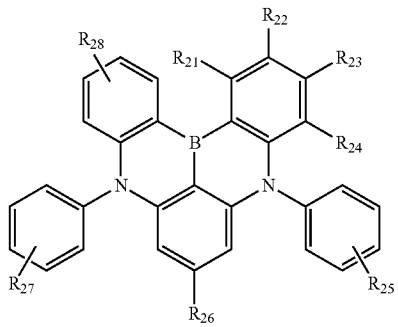

In Formula 4, each of $R_{21}$ to $R_{24}$ is independently selected from the group consisting of protium, deuterium, tritium, boryl, an unsubstituted or substituted amino group, an unsubstituted or substituted $C_1$-$C_{20}$ alkyl group, an unsubstituted or substituted $C_1$-$C_{20}$ alkyl amino group, an unsubstituted or substituted $C_6$-$C_{30}$ aromatic group and an unsubstituted or substituted $C_3$-$C_{30}$ hetero aromatic group, or adjacent two of $R_{21}$ to $R_{24}$ form an unsubstituted or substituted fused ring having boron and nitrogen, and wherein at least two of $R_{21}$ to $R_{24}$ form an unsubstituted or substituted fused ring having boron and nitrogen; each of $R_{25}$ to $R_{28}$ is independently selected from the group consisting of protium, deuterium, tritium, boryl, an unsubstituted or substituted $C_1$-$C_{20}$ alkyl group, an unsubstituted or substituted $C_1$-$C_{20}$ alkyl amino group, an unsubstituted or substituted $C_6$-$C_{30}$ aromatic group and an unsubstituted or substituted $C_3$-$C_{30}$ hetero aromatic group.

As an example, each of the $C_6$-$C_{30}$ aromatic group and the $C_3$-$C_{30}$ hetero aromatic group of $R_{21}$ to $R_{28}$ may be independently unsubstituted or substituted with at least one of a $C_1$-$C_{10}$ alkyl group, a $C_6$-$C_{30}$ aryl group and a $C_3$-$C_{30}$ hetero aryl group. Similar to Formula 1, the $C_6$-$C_{30}$ aromatic group, which can be constituted each of $R_{21}$ to $R_{28}$, may comprise independently, but is not limited to, a $C_6$-$C_{30}$ aryl group, a $C_7$-$C_{30}$ aryl alkyl group, a $C_6$-$C_{30}$ aryl oxy group and a $C_6$-$C_{30}$ aryl amino group. Alternatively, the $C_3$-$C_{30}$ hetero aromatic group, which can be constitute each of $R_{21}$ to $R_{28}$, may comprise independently, but is not limited to, a $C_3$-$C_{30}$ hetero aryl group, a $C_4$-$C_{30}$ hetero aryl alkyl group, a $C_3$-$C_{30}$ hetero aryl oxy group and a $C_3$-$C_{30}$ hetero aryl amino group.

The boron-based compound having the structure of Formula 4 has very excellent luminous property. The boron-based compound having the structure of Formula 4 has a very wide plate-like structure so that it can receive efficiently the exciton energy emitted from the first compound DF1, and therefore, can maximize the luminous efficiency in the EML 240.

In one exemplary aspect, two adjacent groups of $R_{21}$ to $R_{24}$, for example $R_{22}$ and $R_{23}$, in Formula 4 may form a fused ring having boron and nitrogen atoms as a nuclear atom. For example, the second compound DF2 may include a boron-based compound having the following structure of Formula 5A or Formula 5B:

[Formula 5A]

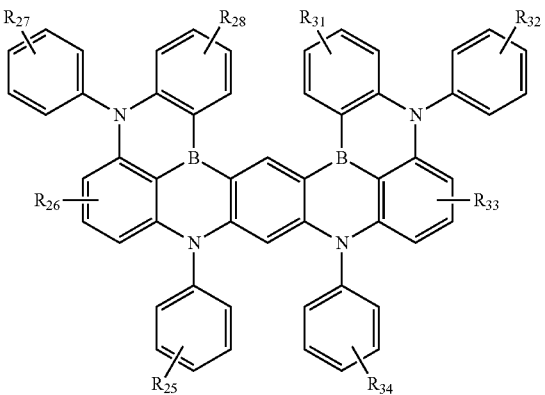

[Formula 5B]

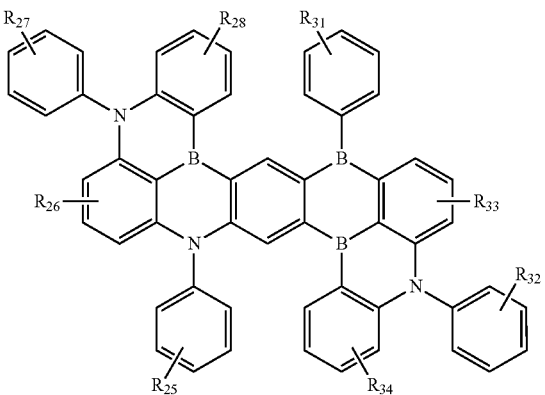

In Formulae 5A and 5B, each of $R_{25}$ to $R_{28}$ and each of $R_{31}$ to $R_{34}$ is independently selected from the group consisting of protium, deuterium, tritium, boryl, an unsubstituted or substituted $C_1$-$C_{20}$ alkyl group, an unsubstituted or substituted $C_1$-$C_{20}$ alkyl amino group, an unsubstituted or substituted $C_6$-$C_{30}$ aromatic group and an unsubstituted or substituted $C_3$-$C_{30}$ hetero aromatic group.

For example, each of the $C_6$-$C_{30}$ aromatic group and the $C_3$-$C_{30}$ hetero aromatic group, each of which can be independently each of $R_{25}$ to $R_{28}$ and each of $R_{31}$ to $R_{34}$, may be independently unsubstituted or substituted with at least one of a $C_1$-$C_{10}$ alkyl group, a $C_6$-$C_{30}$ aryl group and a $C_3$-$C_{30}$ hetero aryl group.

In an exemplary aspect, the second compound DF2 of the boron-based compound may be selected from, but is not limited to, the following compounds having the structure of Formula 6:

[Formula 6]

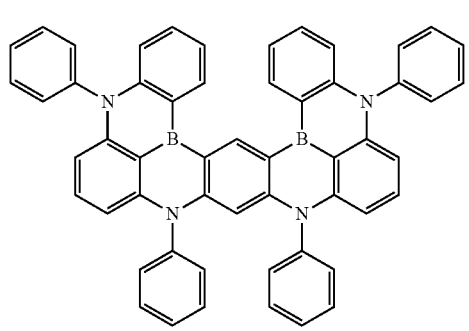

2-1

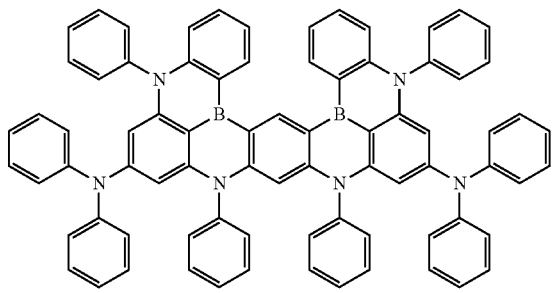

2-2

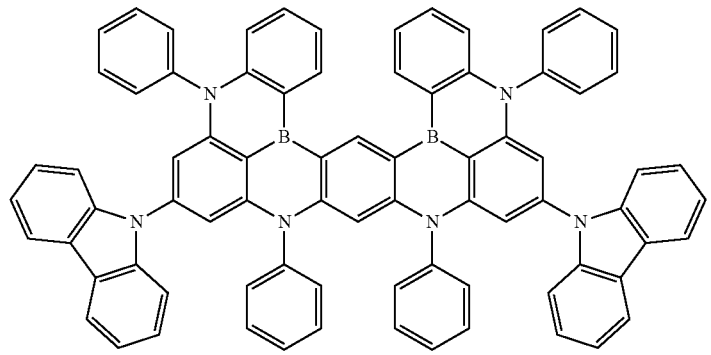

2-3

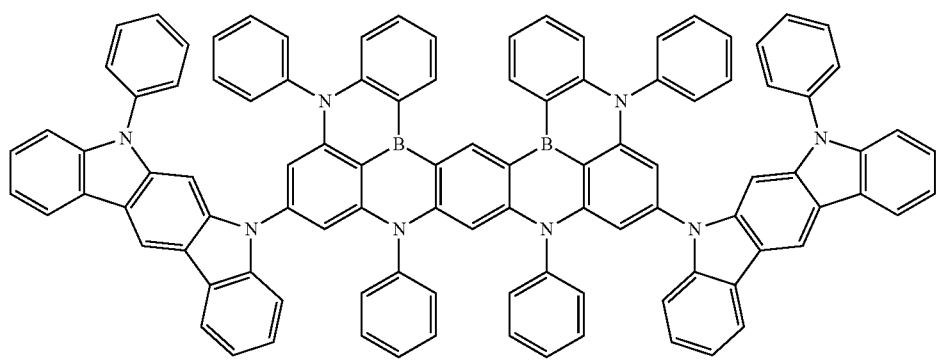

2-4

-continued
2-5
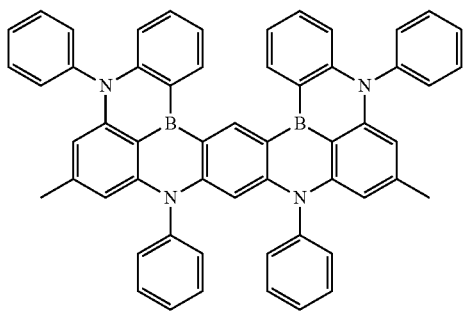
2-6
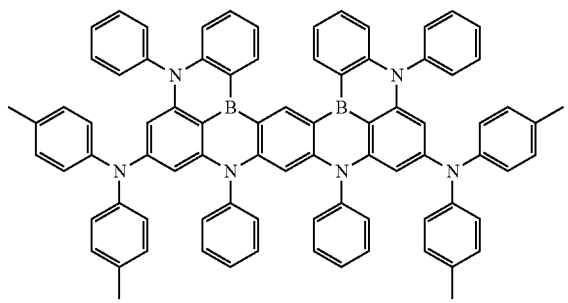
2-7
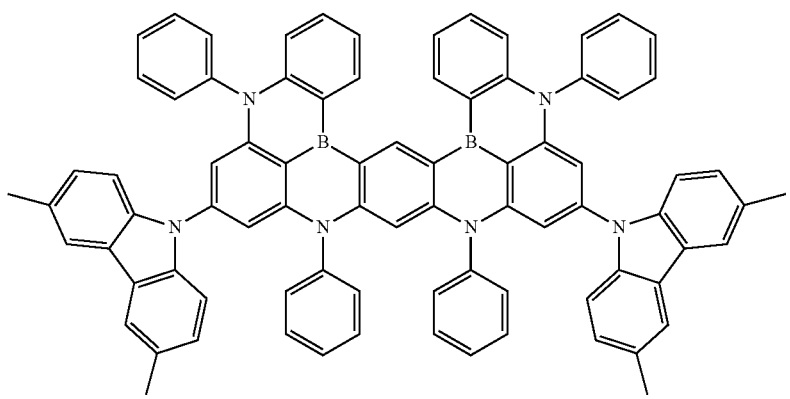
2-8
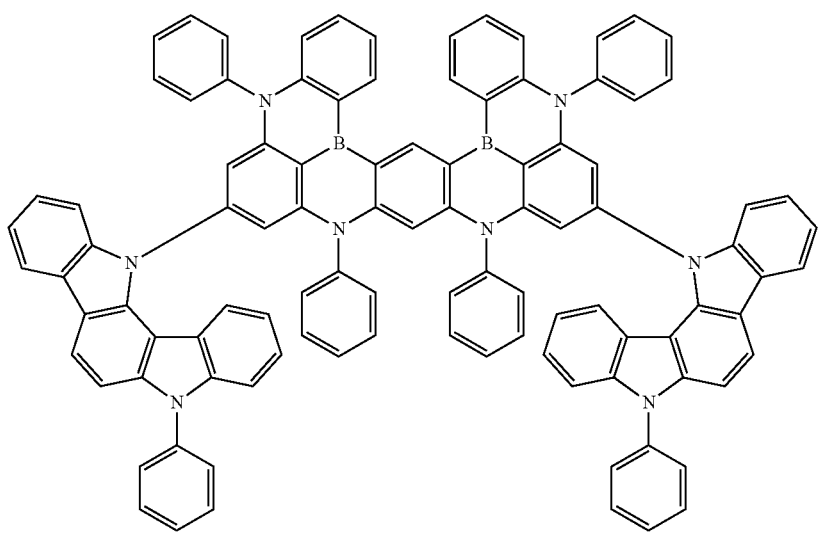
2-9
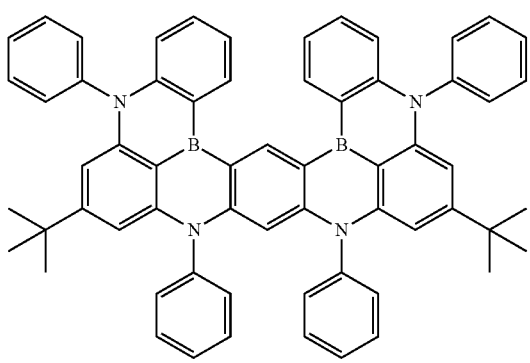

-continued
2-10
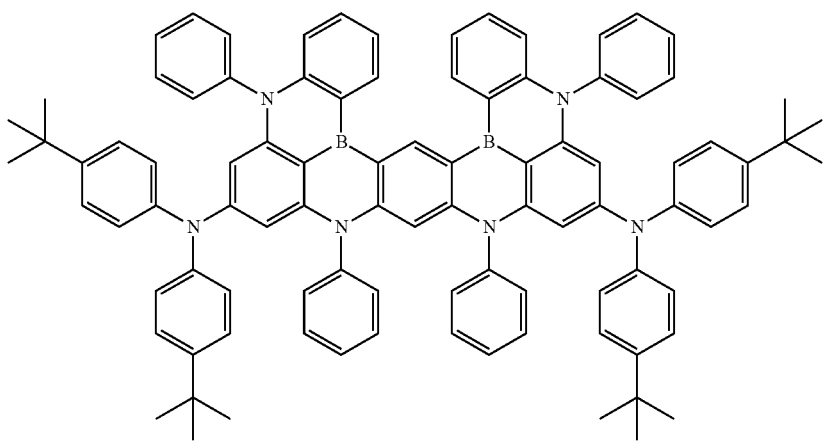
2-11
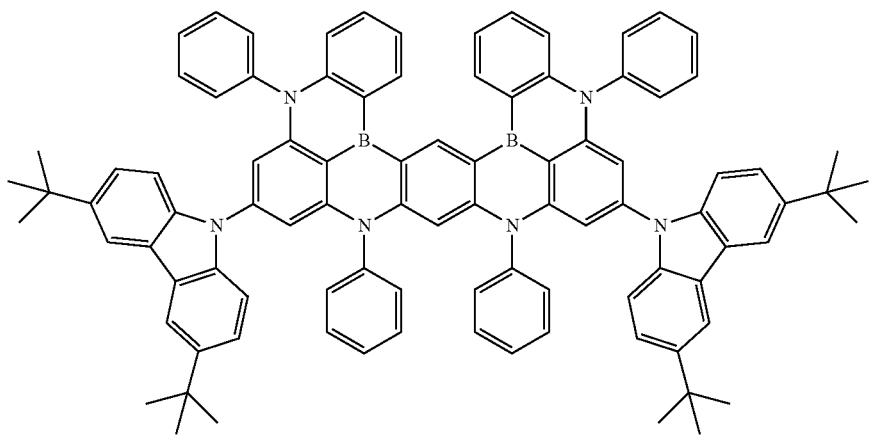
2-12
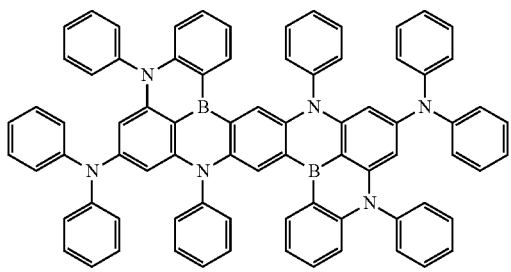
2-13
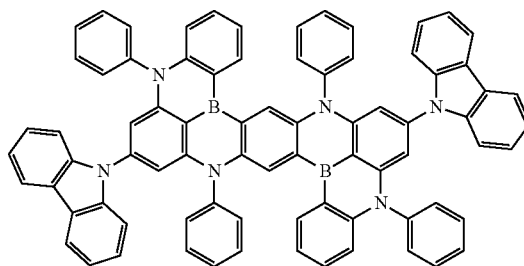

-continued

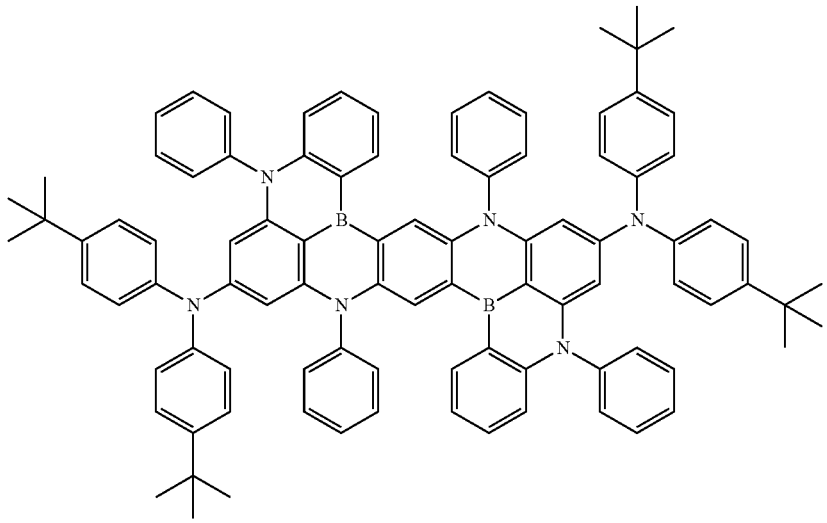

2-14

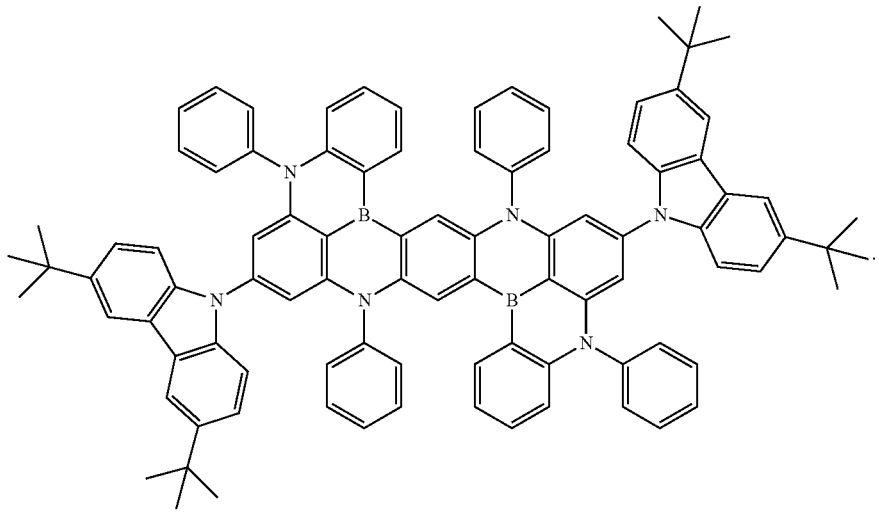

2-15

The third compound H in the EML 240 may any organic compound having wider energy level bandgap between a HOMO energy level and a LUMO energy level compared to the first compound DF1 and/or the second compound DF2. As an example, when the EML 240 includes the third compound H of the host, the first compound DF1 may be a first dopant and the second compound DF2 may be a second dopant.

In an exemplary aspect, the third compound in the EML 240 may comprise, but is not limited to, 4,4'-bis(N-carbazolyl)-1,1'-biphenyl (CBP), 3,3'-bis(N-carbazolyl)-1,1'-biphenyl (mCBP), 1,3-Bis(carbazol-9-yl)benzene (mCP), 9-(3-(9H-carbazol-9-yl)phenyl)-9H-carbazole-3-carbonitrile (mCP-CN), Bis[2-(diphenylphosphino)phenyl] ether oxide(DPEPO), 2,8-bis(diphenylphosphoryl)dibenzothiophene (PPT), 1,3,5-Tri[(3-pyridyl)-phen-3-yl]benzene (TmPyPB), 2,6-Di(9H-carbazol-9-yl)pyridine (PYD-2Cz), 2,8-di(9H-carbazol-9-yl)dibenzothiophene (DCzDBT), 3',5'-Di(carbazol-9-yl)-[1,1'-bipheyl]-3,5-dicarbonitrile (DCzTPA), 4'-(9H-carbazol-9-yl)biphenyl-3,5-dicarbonitrile (pCzB-2CN), 3'-(9H-carbazol-9-yl)biphenyl-3,5-dicarbonitrile (mCzB-2CN), Diphenyl-4-triphenylsilylphenylphosphine oxide (TSPO1), 9-(9-phenyl-9H-carbazol-6-yl)-9H-carbazole (CCP), 4-(3-(triphenylen-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole 9-(6-(9H-carbazol-9-yl)pyridin-3-yl)-9H-3,9'-bicabazole) and combination thereof.

In an exemplary aspect, when the EML 240 includes the first compound DF1, the second compound DF2 and the third compound H, the contents of the third compound H may be larger than the contents of the first compound DF1 in the EML 240, and the contents of the first compound DF1 may be larger than the contents of the second compound DF2 in the EML 240. When the contents of the first compound DF1 is larger than the contents of the second compound DF2, exciton energy can be effectively transferred from the first compound DF1 to the second compound DF2 via FRET mechanism. For example, the contents of the third compound H in the EML 240 may be about 55 wt % to about 85 wt %, the contents of the first compound DF1 in the EML 240 may be about 10 wt % to about 40 wt %, and the contents of the second compound DF2 in the EML 240 may be about 0.1 wt % to about 2 wt %, but is not limited thereto.

In one exemplary aspect, HOMO energy levels and/or LUMO energy levels among the third compound H of the host, the first compound DF1 of the first delayed fluorescent material and the second compound DF2 of the second delayed fluorescent material must be properly adjusted. For example, the host must induce the triplet excitons generated at the delayed fluorescent material to be involved in the luminescence process without quenching as non-radiative recombination in order to implement hyper fluorescence. To this end, the energy levels among the third compound H of the host, the first compound DF1 of the first delayed fluorescent material and the second compound DF2 of the second delayed fluorescent material should be adjusted.

FIG. 4 is a schematic diagram illustrating energy levels among luminous materials in an EML are adjusted so that charges are transferred effectively to the second compound. As illustrated in FIG. 4, the third compound H as the host may be designed to have the HOMO energy level $HOMO^H$ deeper than the HOMO energy level $HOMO^{DF1}$ of the first compound DF1 of the first delayed fluorescent material, and to have the LUMO energy level $LUMO^H$ shallower than the LUMO energy level $LUMO^{DF1}$ of the first compound DF1. In other words, the energy level bandgap between the HOMO energy level $HOMO^H$ and the LUMO energy level $LUMO^H$ of the third compound H may be wider than the energy level bandgap between the HOMO energy level $HOMO^{DF1}$ and the LUMO energy level $LUMO^{DF1}$ of the first compound DF1.

As an example, an energy level bandgap ($|HOMO^H - HOMO^{DF1}|$) between the HOMO energy level ($HOMO^H$) of the third compound H of the host and the HOMO energy level ($HOMO^{DF1}$) of the first compound DF1 of the first delayed fluorescent material, or an energy level bandgap ($|LUMO^H - LUMO^{DF1}|$) between the LUMO energy level ($LUMO^H$) of the third compound H and the LUMO energy level ($LUMO^{DF1}$) of the first compound DF1 may be equal to or less than about 0.5 eV, for example, between about 0.1 eV to about 0.5 eV. In this case, the charges can be transported efficiently from the third compound H to the first compound DF1 and thereby enhancing the ultimate luminous efficiency in the OLED D1.

In one exemplary aspect, the energy level bandgap $\Delta HOMO$-1 between the HOMO energy level $HOMO^{DF1}$ of the first compound DF1 and the HOMO energy level $HOMO^{DF2}$ of the second compound DF2 satisfies the following relationship in Equation (1):

$$|HOMO^{DF2} - HOMO^{DF1}| < 0.3 \text{ eV} \quad (1).$$

When the energy level bandgap $\Delta HOMO$-1 between the HOMO energy level $HOMO^{DF1}$ of the first compound DF1 and the HOMO energy level $HOMO^{DF2}$ of the second compound DF2 satisfies the relationship in Equation (1), holes injected into the EML 240 may be transferred to the first compound DF1. Accordingly, the first compound DF1 can utilize both the initial singlet exciton energy and the singlet exciton energy converted from the triplet exciton energy by RISC mechanism so that it can implement 100% of internal quantum efficiency and can transfer efficiently its exciton energy to the second compound DF2. As an example, the HOMO energy level $HOMO^{DF1}$ of the first compound DF1 and the HOMO energy level $HOMO^{DF2}$ of the second compound DF2 may satisfy the following relationship in Equation (2):

$$|HOMO^{DF2} - HOMO^{DF1}| \leq 0.2 \text{ eV} \quad (2).$$

In another exemplary aspect, the LUMO energy level $LUMO^{DF1}$ of the first compound DF1 may be shallower than or equal to the LUMO energy level $LUMO^{DF2}$ of the second compound DF2. As an example, the LUMO energy level $LUMO^{DF1}$ of the first compound DF1 and the LUMO energy level $LUMO^{DF2}$ of the second compound DF2 may satisfy the following relationship in Equation (3):

$$0 \leq LUMO^{DF1} - LUMO^{DF2} \leq 0.5 \text{ eV} \quad (3).$$

When the LUMO energy level $LUMO^{DF1}$ of the first compound DF1 and the LUMO energy level $LUMO^{DF2}$ of the second compound DF2 satisfy the relationship in Equation (3), electrons injected into the EML 240 can be transferred to the first compound DF1. As excitons can be recombined in the first compound DF1 of the first delayed fluorescent material, the first compound DF1 can implement 100% of internal quantum efficiency using RISC mechanism. The singlet exciton energy including the initial singlet exciton energy and the converted singlet exciton energy generated at the first compound DF1 can be transferred to the second compound DF2 of the second delayed fluorescent material via FRET, and therefore, the second compound DF2 can realize efficient emission.

As an example, the first compound DF1 may be designed, but is not limited to, to have the HOMO energy level $HOMO^{DF1}$ between about −5.4 eV and −5.7 eV and to have the LUMO energy level $LUMO^{DF1}$ between about −2.6 eV and −2.9 eV. The second compound DF2 may be designed, but is not limited to, to have the HOMO energy level $HOMO^{DF2}$ between about −5.3 eV and about −5.6 eV and to have the LUMO energy level $LUMO^{DF2}$ between about −2.7 eV and about −2.9 eV.

The energy level bandgap between the HOMO energy level $HOMO^{DF1}$ and the LUMO energy level $LUMO^{DF1}$ of the first compound DF1 may be wider than the energy level bandgap between the HOMO energy level $HOMO^{DF2}$ and the LUMO energy level $LUMO^{DF2}$ of the second compound DF2. For example, the first compound DF1 may have the energy level bandgap between the HOMO energy level $HOMO^{DF1}$ and the LUMO energy level $LUMO^{DF1}$ between about 2.6 eV and about 3.1 eV, for example, about 2.7 eV and about 2.9 eV. The second compound DF2 may have the energy level bandgap between the HOMO energy level $HOMO^{DF2}$ and the LUMO energy level $LUMO^{DF2}$ between about 2.4 eV and about 2.9 eV, for example, about 2.5 eV and about 2.8 eV. In this case, the exciton energy generated at the first compound DF1 can be transferred efficiently to the second compound DF2, and then the second compound DF2 can emit light sufficiently.

Figure 5:
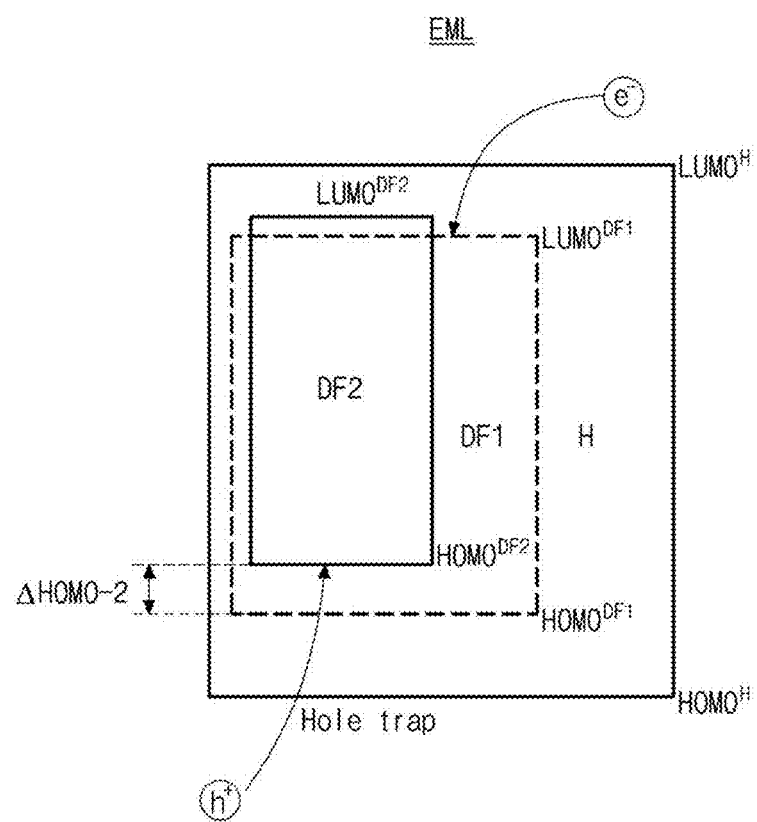
FIG. 5 is a schematic diagram illustrating HOMO energy levels among luminous material in an EML are not adjusted so that holes are trapped at the second compound.

FIG. 5 is a schematic diagram illustrating HOMO energy levels among luminous material in an EML are not adjusted so that holes are trapped at the second compound. As illustrated in FIG. 5, when an energy level bandgap $\Delta HOMO$-2 between the HOMO energy level $HOMO^{DF1}$ of the first compound DF1 and the HOMO energy level $HOMO^{DF2}$ of the second compound DF2 is equal to or more than 0.3 eV, holes injected into the EML 240 are trapped at the second compound DF2 of the second delayed fluorescent material. Namely, holes injected into the EML 240 are not transferred to the first compound DF1 of the first delayed fluorescent material from the third compound H of the host. Excitons are not formed in the first compound DF1 having excellent luminous efficiency, but holes trapped at the second compound DF2 of the second delayed fluorescent material are directly recombined to form excitons and to emit light. Triplet exciton energy of the first compound DF1 cannot be involved in the luminous process, but is quenched as non-radiative recombination, thus causes the EML to decrease its luminous efficiency.

Figure 6:
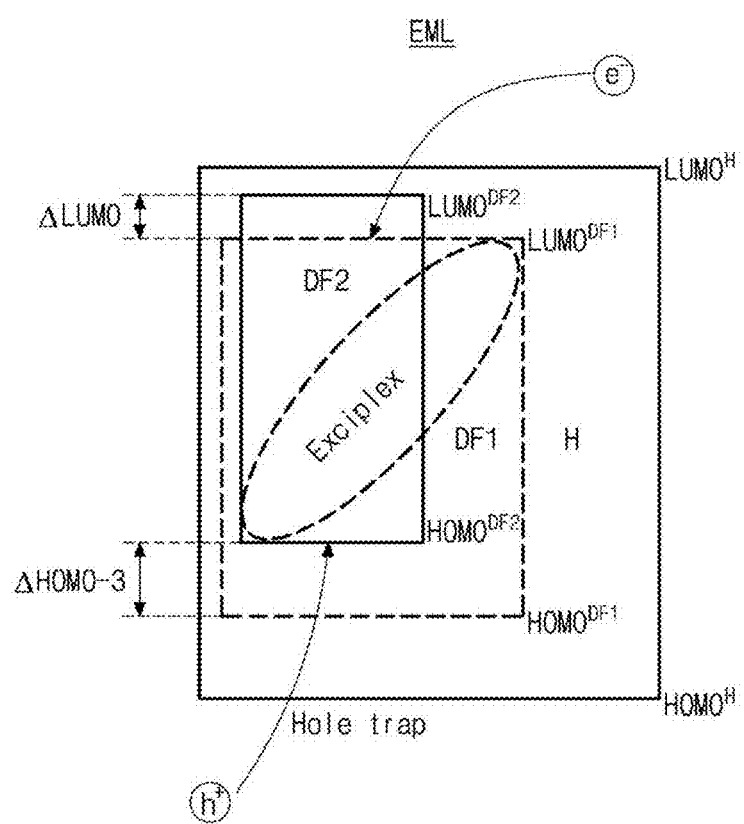
FIG. 6 is a schematic diagram illustrating both HOMO and LUMO energy levels among luminous material in an EML are not adjusted so that holes are trapped at the second compound and an exciplex are formed between the first and second compounds.

FIG. 6 is a schematic diagram illustrating both HOMO and LUMO energy levels among luminous material in an EML are not adjusted so that holes are trapped at the second compound and an exciplex are formed between the first and second compounds. As illustrated in FIG. 6, when an energy level bandgap ΔHOMO-3 between the HOMO energy level HOMO$^{DF1}$ of the first compound DF1 and the HOMO energy level HOMO$^{DF2}$ of the second compound DF2 is equal to or more than 0.5 eV, holes injected into the EML 240 are trapped at the second compound DF2 of the second delayed fluorescent material.

In addition, when the LUMO energy level LUMO$^{DF1}$ of the first compound DF1 is deeper than the LUMO energy level LUMO$^{DF2}$ of the second compound DF2 (i.e., LUMO$^{DF2}$>LUMO$^{DF1}$), holes trapped at the second compound DF2 and electrons transferred to the first compound DF1 form an exciplex. Triplet exciton energy is quenched as a non-radiative recombination, which causes the EML to decrease its luminous efficiency. In addition, as the energy level bandgap between the LUMO energy level and HOMO energy level forming the exciplex is too narrow, the EML emits light having long wavelength. As both the first compound DF1 and the second compound DF2 emit simultaneously, the light emitted from the EML has wide FWHM and bad color purity.

Figure 7:
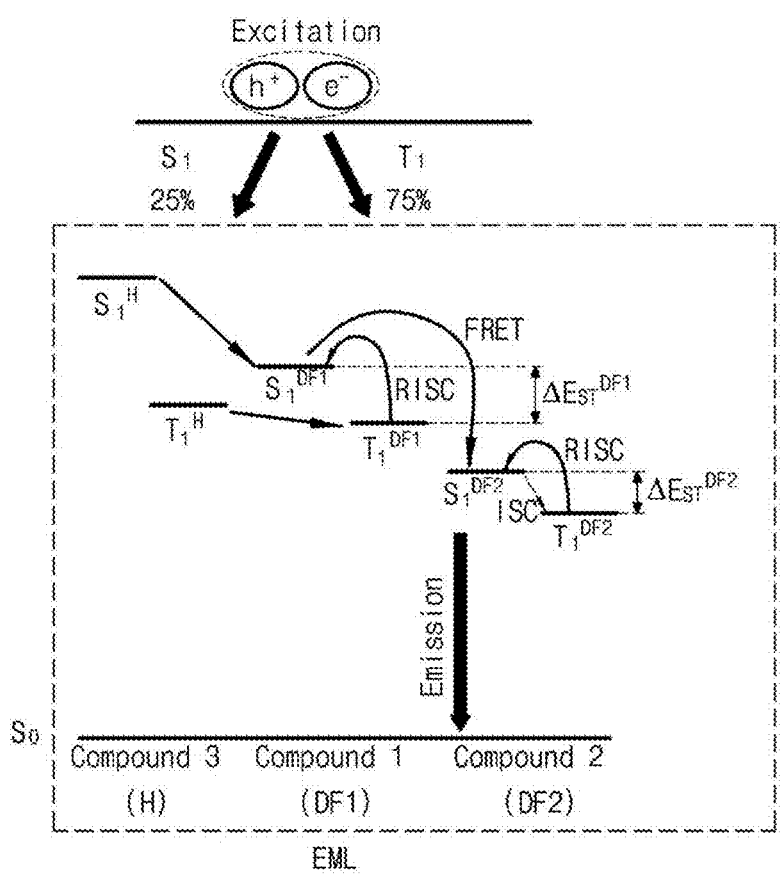
FIG. 7 is a schematic diagram illustrating a luminous mechanism by singlet and triplet energy levels among luminous materials in an EML in accordance with one exemplary aspect of the present disclosure.

Now, we will describe the luminous mechanism in the EML 240. FIG. 7 is a schematic diagram illustrating a luminous mechanism by singlet and triplet energy levels among luminous materials in an EML in accordance with one exemplary aspect of the present disclosure. As illustrated in FIG. 7, the singlet energy level $S_1^H$ of the third compound H, which can be the host in the EML 240, is higher than the singlet energy level $S_1^{DF1}$ of the first compound DF1 having the delayed fluorescent property. In addition, the triplet energy level $T_1^H$ of the third compound H may be higher than the triplet energy level $T_1^{DF1}$ of the first compound DF1. As an example, the triplet energy level $T_1^H$ of the third compound H may be higher than the triplet energy level $T_1^{DF1}$ of the first compound DF1 by at least about 0.2 eV, for example, at least about 0.3 eV such as at least about 0.5 eV.

When the triplet energy level $T_1^H$ and/or the singlet energy level $S_1^H$ of the third compound H is not high enough than the triplet energy level $T_1^{DF1}$ and/or the singlet energy level $S_1^{DF1}$ of the first compound DF1, the triplet state exciton energy of the first compound DF1 may be reversely transferred to the triplet energy level $T_1^H$ of the third compound H. In this case, the triplet exciton reversely transferred to the third compound H where the triplet exciton cannot be emitted is quenched as non-emission so that the triplet exciton energy of the first compound DF1 having the delayed fluorescent property cannot contribute to luminescence. As an example, the first compound DF1 having the delayed fluorescent property may have the energy level bandgap $\Delta E_{ST}^{DF1}$ between the singlet energy level $S_1^{DF1}$ and the triplet energy level $T_1^{DF1}$ equal to or less than about 0.3 eV, for example, between about 0.05 eV and about 0.3 eV.

In addition, the singlet exciton energy, which is generated at the first compound DF1 of the first delayed fluorescent material that is converted to ICT complex by RISC in the EML 240, should be efficiently transferred to the second compound DF2 of the second delayed fluorescent material so as to implement OLED D1 having high luminous efficiency and high color purity. To this end, the singlet energy level $S_1^{DF1}$ of the first compound DF1 of the first delayed fluorescent material is higher than the singlet energy level $S_1^{DF2}$ of the second compound DF2 of the second delayed fluorescent material. Optionally, the triplet energy level $T_1^{DF1}$ of the first compound DF1 may be higher than the triplet energy level $T_1^{DF2}$ of the second compound DF2.

In addition, the energy level bandgap $\Delta E_{ST}^{DF2}$ between the singlet energy level $S_1^{DF2}$ and the triplet energy level $T_1^{DF2}$ of the second compound DF2 may be less than the energy level bandgap $\Delta E_{ST}^{DF1}$ between the singlet energy level $S_1^{DF1}$ and the triplet energy level $T_1^{DF1}$ of the first compound DF1. Accordingly, the exciton of the triplet energy level $T_1^{DF2}$ of the second compound DF2 can be converted rapidly to its own singlet energy level $S_1^{DF2}$ even though exciton energy transferred to the singlet energy level $S_1^{DF2}$ of the second compound DF2 from the singlet energy level $S_1^{DF1}$ of the first compound DF1 via FRET mechanism is converted to the triplet energy level $T_1^{DF2}$ of the second compound DF2 via ISC.

As the amount of the triplet exciton resident at the second compound DF2 is decreased and interactions between the triplet excitons of the second compound DF2 and the peripheral triplet exciton or polaron is reduced, it is possible to minimize the quenching of the triple excitons by TTA or TPA. The second compound DF2 can utilize both the singlet exciton and the triplet exciton of the first compound DF1 in the luminous process, thus the OLED D1 can maximize its luminous efficiency. In addition, as the quenching phenomena such as TTA and TPA are reduced, the OLED D1 can improve considerably its luminous lifespan.

Returning to FIG. 3, the HIL 250 is disposed between the first electrode 210 and the HTL 260 and improves an interface property between the inorganic first electrode 210 and the organic HTL 260. In one exemplary aspect, the HIL 250 may include, but is not limited to, 4,4'4"-Tris(3-methylphenylamino)triphenylamine (MTDATA), 4,4',4"-Tris(N,N-diphenyl-amino)triphenylamine (NATA), 4,4',4"-Tris(N-(naphthalene-1-yl)-N-phenyl-amino)triphenylamine (1T-NATA), 4,4',4"-Tris(N-(naphthalene-2-yl)-N-phenyl-amino)triphenylamine (2T-NATA), Copper phthalocyanine (CuPc), Tris(4-carbazoyl-9-yl-phenyl)amine (TCTA), N,N'-Diphenyl-N,N'-bis(1-naphthyl)-1,1'-biphenyl-4,4"-diamine (NPB; NPD), 1,4,5,8,9,11-Hexaazatriphenylenehexacarbonitrile (Dipyrazino[2,3-f: 2' 3'-h]quinoxaline-2,3,6,7,10,11-hexacarbonitrile; HAT-CN), 1,3,5-tris[4-(diphenylamino)phenyl]benzene (TDAPB), poly(3,4-ethylenedioxythiophene)polystyrene sulfonate (PEDOT/P S S), N-(biphenyl-4-yl)-9,9-dimethyl-N-(4-(9-phenyl-9H-carbazol-3-yl)phenyl)-9H-fluoren-2-amine and combination thereof. The HIL 250 may be omitted in compliance with a structure of the OLED D1.

The HTL 260 is disposed between the HIL 250 and the EML 240. In one exemplary aspect, the HTL 260 may include, but is not limited to, N,N'-Diphenyl-N,N'-bis(3-methylphenyl)-1,1'-biphenyl-4,4'-diamine (TPD), NPB, CBP, Poly[N,N'-bis(4-butylphenyl)-N,N'-bis(phenyl)-benzidine] (Poly-TPD), Poly[(9,9-dioctylfluorenyl-2,7-diyl)-co-(4,4'-(N-(4-sec-butylphenyl)diphenylamine))] (TFB), Di-[4-(N,N-di-p-tolyl-amino)-phenyl] cyclohexane (TAPC), 3,5-Di(9H-carbazol-9-yl)-N,N-diphenylaniline(DCDPA), N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine and combination thereof.

The ETL 270 and the EIL 280 may be laminated sequentially between the EML 240 and the second electrode 230. The ETL 270 includes material having high electron mobility so as to provide electrons stably with the EML 240 by fast electron transportation. In one exemplary aspect, the ETL 270 may comprise, but is not limited to, any one of oxadiazole-based compounds, triazole-based compounds, phenanthroline-based compounds, benzoxazole-based compounds, benzothiazole-based compounds, benzimidazole-based compounds, triazine-based compounds, and the like.

As an example, the ETL 270 may comprise, but is not limited to, tris-(8-hydroxyquinoline aluminum) (Alq$_3$), 2-biphenyl-4-yl-5-(4-t-butylphenyl)-1,3,4-oxadiazole (PBD), spiro-PBD, lithium quinolate (Liq), 1,3,5-Tris(N-phenyl-benzimidazol-2-yl)benzene (TPBi), Bis(2-methyl-8-quinolinolato-N1,O8)-(1,1'-biphenyl-4-olato)aluminum (BAlq), 4,7-diphenyl-1,10-phenanthroline (Bphen), 2,9-Bis(naphthalene-2-yl)4,7-diphenyl-1,10-phenanthroline (NBphen), 2,9-Dimethyl-4,7-diphenyl-1,10-phenanthroline (BCP), 3-(4-Biphenyl)-4-phenyl-5-tert-butylphenyl-1,2,4-triazole (TAZ), 4-(Naphthalen-1-yl)-3,5-diphenyl-4H-1,2,4-triazole (NTAZ), 1,3,5-Trip-pyrid-3-yl-phenyl)benzene (TpPyPB), 2,4,6-Tris(3'-(pyridin-3-yl)biphenyl-3-yl)1,3,5-triazine (TmPPPyTz), Poly[9,9-bis(3'-(N,N-dimethyl)-N-ethylammonium)-propyl)-2,7-fluorene]-alt-2,7-(9,9-dioctylfluorene)] (PFNBr), tris(phenylquinoxaline) (TPQ), TSPO1 and combination thereof.

The EIL 280 is disposed between the second electrode 230 and the ETL 270, and can improve physical properties of the second electrode 230 and therefore, can enhance the luminous lifespan of the OLED D1. In one exemplary aspect, the EIL 280 may comprise, but is not limited to, an alkali metal halide or an alkaline earth metal halide such as LiF, CsF, NaF, BaF$_2$ and the like, and/or an organic metal compound such as lithium quinolate, lithium benzoate, sodium stearate, and the like.

When holes are transferred to the second electrode 230 via the EML 240 and/or electrons are transferred to the first electrode 210 via the EML 240, the OLED D1 may have short lifespan and reduced luminous efficiency. In order to prevent these phenomena, the OLED D1 in accordance with this aspect of the present disclosure may have at least one exciton blocking layer adjacent to the EML 240.

For example, the OLED D1 of the exemplary aspect includes the EBL 265 between the HTL 260 and the EML 240 so as to control and prevent electron transfers. In one exemplary aspect, the EBL 265 may comprise, but is not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, TAPC, MTDATA, mCP, mCBP, CuPc, N,N'-bis[4-(bis(3-methylphenyl)amino)phenyl]-N,N'-diphenyl-[1,1'-biphenyl]-4,4'-diamine (DNTPD), TDAPB, 3,6-bis(N-carbazolyl)-N-phenyl-carbazole and combination thereof.

In addition, the OLED D1 may further include the HBL 275 as a second exciton blocking layer between the EML 240 and the ETL 270 so that holes cannot be transferred from the EML 240 to the ETL 270. In one exemplary aspect, the HBL 275 may comprise, but is not limited to, any one of oxadiazole-based compounds, triazole-based compounds, phenanthroline-based compounds, benzoxazole-based compounds, benzothiazole-based compounds, benzimidazole-based compounds, and triazine-based compounds each of which can be used in the ETL 270.

For example, the HBL 275 may comprise a compound having a relatively low HOMO energy level compared to the HOMO energy level of the luminescent materials in EML 240. The HBL 275 may comprise, but is not limited to, BCP, BAlq, Alq$_3$, PBD, spiro-PBD, Liq, Bis-4,5-(3,5-di-3-pyridylphenyl)-2-methylpyrimidine (B3PYMPM), DPEPO, 9-(6-(9H-carbazol-9-yl)pyridine-3-yl)-9H-3,9'-bicarbazole and combination thereof.

Figure 8:
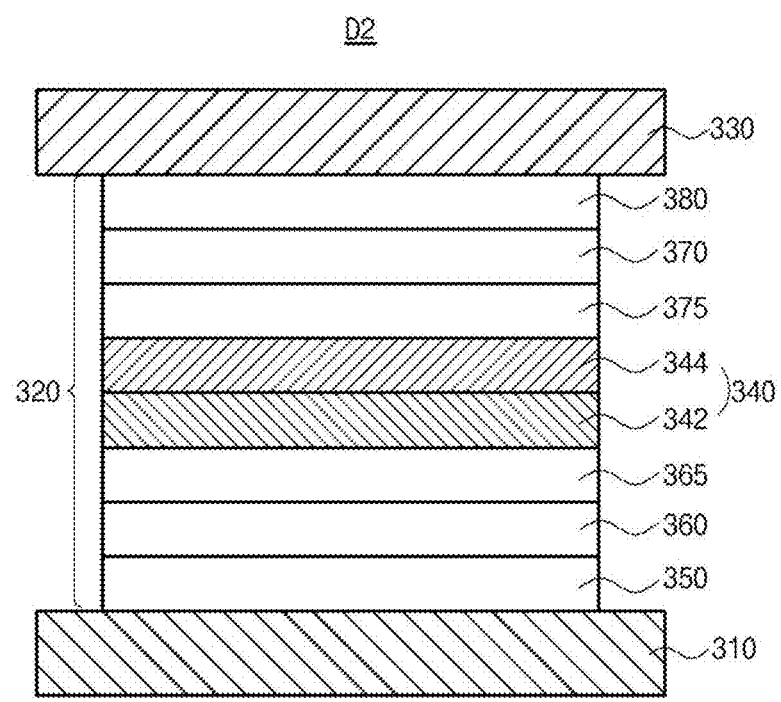
FIG. 8 is a schematic cross-sectional view illustrating an OLED in accordance with another exemplary aspect of the present disclosure.
Figure 9:
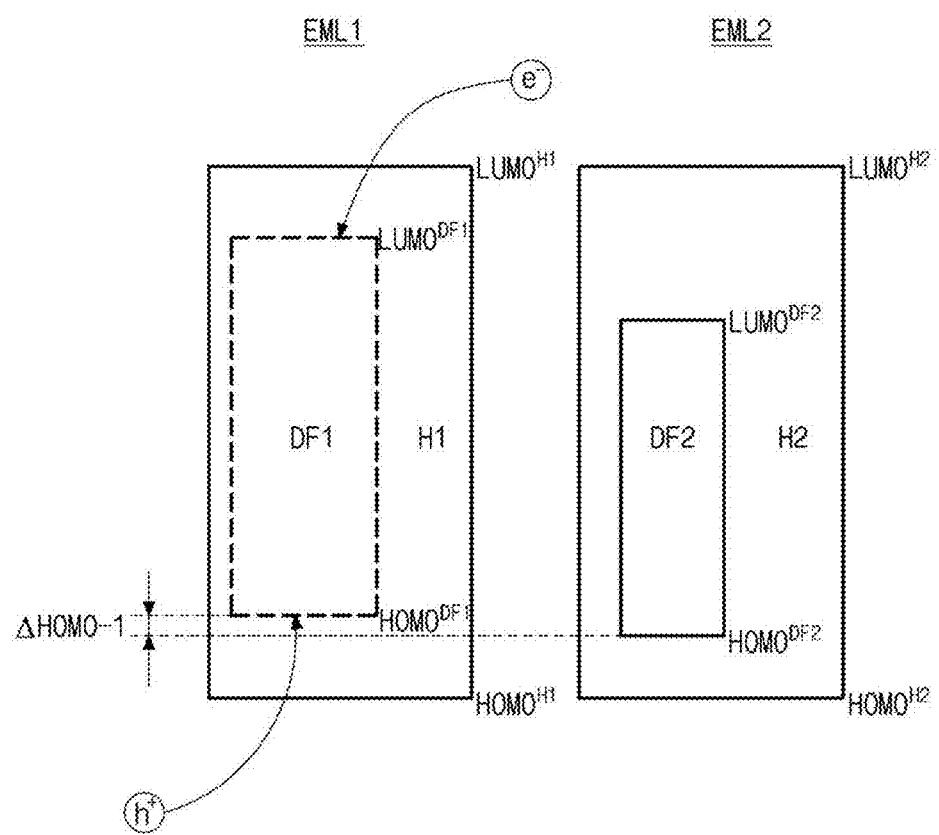
FIG. 9 is a schematic diagram illustrating energy levels among luminous materials in EMLs are adjusted so that holes are transferred to the second compound.
Figure 10:
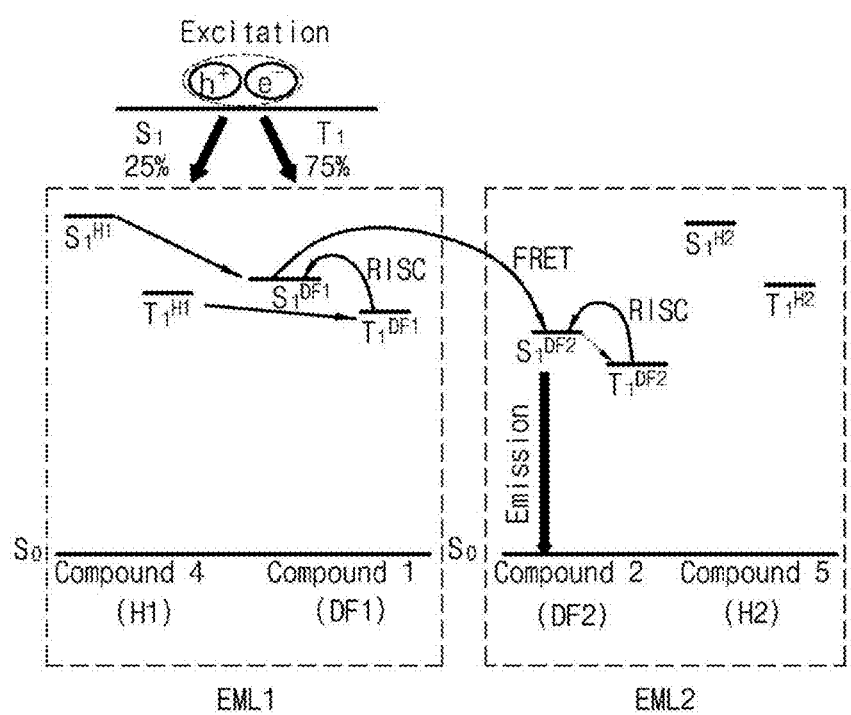
FIG. 10 is a schematic diagram illustrating a luminous mechanism by singlet and triplet energy levels among luminous materials in EMLs in accordance with another exemplary aspect of the present disclosure.

In the above aspect, the first compound and the second compound having the delayed fluorescent property are included within the same EML. Unlike that aspect, the first compound and the second compound are included in separate EMLs. FIG. 8 is a schematic cross-sectional view illustrating an OLED in accordance with another exemplary aspect of the present disclosure. FIG. 9 is a schematic diagram illustrating energy levels among luminous materials in EMLs are adjusted so that holes are transferred to the second compound. FIG. 10 is a schematic diagram illustrating a luminous mechanism by singlet and triplet energy levels among luminous materials in EMLs in accordance with another exemplary aspect of the present disclosure.

As illustrated in FIG. 8, the OLED D2 includes first and second electrodes 310 and 330 facing each other and an emissive layer 320 having single emitting part disposed between the first and second electrodes 310 and 330. The organic light emitting display device 100 (FIG. 2) includes a red pixel region, a green pixel region and a blue pixel region, and the OLED D2 may be disposed in the blue pixel region.

In one exemplary aspect, the emissive layer 320 comprises a double-layered EML 340. Also, the emissive layer 320 may comprise at least one of an HTL 360 disposed between the first electrode 310 and the EML 340 and an ETL 370 disposed between the second electrode 330 and the EML 340. Also, the emissive layer 320 may further comprise at least one of an HIL 350 disposed between the first electrode 310 and the HTL 360 and an EIL 380 disposed between the second electrode 330 and the ETL 370. Alternatively, the emissive layer 320 may further comprise an EBL 365 disposed between the HTL 360 and the EML 340 and/or a HBL 375 disposed between the EML 340 and the ETL 370. The configuration of the first and second electrodes 310 and 330 as well as other layers except the EML 340 in the emissive layer 320 may be substantially identical to the corresponding electrodes and layers in the OLED D1.

The EML 340 comprises a first EML (EML1, lower EML, first layer) 342 disposed between the EBL 365 and the HBL 375 and a second EML (EML2, upper EML, second layer) 344 disposed between the EML1 342 and the HBL 375. Alternatively, the EML 344 may be disposed between the EBL 365 and the EML1 342.

One of the EML1 342 and the EML2 344 includes the first compound (first dopant) DF1 of the first delayed fluorescent material, and the other of the EML1 342 and the EML2 344 includes the second compound (second dopant) DF2 of the second delayed fluorescent material. Also, each of the EML1 342 and the EML2 344 includes a fourth compound (Compound 4) H1 of a first host and a fifth compound (Compound 5) H2 of a second host. As an example, the EML1 342 may include the first compound DF1 and the fourth compound H1 and the EML2 344 may include the second compound DF2 and the fifth compound H2.

The first compound DF1 in the EML1 342 may comprise any delayed fluorescent material having the structure of Formulae 1 to 3. The triplet exciton energy of the first compound DF1 having delayed fluorescent property can be converted upwardly to its own singlet exciton energy via RISC mechanism. While the first compound DF1 has high internal quantum efficiency, but it has poor color purity due to its wide FWHM.

The EML2 344 comprises the second compound DF2 of the second delayed florescent material. The second compound DF2 includes any organic compound having the structure of Formulae 4 to 6. While the second compound DF2 of the second delayed fluorescent material having the structure of Formulae 4 to 6 has an advantage in terms of color purity due to its narrow FWHM (e.g. ≤35 nm).

In this exemplary aspect, the singlet exciton energy as well as the triplet exciton energy of the first compound DF1 having the delayed fluorescent property in the EML1 342 can be transferred to the second compound DF2 in the EML2 344 disposed adjacently to the EML1 342 by FRET mechanism, and the ultimate light emission occurs in the second compound DF2 within the EML2 344.

In other words, the triplet exciton energy of the first compound DF1 is converted upwardly to its own singlet exciton energy in the EML1 342 by RISC mechanism. Then, both the initial singlet exciton energy and the converted singlet exciton energy of the first compound DF1 is transferred to the singlet exciton energy of the second compound DF2 in the EML2 344. The second compound DF2 in the EML2 344 can emit light using the triplet exciton energy as well as the singlet exciton energy.

As described above, the energy level bandgap $\Delta E_{ST}^{DF2}$ between the singlet energy level $S_1^{DF2}$ and the triplet energy level $T_1^{DF2}$ of the second compound DF2 is less than the energy level bandgap $\Delta E_{ST}^{DF1}$ between the singlet energy level $S_1^{DF1}$ and the triplet energy level $T_1^{DF1}$ of the first compound DF1 (FIG. 7). The exciton of the triplet energy level $T_1^{DF2}$ of the second compound DF2 can be converted rapidly to its own singlet energy level $S_1^{DF2}$. Accordingly, the OLED D2 can lower its driving voltage and improve greatly its luminous efficiency and lifespan.

As the singlet exciton energy generated at the first compound DF1 of the first delayed fluorescent material in the EML1 342 is efficiently transferred to the second compound DF2 of the second delayed fluorescent material in the EML2 344, the OLED D2 can implement hyper fluorescence. In this case, while the first compound DF1 of the first delayed fluorescent material only acts as transferring exciton energy to the second compound DF2, substantial light emission is occurred in the EML2 344 including the second compound DF2 of the second delayed fluorescent material. The OLED D2 can enhance quantum efficiency and color purity owing to narrow FWHM.

As described above, the first compound DF1 of the first delayed fluorescent material includes the organic compound having the structure of Formulae 1 to 3 and the second compound DF2 of the second delayed fluorescent material includes the boron-based compound having the structure of Formulae 4 to 6. The fourth compound H1 may be identical to or different from the fifth compound H2. For example, each of the fourth compound H1 and the fifth compound H2 may include, but is not limited to, the third compound H described above, respectively.

Similar to the first aspect, the energy level bandgap $\Delta$HOMO-1 between the HOMO energy level HOMO$^{DF1}$ of the first compound DF1 and the HOMO energy level HOMO$^{DF2}$ of the second compound DF2 may satisfy the relationship in Equation (1) or (2) as described above. In this case, holes injected into the EML 340 are transferred efficiently to the first compound DF1 so that the first compound DF1 can utilize both the singlet and triplet exciton energies and transfer the exciton energies to the second compound DF2. In addition, the LUMO energy level LUMO$^{DH}$ of the first compound DF1 may be shallower than or equal to the LUMO energy level LUMO$^{DF2}$ of the second compound DF2, and may satisfy the relationship in Equation (3) as described above.

Also, an energy level bandgap ($|$HOMO$^H$–HOMO$^{DF1}|$) between the HOMO energy levels (HOMO$^{H1}$ and HOMO$^{H2}$) of the fourth and fifth compounds H1 and H2 and the HOMO energy level (HOMO$^{DF1}$) of the first compound DF1, or an energy level bandgap ($|$LUMO$^H$–LUMO$^{DF1}|$) between the LUMO energy levels (LUMO$^{H1}$ and LUMO$^{H2}$) of the fourth and fifth compounds H1 and H2 and the LUMO energy level (LUMO$^{DF1}$) of the first compound DF1 may be equal to or less than about 0.5 eV. When the HOMO or LUMO energy level bandgap between the fourth and fifth compounds and the first compound does not satisfy that condition, the exciton energy at the first compound DF1 may be quenched as a non-radiative recombination, or exciton energies may not be transferred efficiently to the first compound DF1 and/or the second compound DF2 from the fourth and fifth compounds H1 and H2, thus the internal quantum efficiency in the OLED D2 may be reduced.

Also, each of the exciton energies generated in each of the fourth compound H1 in the EML1 342 and the fifth compound H2 in the EML2 344 should be transferred primarily to the first compound DF1 of the first delayed florescent material and then to the second compound DF2 of the second delayed fluorescent material in order to realize efficient light emission. As illustrated in FIG. 10, each of the singlet energy levels $S_1^{H1}$ and $S_1^{H2}$ of the fourth and fifth compounds H1 and H2 is higher than the singlet energy level $S_1^{DF1}$ of the first compound DF1 of the first delayed fluorescent material. Also, each of the triplet energy levels $T_1^{H1}$ and $T_1^{H2}$ of the fourth and fifth compounds H1 and H2 may be higher than the triplet energy level $T_1^{DF1}$ of the first compound DF1. For example, the triplet energy levels $T_1^{H1}$ and $T_1^{H2}$ of the fourth and fifth compound H1 and H2 may be higher than the triplet energy level $T_1^{DF1}$ of the first compound DF1 by at least about 0.2 eV, for example, by at least 0.3 eV such as by at least 0.5 eV.

Also, the singlet energy level $S_1^{H2}$ of the fifth compound H2 of the second host is higher than the singlet energy level $S_1^{DF2}$ of the second compound DF2 of the second delayed fluorescent material. Optionally, the triplet energy level $T_1^{H2}$ of the fifth compound H2 may be higher than the triplet energy level $T_1^{DF2}$ of the second compound DF2. In this case, the singlet exciton energy generated at the fifth compound H2 may be transferred to the singlet exciton energy of the second compound DF2.

In addition, the singlet exciton energy, which is generated at the first compound DF1 of the first delayed fluorescent material that is converted to ICT complex by RISC in the EML1 342, should be efficiently transferred to the second compound DF2 of the second delayed fluorescent material in the EML2 344. To this end, the singlet energy level $S_1^{DF1}$ of the first compound DF1 of the first delayed fluorescent material in the EML1 342 is higher than the singlet energy level $S_1^{DF2}$ of the second compound DF2 of the second delayed fluorescent material in the EML2 342. Optionally, the triplet energy level $T_1^{DF1}$ of the first compound DF1 in the EML1 342 may be higher than the triplet energy level $T_1^{DF2}$ of the second compound DF2 in the EML2 344.

Each of the contents of the fourth and fifth compounds H1 and H2 in the EML1 342 and the EML2 344 may be larger than or identical to each of the contents of the first and second compounds DF1 and DF2 in the same layer, respectively. Also, the contents of the first compound DF1 in the EML1 342 may be larger than the contents of the second compound DF2 in the EML2 344. In this case, exciton energy is efficiently transferred from the first compound DF1 to the second compound DF2 via FRET mechanism. As an example, the EML1 342 may comprise the first compound DF1 between about 1 wt % and about 50 wt %, for example, about 10 wt % and about 40 wt % such as about 20 wt % and about 40 wt %. The EML2 344 may comprise the second compound DF2 between about 1 wt % and about 10 wt %, for example, about 1 wt % and 5 wt %.

In one exemplary aspect, when the EML2 344 is disposed adjacently to the HBL 375, the fifth compound H2 in the EML2 344 may be the same material as the HBL 375. In this case, the EML2 344 may have a hole blocking function as well as an emission function. In other words, the EML2 344 can act as a buffer layer for blocking holes. In one aspect, the HBL 375 may be omitted where the EML2 344 may be a hole blocking layer as well as an emitting material layer.

In another aspect, when the EML2 344 is disposed adjacently to the EBL 365, the fifth compound H2 in the EML2 344 may be the same material as the EBL 365. In this case, the EML2 344 may have an electron blocking function as well as an emission function. In other words, the EML2 344 can act as a buffer layer for blocking electrons. In one aspect, the EBL 365 may be omitted where the EML2 344 may be an electron blocking layer as well as an emitting material layer.

Figure 11:
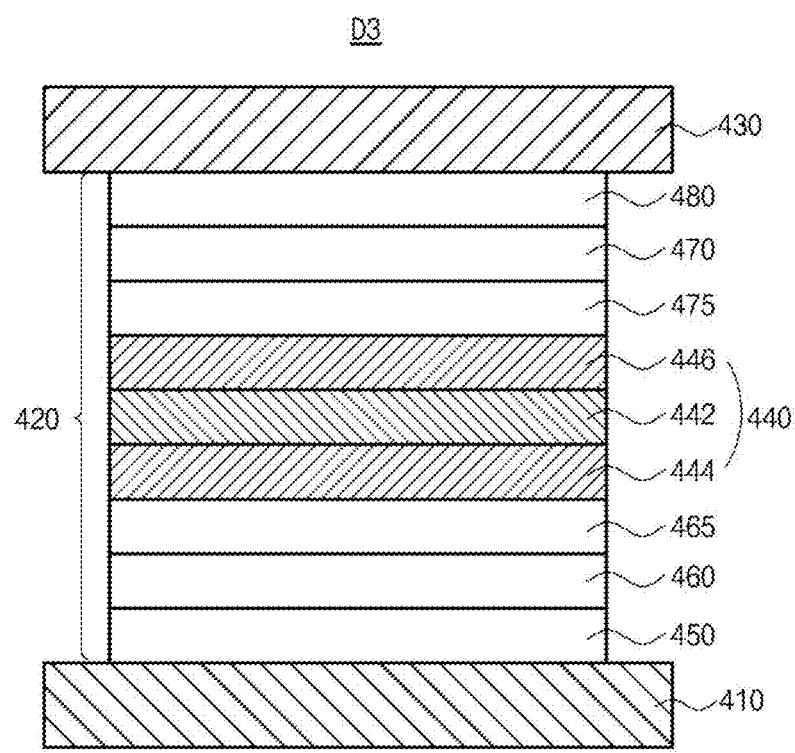
FIG. 11 is a schematic cross-sectional view illustrating an OLED in accordance with still another exemplary aspect of the present disclosure.
Figure 12:
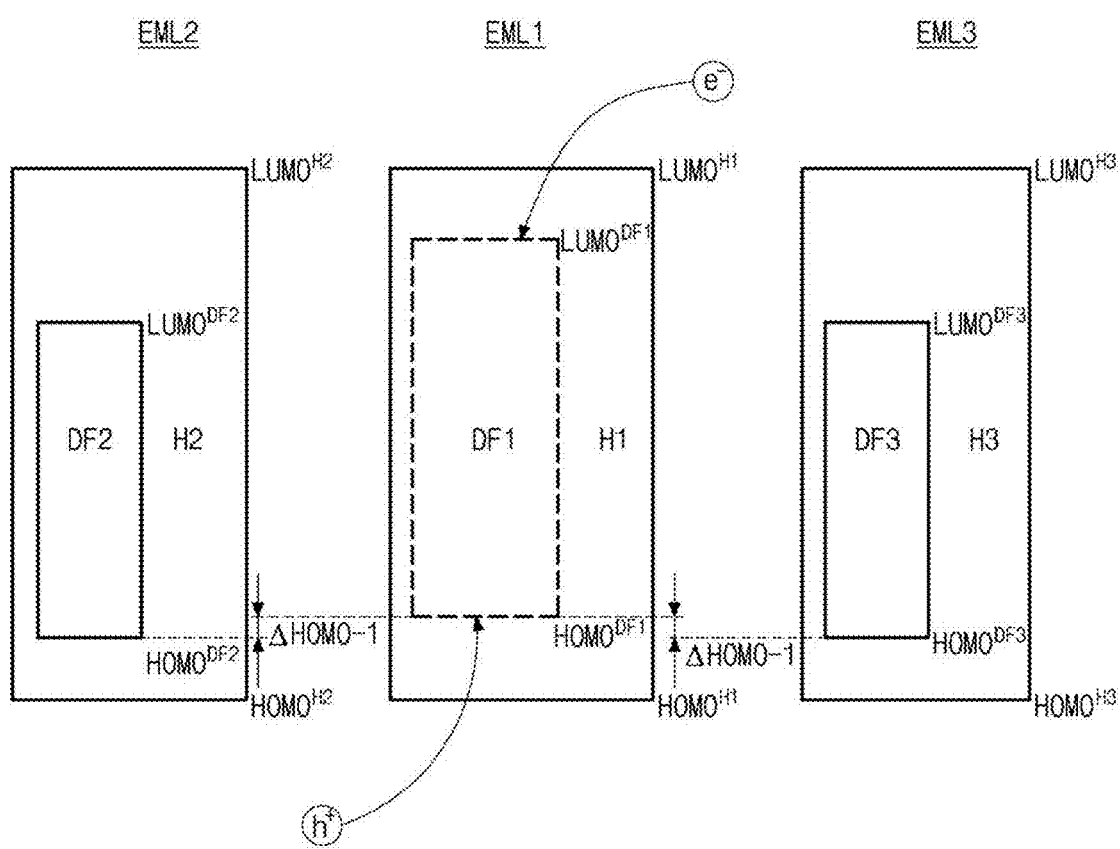
FIG. 12 is a schematic diagram illustrating energy levels among luminous materials in EMLs are adjusted so that holes are transferred to the second compound.
Figure 13:
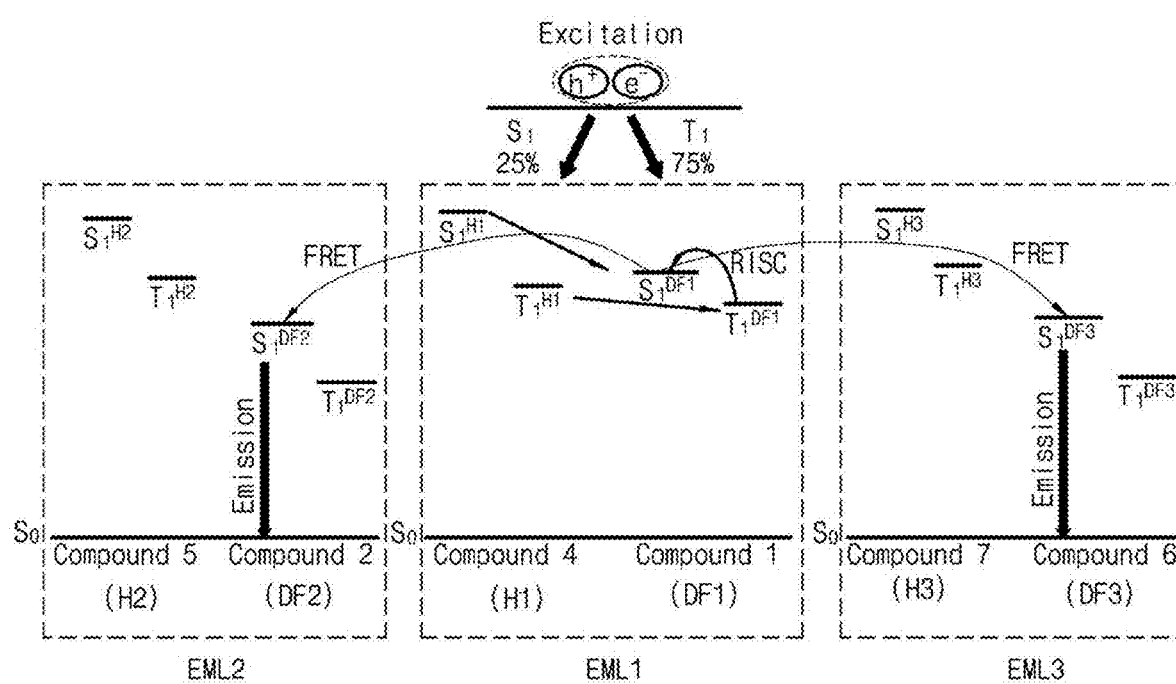
FIG. 13 is a schematic diagram illustrating a luminous mechanism by singlet and triplet energy levels among luminous materials in EMLs in accordance with still another exemplary aspect of the present disclosure.

An OLED having a triple-layered EML will be explained. FIG. 11 is a schematic cross-sectional view illustrating an OLED having a triple-layered EML in accordance with another exemplary aspect of the present disclosure. FIG. 12 is a schematic diagram illustrating energy levels among luminous materials in EMLs are adjusted so that holes are transferred to the second compound. FIG. 13 is a schematic diagram illustrating luminous mechanism by energy level bandgap among luminous materials in accordance with another exemplary aspect of the present disclosure.

As illustrated in FIG. 11, the OLED D3 comprises first and second electrodes 410 and 430 facing each other and an emissive layer 420 disposed between the first and second electrodes 410 and 430. The organic light emitting display device 100 (FIG. 2) includes a red pixel region, a green pixel region and a blue pixel region, and the OLED D3 may be disposed in the blue pixel region.

In one exemplary aspect, the emissive layer 420 having single emitting part comprises a triple-layered EML 440. The emissive layer 420 may comprise at least one of an HTL 460 disposed between the first electrode 410 and the EML 440 and an ETL 470 disposed between the second electrode 430 and the EML 440. Also, the emissive layer 420 may further comprise at least one of an HIL 450 disposed between the first electrode 410 and the HTL 460 and an EIL 480 disposed between the second electrode 430 and the ETL 470. Alternatively, the emissive layer 420 may further comprise an EBL 465 disposed between the HTL 460 and the EML 440 and/or a HBL 475 disposed between the EML 440 and the ETL 470. The configurations of the first and second electrodes 410 and 430 as well as other layers except the EML 440 in the emissive layer 420 is substantially identical to the corresponding electrodes and layers in the OLEDs D1 and D2.

The EML 440 comprises a first EML (EML1, middle EML, first layer) 442, a second EML (EML2, lower EML, second layer) 444 and a third EML (EML3, upper EML, third layer) 446. The EML1 442 is disposed between the EBL 465 and the HBL 475, the EML2 444 is disposed between the EBL 465 and the EML1 442 and the EML3 446 is disposed between the EML1 442 and the HBL 475.

The EML1 442 includes the first compound (first dopant) DF1 of the first delayed fluorescent material. Each of the EML2 444 and the EML3 446 includes the second compound (second dopant) DF2 and a sixth compound (Compound 6, third dopant) DF3 each of which is the second delayed fluorescent material and a third delayed fluorescent material, respectively. Also, each of the EML1 442, the EML2 444 and the EML3 446 includes the fourth compound H1 of the first host, the fifth compound H2 of the second host and a seventh compound (Compound 7) H3 of a third host, respectively.

In accordance with this aspect, both the singlet exciton energy as well as the triplet exciton energy of the first compound DF1 of the first delayed fluorescent material in the EML1 442 can be transferred to the second and sixth compounds DF2 and DF3 of the second and third delayed fluorescent materials each of which is included in the EML2 444 and EML3 446 disposed adjacently to the EML1 442 by FRET energy transfer mechanism. Accordingly, the ultimate emission occurs in the second and sixth compounds DF2 and DF3 in the EML2 444 and the EML3 446.

In other words, the triplet exciton energy of the first compound DF1 of the first delayed fluorescent material in the EML1 442 is converted upwardly to its own singlet exciton energy by RISC mechanism, then the singlet exciton energy including the initial and converted singlet exciton energy of the first compound DF1 is transferred to the singlet exciton energy of the second and sixth compounds DF2 and DF3 of the second and third delayed fluorescent materials in the EML2 444 and the EML3 446 because the first compound DF1 has the singlet energy level $S_1^{DF1}$ higher than each of the singlet energy levels $S_1^{DF2}$ and $S_1^{DF3}$ of the second and sixth compounds DF2 and DF3 (FIG. 13). The singlet exciton energy of the first compound DF1 in the EML1 442 is transferred to the second and sixth compounds DF2 and DF3 in the EML2 444 and the EML3 446 which are disposed adjacently to the EML1 442 by FRET mechanism.

The second and sixth compounds DF2 and DF3 in the EML2 444 and EML3 446 can emit light using both the singlet exciton energy and the triplet exciton energy derived from the first compound DF1. Each of the second and sixth compounds DF2 and DF3 has a relatively narrow FWHM (e.g. ≤35 nm) compared to the first compound DF1. In this aspect, the OLED D3 can improve its quantum efficiency and color purity owing to narrow FWHM, and the ultimate emission occurs in the second and sixth compounds DF2 and DF3 within the EML2 444 and the EML3 446.

The energy level bandgap $\Delta E_{ST}^{DF2}$ $\Delta E_{ST}^{DF3}$ between the singlet energy level $S_1^{DF2}$ or $S_1^{DF3}$ and the triplet energy level $T_1^{DF2}$ or $T_1^{DF3}$ in each of the second compound DF2 and the sixth compound DF3 may be less than the energy level bandgap $\Delta E_{ST}^{DF1}$ between the singlet energy level $S_1^{DF1}$ and the triplet energy level $T_1^{DF1}$ of the first compound DF1. Accordingly, the exciton of the triplet energy level $T_1^{DF2}$ or $T_1^{DF3}$ of the second compound DF2 and the sixth compound DF3 can be converted rapidly to its own singlet energy level $S_1^{DF2}$ or $S_1^{DF3}$. Accordingly, the OLED D3 can lower its driving voltage and improve greatly its luminous efficiency and lifespan.

The first compound DF1 of the first delayed fluorescent material comprises any organic compound having the structure of Formulae 1 to 3. Each of the second and sixth compounds DF2 and DF3 of the second and third delayed fluorescent materials comprises independently any boron-based compound having the structure of Formulae 4 to 6. For example, the sixth compound DF3 may comprise the second compound DF2. The fourth compound H1, the fifth compound H2 and the seventh compound H3 may be identical to or different from each other. For example, each of the fourth compound H1, the fifth compound H2 and the seventh compound H3 may include, but is not limited to, the third compound H described above, respectively.

Similar to the first and second aspects, the energy level bandgap ΔHOMO-1 between the HOMO energy level $HOMO^{DF1}$ of the first compound DF1 and each of the HOMO energy levels $HOMO^{DF2}$ and $HOMO^{DF3}$ of the second compound DF2 and the sixth compound DF3 may satisfy the relationship in Equation (1) or (2) as described above. In this case, holes injected into the EML 440 are transferred efficiently to the first compound DF1 so that the first compound DF1 can utilize both the singlet and triplet exciton energies and transfer the exciton energies to both the second compound DF2 and the sixth compound DF3. In addition, the LUMO energy level $LUMO^{DF1}$ of the first compound DF1 may be shallower than or equal to each of the LUMO energy levels $LUMO^{DF2}$ and $LUMO^{DF3}$ of the second compound DF2 and the sixth compound DF3, and may satisfy the relationship in Equation (3) as described above.

Also, an energy level bandgap ($|HOMO^H-HOMO^{DF1}|$) between the HOMO energy levels ($HOMO^{H1}$, $HOMO^{H2}$ and $HOMO^{H3}$) of the fourth, fifth and seventh compounds H1, H2 and H3 and the HOMO energy level ($HOMO^{DF1}$) of the first compound DF1, or an energy level bandgap ($|LUMO^H-LUMO^{DF1}|$) between the LUMO energy levels ($LUMO^{H1}$, $LUMO^{H2}$ and $LUMO^{H3}$) of the fourth, fifth and seventh compounds H1, H2 and H3 and the LUMO energy level ($LUMO^{DF1}$) of the first compound DF1 may be equal to or less than about 0.5 eV.

Also, the singlet and triplet energy levels among the luminous materials should be properly adjusted in order to implement efficient luminescence. Referring to FIG. 13, each of the singlet energy levels $S_1^{H1}$, $S_1^{H2}$ and $S_1^{H3}$ of the fourth, fifth and seventh compounds H1, H2 and H3 of the first to third hosts is higher than the singlet energy level $S_1^{DF1}$ of the first compound DF1 of the first delayed fluorescent material. Also, each of the triplet energy levels $T_1^{H1}$, $T_1^{H2}$ and $T_1^{H3}$ of the fourth, fifth and seventh compounds H1, H2 and H3 may be higher than the triplet energy level $T_1^{DF1}$ of the first compound DF1.

In addition, the singlet exciton energy, which is generated at the first compound DF1 of the first delayed fluorescent material that is converted to ICT complex by RISC in the EML1 442, should be efficiently transferred to each of second and sixth compounds DF2 and DF3 of the second and third delayed fluorescent materials in the EML2 444 and the EML3 446. To this end, the singlet energy level $S_1^{DF1}$ of the first compound DF1 of the first delayed fluorescent material in the EML1 442 is higher than each of the singlet energy levels $S_1^{DF2}$ and $S_1^{DF3}$ of the second and sixth compounds DF2 and DF3 of the second and third delayed fluorescent material in the EML2 444 and the EML3 446. Optionally, the triplet energy level $T_1^{DF1}$ of the first compound DF1 in the EML1 442 may be higher than each of the triplet energy levels $T_1^{DF2}$ and $T_1^{DF3}$ of the second and sixth compounds DF2 and DF3 in the EML2 444 and the EML3 446.

In addition, exciton energy transferred to each of the second and sixth compounds DF2 and DF3 from the first compound DF1 should not transferred to each of the fifth and seventh compounds H2 and H3 in order to realize efficient luminescence. To this end, each of the singlet energy levels SP and SP of the fifth and seventh compounds H2 and H3, each of which may be the second host and the third host, is higher than each of the singlet energy levels $S_1^{DF1}$ and $S_1^{DF3}$ of the second and sixth compounds DF2 and DF3 of the second and third delayed fluorescent material, respectively. Optionally, each of the triplet energy level $T_1^{H2}$ and $T_1^{H3}$ of the fifth and seventh compounds H2 and H3 is higher than each of the triplet energy levels $T_1^{DF2}$ and $T_1^{DF3}$ of the second and sixth compounds DF2 and DF3, respectively.

The contents of the first compound DF1 in the EML1 442 may be larger than each of the contents of the second and sixth compounds DF2 and DF3 in the EML2 444 or the EML3 446. In this case, exciton energy can be transferred sufficiently from the first compound DF1 in the EML1 442 to each of the second and sixth compounds DF2 and DF3 in the EML2 444 and the EML3 446 via FRET mechanism. As an example, the EML1 442 may comprise the first compound DF1 between about 10 wt % and about 40 wt %, for example, about 20 wt % and about 40 wt %. Each of the EML2 444 and the EML3 446 may comprise the second and sixth compounds DF2 and DF3 between about 1 wt % and about 10 wt %, for example, about 1 wt % and 5 wt %, respectively.

In one exemplary aspect, when the EML2 444 is disposed adjacently to the EBL 465, the fifth compound H2 in the EML2 444 may be the same material as the EBL 465. In this case, the EML2 444 may have an electron blocking function as well as an emission function. In other words, the EML2 444 can act as a buffer layer for blocking electrons. In one aspect, the EBL 465 may be omitted where the EML2 444 may be an electron blocking layer as well as an emitting material layer.

When the EML3 446 is disposed adjacently to the HBL 475, the seventh compound H3 in the EML3 446 may be the same material as the HBL 475. In this case, the EML3 446 may have a hole blocking function as well as an emission function. In other words, the EML3 446 can act as a buffer layer for blocking holes. In one aspect, the HBL 475 may be omitted where the EML3 446 may be a hole blocking layer as well as an emitting material layer.

In still another exemplary aspect, the fifth compound H2 in the EML2 444 may be the same material as the EBL 465 and the seventh compound H3 in the EML3 446 may be the same material as the HBL 475. In this aspect, the EML2 444 may have an electron blocking function as well as an emission function, and the EML3 446 may have a hole blocking function as well as an emission function. In other words, each of the EML2 444 and the EML3 446 can act as a buffer layer for blocking electrons or hole, respectively. In one aspect, the EBL 465 and the HBL 475 may be omitted where the EML2 444 may be an electron blocking layer as well as an emitting material layer and the EML3 446 may be a hole blocking layer as well as an emitting material layer.

Figure 14:
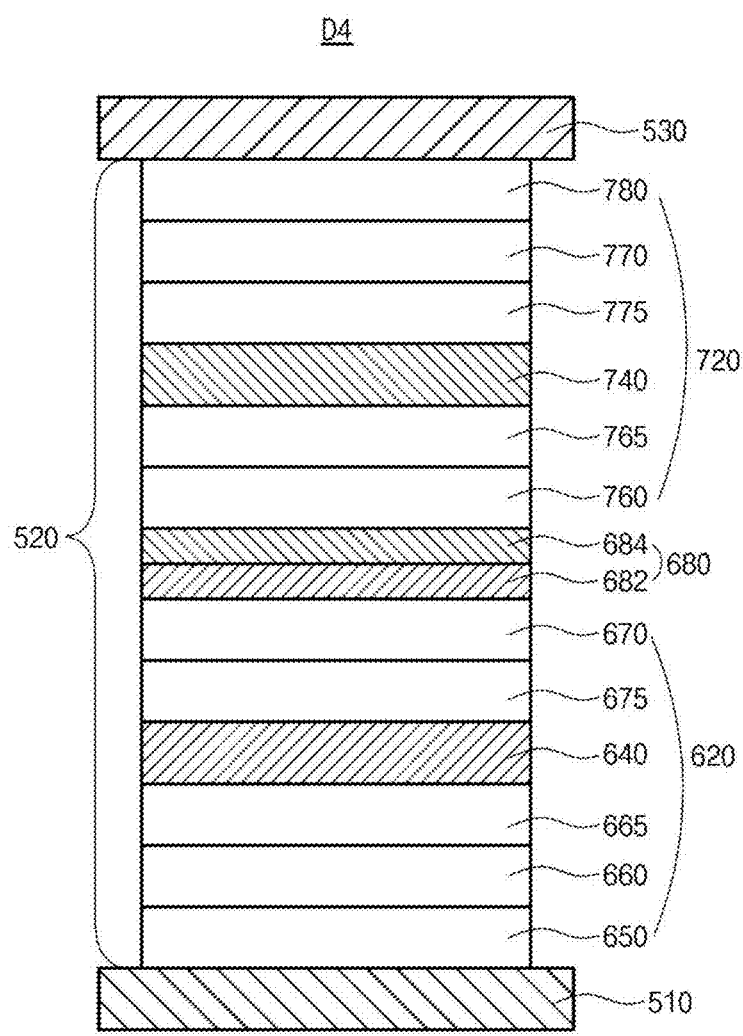
FIG. 14 is a schematic cross-sectional view illustrating an OLED in accordance with still another exemplary aspect of the present disclosure.

In an alternative aspect, an OLED may include multiple emitting parts. FIG. 14 is a schematic cross-sectional view illustrating an OLED in accordance with still another exemplary aspect of the present disclosure.

As illustrated in FIG. 14, the OLED D4 comprises first and second electrodes 510 and 530 facing each other and an emissive layer 520 with two emitting parts disposed between the first and second electrodes 510 and 530. The organic light emitting display device 100 (FIG. 2) includes a red pixel region, a green pixel region and a blue pixel region, and the OLED D4 may be disposed in the blue pixel region. The first electrode 510 may be an anode and the second electrode 530 may be a cathode.

The emissive layer 520 includes a first emitting part 620 that includes a first EML (EML1) 640 and a second emitting part 720 that includes a second EML (EML2) 740. Also, the emissive layer 520 may further comprise a charge generation layer (CGL) 680 disposed between the first emitting part 620 and the second emitting part 720.

The CGL 680 is disposed between the first and second emitting parts 620 and 720 so that the first emitting part 620, the CGL 680 and the second emitting part 720 are sequentially disposed on the first electrode 510. In other words, the first emitting part 620 is disposed between the first electrode 510 and the CGL 680 and the second emitting part 720 is disposed between the second electrode 530 and the CGL 680.

The first emitting part 620 comprises the EML1 640. The first emitting part 620 may further comprise at least one of an HIL 650 disposed between the first electrode 510 and the EML1 640, a first HTL (HTL1) 660 disposed between the HIL 650 and the EML 640 and a first ETL (ETL1) 670 disposed between the EML1 640 and the CGL 680. Alternatively, the first emitting part 620 may further comprise a first EBL (EBL1) 665 disposed between the HTL1 660 and the EML1 640 and/or a first HBL (HBL1) 675 disposed between the EML1 640 and the ETL1 670.

The second emitting part 720 comprises the EML2 740. The second emitting part 720 may further comprise at least one of a second HTL (HTL2) 760 disposed between the CGL 680 and the EML2 740, a second ETL (ETL2) 770 disposed between the EML2 740 and the second electrode 530 and an EIL 780 disposed between the ETL2 770 and the second electrode 530. Alternatively, the second emitting part 720 may further comprise a second EBL (EBL2) 765 disposed between the HTL2 760 and the EML2 740 and/or a second HBL (HBL2) 775 disposed between the EML2 740 and the ETL2 770.

The CGL 680 is disposed between the first emitting part 620 and the second emitting part 720. The first emitting part 620 and the second emitting part 720 are connected via the CGL 680. The CGL 680 may be a PN-junction CGL that junctions an N-type CGL (N-CGL) 682 with a P-type CGL (P-CGL) 684.

The N-CGL 682 is disposed between the ETL1 670 and the HTL2 760 and the P-CGL 684 is disposed between the N-CGL 682 and the HTL2 760. The N-CGL 682 transports electrons to the EML1 640 of the first emitting part 620 and the P-CGL 684 transport holes to the EML2 740 of the second emitting part 720.

In this aspect, each of the EML1 640 and the EML2 740 may be a blue emitting material layer. For example, at least one of the EML1 640 and the EML2 740 comprise the first compound DF1 of the first delayed fluorescent material, the second compound DF2 of the second delayed fluorescent material, and optionally the third compound H of the host.

As an example, when the EML1 640 includes the first to third compounds, the contents of the third compound H may be larger than the contents of the first compound DF1, and the contents of the first compound DF1 is larger than the contents of the second compound DF2. In this case, exciton energy can be transferred efficiently from the first compound DF1 to the second compound DF2. As an example, the EML1 640 may comprise, but is not limited to, the third compound H between about 55 wt % and about 85 wt %, the first compound DF1 between about 10 wt % and about 40 wt % and the second compound DF2 between about 0.1 wt % and about 5 wt %, respectively.

In one exemplary aspect, the EML2 740 may comprise the first and second compounds DF1 and DF2, and optionally the third compound H as the same the EML1 640. Alternatively, the EML2 740 may include another compound that is different from at least one of the first compound DF1 and the second compound DF2 in the EML1 640, and thus the EML2 740 may emit light different from the light emitted from the EML1 640 or may have different luminous efficiency from the luminous efficiency of the EML1 640.

In FIG. 14, each of the EML1 640 and the EML2 740 has a single-layered structure. Alternatively, each of the EML1 640 and the EML2 740, each of which may include the first to third compounds, may have a double-layered structure (FIG. 8) or a triple-layered structure (FIG. 11), respectively.

In the OLED D4, the singlet exciton energy of the first compound DF1 of the first delayed fluorescent material is transferred to the second compound DF2 of the second delayed fluorescent material, and the final emission is occurred at the second compound DF2. Accordingly, the OLED D4 can have excellent luminous efficiency and color purity. In addition, the OLED D4 includes at least one EML including the first compound DF1 having the structure of Formulae 1 to 3 and the second compound DF2 having the structure of Formulae 4 to 6 so that the OLED D4 can enhance further its luminous efficiency and color purity. Moreover, since the OLED D4 has a double stack structure of a blue emitting material layer, the OLED D4 can improve its color sense or optimize its luminous efficiency.

Figure 15:
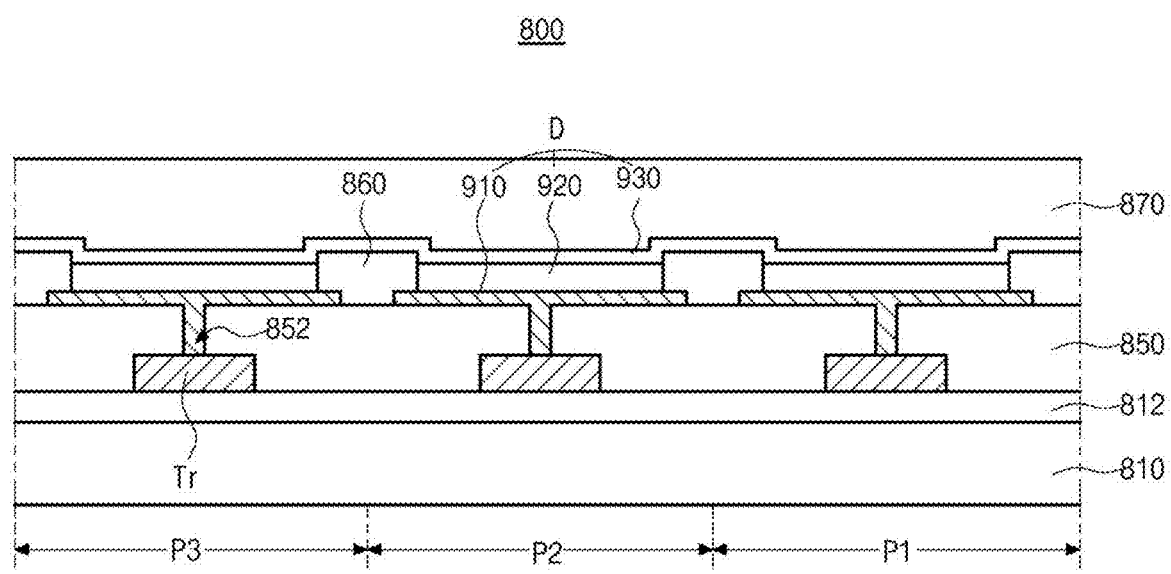
FIG. 15 is a schematic cross-sectional view illustrating an organic light emitting display device in accordance with another exemplary aspect of the present disclosure.

FIG. 15 is a schematic cross-sectional view illustrating an organic light emitting display device in accordance with another exemplary aspect of the present disclosure. As illustrated in FIG. 15, an organic light emitting display device 800 includes a substrate 810 that defines first to third pixel regions P1, P2 and P3, a thin film transistor Tr disposed over the substrate 810 and an OLED D disposed over the thin film transistor Tr and connected to the thin film transistor Tr. As an example, the first pixel region P1 may be a blue pixel region, the second pixel region P2 may be a green pixel region and the third pixel region P3 may be a red pixel region.

The substrate 810 may be a glass substrate or a flexible substrate. For example, the flexible substrate may be any one of a PI substrate, a PES substrate, a PEN substrate, a PET substrate and a PC substrate.

A buffer layer 812 is disposed over the substrate 810 and the thin film transistor Tr is disposed over the buffer layer 812. The buffer layer 812 may be omitted. As illustrated in FIG. 2, the thin film transistor Tr includes a semiconductor layer, a gate electrode, a source electrode and a drain electrode and acts as a driving element.

A passivation layer 850 is disposed over the thin film transistor Tr. The passivation layer 850 has a flat top surface and a drain contact hole 852 that exposes a drain electrode of the thin film transistor Tr.

The OLED D is disposed over the passivation layer 850, and includes a first electrode 910 that is connected to the drain electrode of the thin film transistor Tr, and an emissive layer 920 and a second electrode 930 each of which is disposed sequentially on the first electrode 910. The OLED D is disposed in each of the first to third pixel regions P1, P2 and P3 and emits different light in each pixel region. For example, the OLED D in the first pixel region P1 may emit blue light, the OLED D in the second pixel region P2 may emit green light and the OLED D in the third pixel region P3 may emit red light.

The first electrode 910 is separately formed for each of the first to third pixel regions P1, P2 and P3, and the second electrode 930 corresponds to the first to third pixel regions P1, P2 and P3 and is formed integrally.

The first electrode 910 may be one of an anode and a cathode, and the second electrode 930 may be the other of the anode and the cathode. In addition, one of the first electrode 910 and the second electrode 930 is a transmissive (or semi-transmissive) electrode and the other of the first electrode 910 and the second electrode 930 is a reflective electrode.

For example, the first electrode 910 may be an anode and may include conductive material having a relatively high work function value, i.e., a transparent conductive oxide layer of transparent conductive oxide (TCO). The second electrode 930 may be a cathode and may include conductive material having relatively low work function value, i.e., a metal material layer of low-resistant metal. For example, the first electrode 910 may include any one of ITO, IZO, ITZO, SnO, ZnO, ICO and AZO, and the second electrode 930 may include Al, Mg, Ca, Ag, alloy thereof (e.g. Mg—Ag) or combination thereof.

When the organic light emitting display device 800 is a bottom-emission type, the first electrode 910 may have a single-layered structure of a transparent conductive oxide layer.

Alternatively, when the organic light emitting display device 800 is a top-emission type, a reflective electrode or a reflective layer may be disposed under the first electrode 910. For example, the reflective electrode or the reflective layer may include, but is not limited to, Ag or APC alloy. In the OLED D of the top-emission type, the first electrode 910 may have a triple-layered structure of ITO/Ag/ITO or ITO/APC/ITO. Also, the second electrode 930 is thin so as to have light-transmissive (or semi-transmissive) property.

A bank layer 860 is disposed on the passivation layer 850 in order to cover edges of the first electrode 910. The bank layer 860 corresponds to each of the first to third pixel regions P1, P2 and P3 and exposes a center of the first electrode 910.

An emissive layer 920 is disposed on the first electrode 910. In one exemplary aspect, the emissive layer 920 may have a single-layered structure of an EML. Alternatively, the emissive layer 920 may include at least one of a HIL, a HTL, and an EBL disposed sequentially between the first electrode 910 and the EML and/or a HBL, an ETL and an EIL disposed sequentially between the EML and the second electrode 930.

In one exemplary aspect, the EML of the emissive layer 920 in the first pixel region P1 of the blue pixel region may comprise the first compound DF1 of the first delayed fluorescent material having the structure of Formulae 1 to 3, the second compound DF2 of the second delayed fluorescent material having the structure of Formula 4 to 6, and optionally the third compound H of the host.

An encapsulation film 870 is disposed over the second electrode 930 in order to prevent outer moisture from penetrating into the OLED D. The encapsulation film 870 may have, but is not limited to, a triple-layered structure of a first inorganic insulating film, an organic insulating film and a second inorganic insulating film.

The organic light emitting display device 800 may have a polarizer in order to decrease external light reflection. For example, the polarizer may be a circular polarizer. When the organic light emitting display device 800 is a bottom-emission type, the polarizer may be disposed under the substrate 810. Alternatively, when the organic light emitting display device 800 is a top emission type, the polarizer may be disposed over the encapsulation film 870.

Figure 16:
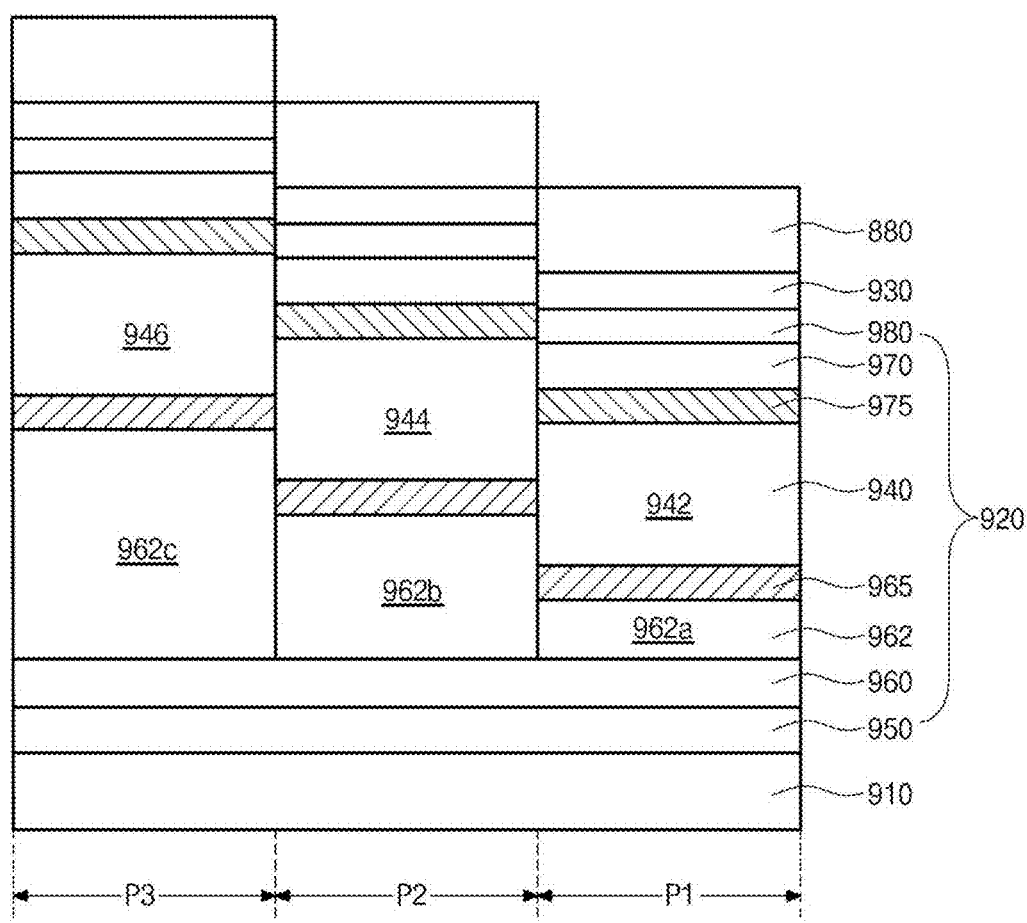
FIG. 16 is a schematic cross-sectional view illustrating an OLED in accordance with still another exemplary aspect of the present disclosure.

FIG. 16 is a schematic cross-sectional view illustrating an OLED in accordance with still another exemplary aspect of the present disclosure. As illustrated in FIG. 16, the OLED D5 comprises a first electrode 910, a second electrode 930 facing the first electrode 910 and an emissive layer 920 disposed between the first and second electrodes 910 and 930.

The first electrode 910 may be an anode and the second electrode 930 may be a cathode. As an example, the first electrode 910 may be a reflective electrode and the second electrode 930 may be a transmissive (or semi-transmissive) electrode.

The emissive layer 920 comprises an EML 940. The emissive layer 920 may comprise at least one of an HTL 960 disposed between the first electrode 910 and the EML 940 and an ETL 970 disposed between the EML 940 and the second electrode 930. Also, the emissive layer 920 may further comprise at least one of an HIL 950 disposed between the first electrode 910 and the HTL 960 and an EIL 980 disposed between the ETL 970 and the second electrode 930. In addition, the emissive layer 920 may further comprise at least one of an EBL 965 disposed between the HTL 960 and the EML 940 and an HBL 975 disposed between the EML 940 and the ETL 970.

In addition, the emissive layer 920 may further comprise an auxiliary hole transport layer (auxiliary HTL) 962 disposed between the HTL 960 and the EBL 965. The auxiliary HTL 962 may comprise a first auxiliary HTL 962a located in the first pixel region P1, a second auxiliary HTL 962b located in the second pixel region P2 and a third auxiliary HTL 962c located in the third pixel region P3.

The first auxiliary HTL 962a has a first thickness, the second auxiliary HTL 962b has a second thickness and the third auxiliary HTL 962c has a third thickness. The first thickness is less than the second thickness and the second thickness is less than the third thickness. Accordingly, the OLED D5 has a micro-cavity structure.

Owing to the first to third auxiliary HTLs 962a, 962b and 962c having different thickness to each other, the distance between the first electrode 910 and the second electrode 930 in the first pixel region P1 emitting light in the first wavelength range (blue light) is smaller than the distance between the first electrode 910 and the second electrode 930 in the second pixel region P2 emitting light in the second wavelength range (green light), which is longer than the first wavelength range. Also, the distance between the first electrode 910 and the second electrode 930 in the second pixel region P2 is smaller than the distance between the first electrode 910 and the second electrode 930 in the third pixel region P3 emitting light in the third wavelength range (red light), which is longer than the second wavelength range. Accordingly, the OLED D5 has improved luminous efficiency.

In FIG. 16, the first auxiliary HTL 962a is located in the first pixel region P1. Alternatively, the OLED D5 may implement the micro-cavity structure without the first auxiliary HTL 962a. In addition, a capping layer 880 may be disposed over the second electrode 930 in order to improve out-coupling of the light emitted from the OLED D5.

The EML 940 comprises a first EML (EML1) 942 located in the first pixel region P1, a second EML (EML2) 944 located in the second pixel region P2 and a third EML (EML3) 946 located in the third pixel region P3. Each of the EML1 942, the EML2 944 and the EML3 946 may be a blue EML, a green EML and a red EML, respectively.

In one exemplary aspect, the EML1 942 located in the first pixel region P1 may comprise the first compound DF1 of the first delayed fluorescent material having the structure of Formulae 1 to 3, the second compound DF2 of the second delayed fluorescent material having the structure of Formulae 4 to 6, and optionally the third compound H of the host. The EML1 942 may have a single-layered structure, a double-layered structure (FIG. 8) or a triple-layered structure (FIG. 11).

When the EML1 942 includes the first to third compounds DF1, DF2 and H, the contents of the third compound H may be larger than the contents of the first compound DF1, and the contents of the first compound DF1 is larger than the contents of the second compound DF2. In this case, exciton energy can be transferred efficiently from the first compound DF1 to the second compound DF2. As an example, the EML1 942 may comprise, but is not limited to, the third compound H between about 55 wt % and about 85 wt %, the first compound DF1 between about 10 wt % and about 40 wt %, and the second compound DF2 between about 0.1 wt % and about 5 wt %, respectively.

The EML2 944 located in the second pixel region P2 may comprise a host and green dopant and the EML3 946 located in the third pixel region P3 may comprise a host and red dopant. For example, the host in the EML2 944 and the EML3 946 may comprise the third compound H, and each of the green dopant and the red dopant may comprise at least one of green or red phosphorescent material, green or red fluorescent material and green or red delayed fluorescent material.

The OLED D5 emits blue light, green light and red light in each of the first to third pixel regions P1, P2 and P3 so that the organic light emitting display device 800 (FIG. 15) may implement a full-color image.

The organic light emitting display device 800 may further comprise a color filter layer corresponding to the first to third pixel regions P1, P2 and P3 for improving color purity of the light emitted from the OLED D. As an example, the color filter layer may comprise a first color filter layer (blue color filter layer) corresponding to the first pixel region P1, the second color filter layer (green color filter layer) corresponding to the second pixel region P2 and the third color filter layer (red color filter layer) corresponding to the third pixel region P3.

When the organic light emitting display device 800 is a bottom-emission type, the color filter layer may be disposed between the OLED D and the substrate 810. Alternatively, when the organic light emitting display device 800 is a top-emission type, the color filter layer may be disposed over the OLED D.

Figure 17:
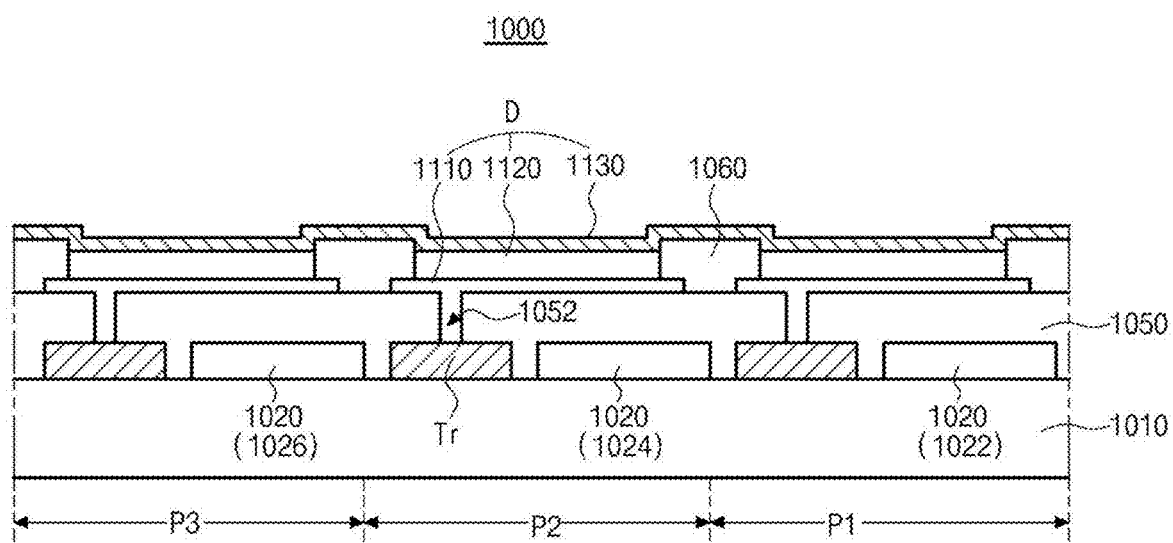
FIG. 17 is a schematic cross-sectional view illustrating an organic light emitting display device in accordance with still another exemplary aspect of the present disclosure.

FIG. 17 is a schematic cross-sectional view illustrating an organic light emitting display device in accordance with still another exemplary aspect of the present disclosure. As illustrated in FIG. 17, the organic light emitting display device 1000 comprise a substrate 1010 defining a first pixel region P1, a second pixel region P2 and a third pixel region P3, a thin film transistor Tr disposed over the substrate 1010, an OLED D disposed over the thin film transistor Tr and connected to the thin film transistor Tr and a color filter layer 1020 corresponding to the first to third pixel regions P1, P2 and P3. As an example, the first pixel region P1 may be a blue pixel region, the second pixel region P2 may be a green pixel region and the third pixel region P3 may be a red pixel region.

The substrate 1010 may be a glass substrate or a flexible substrate. For example, the flexible substrate may be any one of a PI substrate, a PES substrate, a PEN substrate, a PET substrate and a PC substrate. The thin film transistor Tr is located over the substrate 1010. Alternatively, a buffer layer may be disposed over the substrate 1010 and the thin film transistor Tr may be disposed over the buffer layer. As illustrated in FIG. 2, the thin film transistor Tr includes a semiconductor layer, a gate electrode, a source electrode and a drain electrode and acts as a driving element.

The color filter layer 1020 is located over the substrate 1010. As an example, the color filter layer 1020 may comprise a first color filter layer 1022 corresponding to the first pixel region P1, a second color filter layer 1024 corresponding to the second pixel region P2 and a third color filter layer 1026 corresponding to the third pixel region P3. The first color filter layer 1022 may be a blue color filter layer, the second color filter layer 1024 may be a green color filter layer and the third color filter layer 1026 may be a red color filter layer. For example, the first color filter layer 1022 may comprise at least one of blue dye or green pigment, the second color filter layer 1024 may comprise at least one of green dye or red pigment and the third color filter layer 1026 may comprise at least one of red dye or blue pigment.

A passivation layer 1050 is disposed over the thin film transistor Tr and the color filter layer 1020. The passivation layer 1050 has a flat top surface and a drain contact hole 1052 that exposes a drain electrode of the thin film transistor Tr.

The OLED D is disposed over the passivation layer 1050 and corresponds to the color filter layer 1020. The OLED D includes a first electrode 1110 that is connected to the drain electrode of the thin film transistor Tr, and an emissive layer 1120 and a second electrode 1130 each of which is disposed sequentially on the first electrode 1110. The OLED D emits white light in the first to third pixel regions P1, P2 and P3.

The first electrode 1110 is separately formed for each of the first to third pixel regions P1, P2 and P3, and the second electrode 1130 corresponds to the first to third pixel regions P1, P2 and P3 and is formed integrally.

The first electrode 1110 may be one of an anode and a cathode, and the second electrode 1130 may be the other of the anode and the cathode. In addition, the first electrode 1110 may be a transmissive (or semi-transmissive) electrode and the second electrode 1130 may be a reflective electrode.

For example, the first electrode 1110 may be an anode and may include conductive material having a relatively high work function value, i.e., a transparent conductive oxide layer of transparent conductive oxide (TCO). The second electrode 1130 may be a cathode and may include conductive material having relatively low work function value, i.e., a metal material layer of low-resistant metal. For example, the transparent conductive oxide layer of the first electrode 1110 may include any one of ITO, IZO, ITZO, SnO, ZnO, ICO and AZO, and the second electrode 1130 may include Al, Mg, Ca, Ag, alloy thereof (e.g. Mg—Ag) or combination thereof.

The emissive layer 1120 is disposed on the first electrode 1110. The emissive layer 1120 includes at least two emitting parts emitting different colors. Each of the emitting part may have a single-layered structure of an EML. Alternatively, each of the emitting parts may include at least one of a HIL, a HTL, and an EBL, a HBL, an ETL and an EIL. In addition, the emissive layer 1120 may further comprise a CGL disposed between the emitting parts.

At least one of the at least two emitting parts may comprise the first compound DF1 of the first delayed fluorescent material having the structure of Formulae 1 to 3, the second compound DF2 of the second delayed fluorescent material having the structure of Formulae 4 to 6, and optionally the third compound H of the host.

A bank layer 1060 is disposed on passivation layer 1050 in order to cover edges of the first electrode 1110. The bank layer 1060 corresponds to each of the first to third pixel regions P1, P2 and P3 and exposes a center of the first electrode 1110. As described above, since the OLED D emits white light in the first to third pixel regions P1, P2 and P3, the emissive layer 1120 may be formed as a common layer without being separated in the first to third pixel regions P1, P2 and P3. The bank layer 1060 is formed to prevent current leakage from the edges of the first electrode 1110, and the bank layer 1060 may be omitted.

Moreover, the organic light emitting display device 1000 may further comprise an encapsulation film disposed on the second electrode 1130 in order to prevent outer moisture from penetrating into the OLED D. In addition, the organic light emitting display device 1000 may further comprise a polarizer disposed under the substrate 1010 in order to decrease external light reflection.

In the organic light emitting display device 1000 in FIG. 17, the first electrode 1110 is a transmissive electrode, the second electrode 1130 is a reflective electrode, and the color filter layer 1020 is disposed between the substrate 1010 and the OLED D. That is, the organic light emitting display device 1000 is a bottom-emission type. Alternatively, the first electrode 1110 may be a reflective electrode, the second electrode 1130 may be a transmissive electrode (or semi-transmissive electrode) and the color filter layer 1020 may be disposed over the OLED D in the organic light emitting display device 1000.

In the organic light emitting display device 1000, the OLED D located in the first to third pixel regions P1, P2 and P3 emits white light, and the white light passes through each of the first to third pixel regions P1, P2 and P3 so that each of a blue color, a green color and a red color is displayed in the first to third pixel regions P1, P2 and P3, respectively.

A color conversion film may be disposed between the OLED D and the color filter layer 1020. The color conversion film corresponds to the first to third pixel regions P1, P2 and P3, and comprises a blue color conversion film, a green color conversion film and a red color conversion film each of which can convert the white light emitted from the OLED D into blue light, green light and red light, respectively. For example, the color conversion film may comprise quantum dots. Accordingly, the organic light emitting display device 1000 may further enhance its color purity. Alternatively, the color conversion film may displace the color filter layer 1020.

Figure 18:
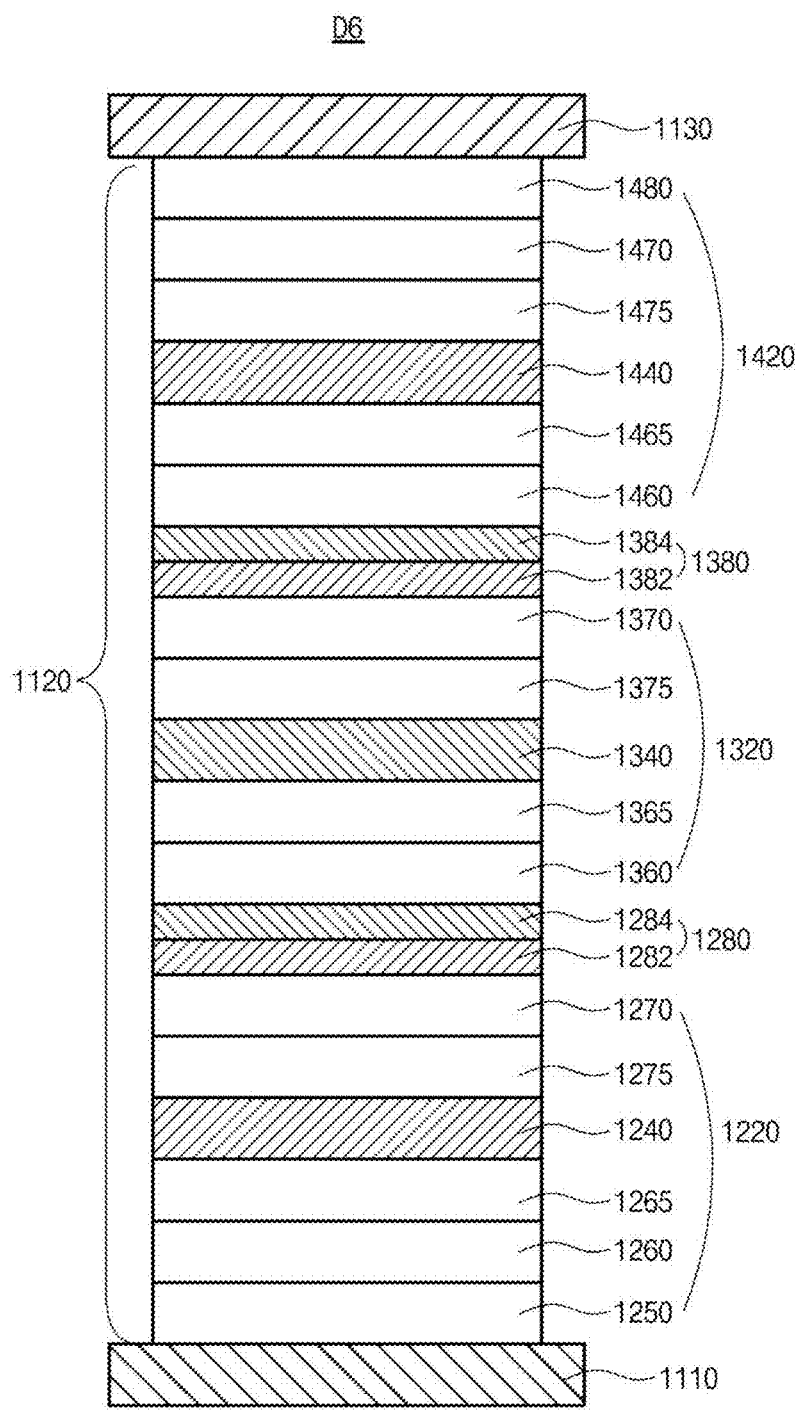
FIG. 18 is a schematic cross-sectional view illustrating an OLED in accordance with still another exemplary aspect of the present disclosure.

FIG. 18 is a schematic cross-sectional view illustrating an OLED in accordance with still another exemplary aspect of the present disclosure. As illustrated in FIG. 18, the OLED D6 comprises first and second electrodes 1110 and 1130 facing each other and an emissive layer 1120 disposed between the first and second electrodes 1110 and 1130. The first electrode 1110 may be an anode and the second electrode 1130 may be a cathode. For example, the first electrode 1110 may be a transmissive electrode and the second electrode 1130 may be a reflective electrode.

The emissive layer 1120 includes a first emitting part 1220 comprising a first EML (EML1) 1240, a second emitting part 1320 comprising a second EML (EML2) 1340 and a third emitting part 1420 comprising a third EML (EML3) 1440. In addition, the emissive layer 1120 may further comprise a first charge generation layer (CGL1) 1280 disposed between the first emitting part 1220 and the second emitting part 1320 and a second charge generation layer (CGL2) 1380 disposed between the second emitting part 1320 and the third emitting part 1420. Accordingly, the first emitting part 1220, the CGL1 1280, the second emitting part 1320, the CGL2 1380 and the third emitting part 1420 are disposed sequentially on the first electrode 1110.

The first emitting part 1220 may further comprise at least one of an HIL 1250 disposed between the first electrode 1110 and the EML1 1240, a first HTL (HTL1) 1260 disposed between the EML1 1240 and the HIL 1250 and a first ETL (ETL1) 1270 disposed between the EML1 1240 and the CGL1 1280. Alternatively, the first emitting part 1220 may further comprise at least one of a first EBL (EBL1) 1265 disposed between the HTL1 1260 and the EML1 1240 and a first HBL (HBL1) 1275 disposed between the EML1 1240 and the ETL1 1270.

The second emitting part 1320 may further comprise at least one of a second HTL (HTL2) 1360 disposed between the CGL1 1280 and the EML2 1340, a second ETL (ETL2) 1370 disposed between the EML2 1340 and the CGL2 1380. Alternatively, the second emitting part 1320 may further comprise a second EBL (EBL2) 1365 disposed between the HTL2 1360 and the EML2 1340 and/or a second HBL (HBL2) 1375 disposed between the EML2 1340 and the ETL2 1370.

The third emitting part 1420 may further comprise at least one of a third HTL (HTL3) 1460 disposed between the CGL2 1380 and the EML3 1440, a third ETL (ETL3) 1470 disposed between the EML3 1440 and the second electrode 1130 and an EIL 1480 disposed between the ETL3 1470 and the second electrode 1130. Alternatively, the third emitting part 1420 may further comprise a third EBL (EBL3) 1465 disposed between the HTL3 1460 and the EML3 1440 and/or a third HBL (HBL3) 1475 disposed between the EML3 1440 and the ETL3 1470.

The CGL1 1280 is disposed between the first emitting part 1220 and the second emitting part 1320. That is, the first emitting part 1220 and the second emitting part 1320 are connected via the CGL1 1280. The CGL1 1280 may be a PN-junction CGL that junctions a first N-type CGL (N-CGL1) 1282 with a first P-type CGL (P-CGL1) 1284.

The N-CGL1 1282 is disposed between the ETL1 1270 and the HTL2 1360 and the P-CGL1 1284 is disposed between the N-CGL1 1282 and the HTL2 1360. The N-CGL1 1282 transports electrons to the EML1 1240 of the first emitting part 1220 and the P-CGL1 1284 transport holes to the EML2 1340 of the second emitting part 1320.

The CGL2 1380 is disposed between the second emitting part 1320 and the third emitting part 1420. That is, the second emitting part 1320 and the third emitting part 1420 are connected via the CGL2 1380. The CGL2 1380 may be a PN-junction CGL that junctions a second N-type CGL (N-CGL2) 1382 with a second P-type CGL (P-CGL2) 1384.

The N-CGL2 1382 is disposed between the ETL2 1370 and the HTL3 1460 and the P-CGL2 1384 is disposed between the N-CGL2 1382 and the HTL3 1460. The N-CGL2 1382 transports electrons to the EML2 1340 of the second emitting part 1320 and the P-CGL2 1384 transport holes to the EML3 1440 of the third emitting part 1420.

In this aspect, one of the first to third EMLs 1240, 1340 and 1440 may be a blue EML, another of the first to third EMLs 1240, 1340 and 1440 may be a green EML and the third of the first to third EMLs 1240, 1340 and 1440 may be a red EML.

As an example, the EML1 1240 may be a blue EML, the EML2 1340 may be a green EML and the EML3 1440 may be a red EML. Alternatively, the EML1 1240 may be a red EML, the EML2 1340 may be a green EML and the EML3 1440 may be a blue EML. Hereinafter, the OLED D6 where the EML1 1240 is the blue EML, the EML2 1340 is the green EML and the EML3 1440 is the red EML will be described.

The EML1 1240 may comprise the first compound DF1 of the first delayed fluorescent material having the structure of Formulae 1 to 3, the second compound DF2 of the second delayed fluorescent material having the structure of Formulae 4 to 6, and optionally the third compound H of the host. The EML1 1240 may have a single-layered structure, a double-layered structure (FIG. 8) or a triple-layered structure (FIG. 11).

In the EML1 1240, the contents of the third compound H may be larger than the contents of the first compound DF1, and the contents of the first compound DF1 is larger than the contents of the second compound DF2. In this case, exciton energy can be transferred efficiently from the first compound DF1 to the second compound DF2. As an example, the EML1 1240 may comprise, but is not limited to, the third compound H between about 55 wt % and about 85 wt %, the first compound DF1 between about 10 wt % and about 40 wt %, and the second compound DF2 between about 0.1 wt % and about 5 wt %, respectively.

The EML2 1340 may include a host and a green dopant and the EML3 1440 may include a host and a red dopant. As an example, the host in the EML2 1340 and the EML3 1440 may comprise the third compound H, and each of the green dopant and the red dopant may comprise at least one of green or red phosphorescent material, green or red fluorescent material and green or red delayed fluorescent material.

The OLED D6 emits white light in each of the first to third pixel regions P1, P2 and P3 and the white light passes though the color filter layer 1020 (FIG. 17) correspondingly disposed in the first to third pixel regions P1, P2 and P3. Accordingly, the organic light emitting display device 1000 (FIG. 17) can implement a full-color image.

Figure 19:
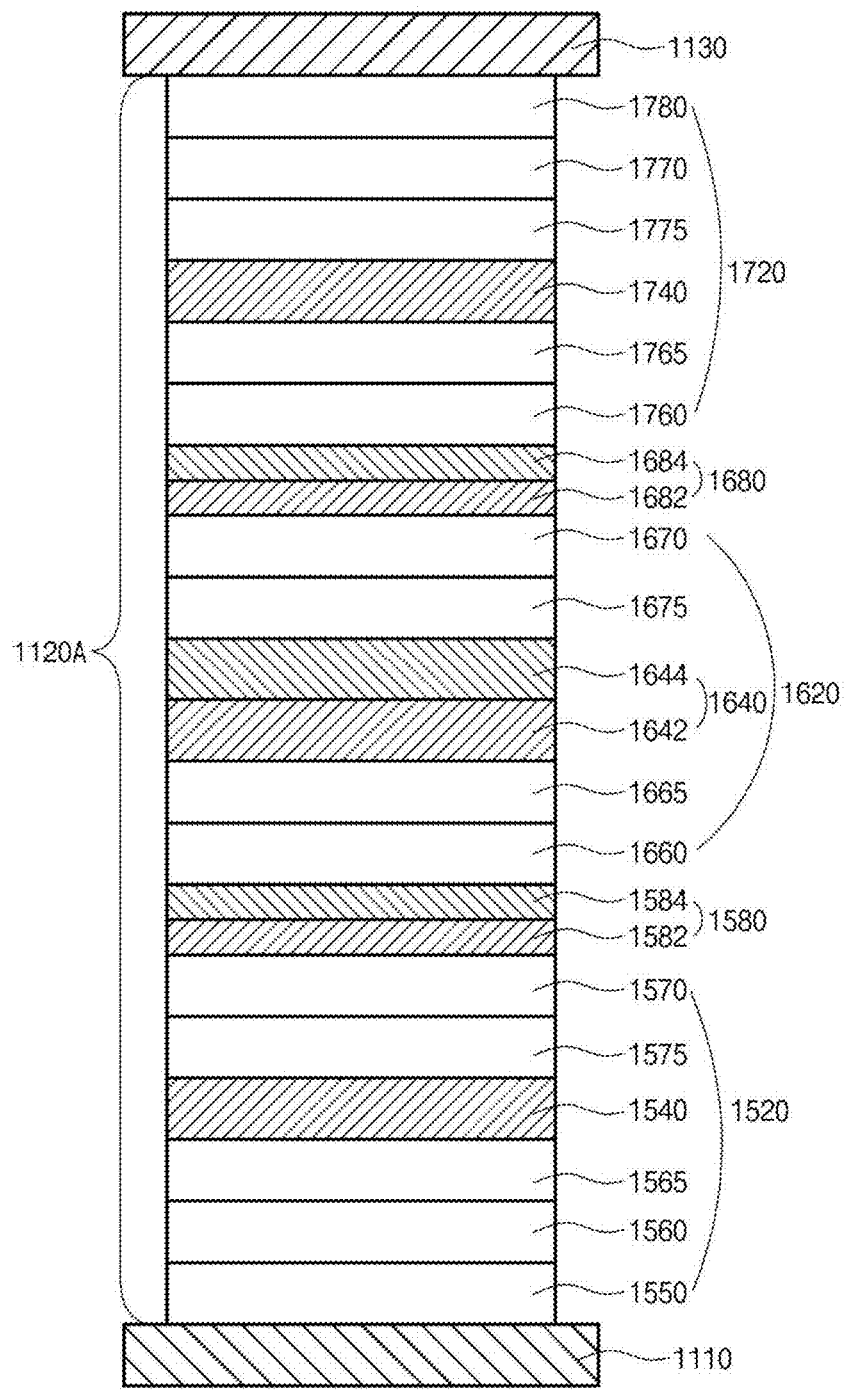
FIG. 19 is a schematic cross-sectional view illustrating an OLED in accordance with still another exemplary aspect of the present disclosure.

FIG. 19 is a schematic cross-sectional view illustrating an OLED in accordance with still another exemplary aspect of the present disclosure. As illustrated in FIG. 19, the OLED D7 comprises first and second electrodes 1110 and 1130 facing each other and an emissive layer 1120A disposed between the first and second electrodes 1110 and 1130. The first electrode 1110 may be an anode and the second electrode 1130 may be a cathode. For example, the first electrode 1110 may be a transmissive electrode and the second electrode 1130 may be a reflective electrode.

The emissive layer 1120A includes a first emitting part 1520 comprising an EML1 1540, a second emitting part 1620 comprising an EML2 1640 and a third emitting part 1720 comprising a EML3 1740. In addition, the emissive layer 1120A may further comprise a CGL1 1580 disposed between the first emitting part 1520 and the second emitting part 1620 and a CGL2 1680 disposed between the second emitting part 1620 and the third emitting part 1720. Accordingly, the first emitting part 1520, the CGL1 1580, the second emitting part 1620, the CGL2 1680 and the third emitting part 1720 are disposed sequentially on the first electrode 1110.

The first emitting part 1520 may further comprise at least one of an HIL 1550 disposed between the first electrode 1110 and the EML1 1540, an HTL1 1560 disposed between the EML1 1540 and the HIL 1550 and an ETL1 1570 disposed between the EML1 1540 and the CGL1 1580. Alternatively, the first emitting part 1520 may further comprise an EBL1 1565 disposed between the HTL1 1560 and the EML1 1540 and/or a HBL1 1575 disposed between the EML1 1540 and the ETL1 1570.

The EML2 1640 of the second emitting part 1620 comprises a lower EML 1642 and an upper EML 1644. The lower EML 1642 is located adjacently to the first electrode 1110 and the upper EML 1644 is located adjacently to the second electrode 1130. In addition, the second emitting part 1620 may further comprise at least one of an HTL2 1660 disposed between the CGL1 1580 and the EML2 1640, and an ETL2 1670 disposed between the EML2 1640 and the CGL2 1680. Alternatively, the second emitting part 1620 may further comprise at least one of an EBL2 1665 disposed between the HTL2 1660 and the EML2 1640 and an HBL2 1675 disposed between the EML2 1640 and the ETL2 1670.

The third emitting part 1720 may further comprise at least one of an HTL3 1760 disposed between the CGL2 1680 and the EML3 1740, an ETL3 1770 disposed between the EML3 1740 and the second electrode 1130 and an EIL 1780 disposed between the ETL3 1770 and the second electrode 1130. Alternatively, the third emitting part 1720 may further comprise an EBL3 1765 disposed between the HTL3 1760 and the EML3 1740 and/or a HBL3 1775 disposed between the EML3 1740 and the ETL3 1770.

The CGL1 1580 is disposed between the first emitting part 1520 and the second emitting part 1620. That is, the first emitting part 1520 and the second emitting part 1620 are connected via the CGL1 1580. The CGL1 1580 may be a PN-junction CGL that junctions an N-CGL1 1582 with a P-CGL1 1584. The N-CGL1 1582 is disposed between the ETL1 1570 and the HTL2 1660 and the P-CGL1 1584 is disposed between the N-CGL1 1582 and the HTL2 1660.

The CGL2 1680 is disposed between the second emitting part 1620 and the third emitting part 1720. That is, the second emitting part 1620 and the third emitting part 1720 are connected via the CGL2 1680. The CGL2 1680 may be a PN-junction CGL that junctions an N-CGL2 1682 with a P-CGL2 1684. The N-CGL2 1682 is disposed between the ETL2 1670 and the HTL3 1760 and the P-CGL2 1684 is disposed between the N-CGL2 1682 and the HTL3 1760. In one exemplary aspect, at least one of the N-CGL1 1582 and the N-CGL2 1682 may include any organic compound having the structure of Formulae 1 to 3.

In this aspect, each of the EML1 1540 and the EML3 1740 may be a blue EML. In an exemplary aspect, each of the EML1 1540 and the EML3 1740 may comprise the first compound DF1 of the first delayed fluorescent material, the second compound DF2 of the second delayed fluorescent material, and optionally the third compound H of the host. Each of the first to third compounds DF1, DF2 and H in the EML1 1540 may be identical to or different from each of the first to third compounds DF1, DF2 and H in the EML3 1740, respectively. Alternatively, the EML3 1740 may include another compound that is different from at least one of the first compound DF1 and the second compound DF2 in the EML1 1540, and thus the EML3 1740 may emit light different from the light emitted from the EML1 1540 or may have different luminous efficiency from the luminous efficiency of the EML1 1540.

As an example, when the EML1 1540 and the EML3 1740 include the first to third compounds DF1, DF2 and H, the contents of the third compound H may be larger than the contents of the first compound DF1, and the contents of the first compound DF1 is larger than the contents of the second compound DF2 in each of the EML1 1540 and the EML3 1740. In this case, exciton energy can be transferred efficiently from the first compound DF1 to the second compound DF2. As an example, each of the EML1 1540 and the EML3 1740 may comprise, but is not limited to, the third compound H between about 55 wt % and about 85 wt %, the first compound DF1 between about 10 wt % and about 40 wt % and the second compound DF2 between about 0.1 wt % and about 5 wt %, respectively.

One of the lower EML 1642 and the upper EML 1644 in the EML2 1640 may be a green EML and the other of the lower EML 1642 and the upper EML 1644 in the EML2 1640 may be a red EML. The green EML and the red EML is sequentially disposed to form the EML2 1640.

In one exemplary aspect, the lower EML 1642 of the green EML may comprise a host and a green dopant and the upper EML 1644 of the red EML may comprise a host and a red dopant. As an example, the host may include the third compound H, and each of the green dopant and the red dopant may comprise at least one of green or red phosphorescent material, green or red fluorescent material and green or red delayed fluorescent material.

The OLED D7 emits white light in each of the first to third pixel regions P1, P2 and P3 and the white light passes though the color filter layer 1020 (FIG. 17) correspondingly disposed in the first to third pixel regions P1, P2 and P3. Accordingly, the organic light emitting display device 1000 (FIG. 17) can implement a full-color image.

In FIG. 19, the OLED D7 has a three-stack structure including the first to three emitting parts 1520, 1620 and 1720 which includes the EML1 1540 and the EML3 1740 as a blue EML. Alternatively, the OLED D7 may have a two-stack structure where one of the first emitting part 1520 and the third emitting part 1720 each of which includes the EML1 1540 and the EML3 1740 as a blue EML is omitted.

Example 1 (Ex. 1): Fabrication of OLED

An OLED comprising an EML into which Compound 1-6 of Formula 3 (HOMO: −5.6 eV, LUMO: −2.8 eV, $\Delta E_{ST}$: 0.10 eV) as the first compound, Compound 2-2 of Formula 6 (HOMO: −5.4 eV, LUMO: −2.8 eV, $\Delta E_{ST}$: 0.0017 eV) as the second compound DF2 and mCBP (HOMO: −6.0 eV, LUMO: −2.5 eV) was introduced was fabricated. ITO substrate was washed by UV-Ozone treatment before using, and was transferred to a vacuum chamber for depositing emission layer. Subsequently, an anode, an emission layer and a cathode were deposited by evaporation from a heating boat under $10^{-7}$ torr vacuum condition with setting deposition rate of 1 Å/s in the following order:

An anode (ITO, 50 nm); an HIL (HAT-CN, 7 nm); an HTL (NPB, 45 nm); an EBL (TAPC, 10 nm), an EML (mCBP (69 wt %), Compound 1-6 (30 wt %) and Compound 2-2 (1 wt %), 35 nm); an HBL (B3PYMPM, 10 nm); an ETL (TPBi, 25 nm), an EIL (LiF); and a cathode (Al).

Example 2 (Ex. 2): Fabrication of OLED

An OLED was fabricated using the same materials as Example 1, except that Compound 2-3 (HOMO: −5.5 eV, LUMO: −2.8 eV, $\Delta E_{ST}$: 0.0019 eV) of Formula 6 as the second compound instead of Compound 2-2 was used in the EML.

Example 3 (Ex. 3): Fabrication of OLED

An OLED was fabricated using the same materials as Example 1, except that Compound 1-17 (HOMO: −5.5 eV, LUMO: −2.8 eV, $\Delta E_{ST}$: 0.09 eV) of Formula 3 as the first compound instead of Compound 1-6 was used in the EML.

Example 4 (Ex. 4): Fabrication of OLED

An OLED was fabricated using the same materials as Example 1, except that Compound 1-17 (HOMO: −5.5 eV, LUMO: −2.8 eV, $\Delta E_{ST}$: 0.09 eV) of Formula 3 as the first compound instead of Compound 1-6 and Compound 2-3 (HOMO: −5.5 eV, LUMO: −2.8 eV, $\Delta E_{ST}$: 0.0019 eV) of Formula 6 as the second compound instead of Compound 2-3 were used in the EML.

Example 5 (Ex. 5): Fabrication of OLED

An OLED was fabricated using the same materials as Example 1, except that Compound 1-11 (HOMO: −5.6 eV, LUMO: −2.7 eV, $\Delta E_{ST}$: 0.10 eV) of Formula 3 as the first compound instead of Compound 1-6 was used in the EML.

Example 6 (Ex. 6): Fabrication of OLED

An OLED was fabricated using the same materials as Example 1, except that Compound 1-11 (HOMO: −5.6 eV, LUMO: −2.7 eV, $\Delta E_{ST}$: 0.10 eV) of Formula 3 as the first compound instead of Compound 1-6 and Compound 2-3 (HOMO: −5.5 eV, LUMO: −2.8 eV, $\Delta E_{ST}$: 0.0019 eV) of Formula 6 as the second compound instead of Compound 2-2 were used in the EML.

Example 7 (Ex. 7): Fabrication of OLED

An OLED was fabricated using the same materials as Example 1, except that Compound 1-9 (HOMO: −5.6 eV, LUMO: −2.7 eV, $\Delta E_{ST}$: 0.09 eV) of Formula 3 as the first compound instead of Compound 1-6 was used in the EML.

Example 8 (Ex. 8): Fabrication of OLED

An OLED was fabricated using the same materials as Example 1, except that Compound 1-9 (HOMO: −5.6 eV, LUMO: −2.7 eV, $\Delta E_{ST}$: 0.09 eV) of Formula 3 as the first compound instead of Compound 1-6 and Compound 2-3 (HOMO: −5.5 eV, LUMO: −2.8 eV, $\Delta E_{ST}$: 0.0019 eV) of Formula 6 as the second compound instead of Compound 2-2 were used in the EML.

Example 9 (Ex. 9): Fabrication of OLED

An OLED was fabricated using the same materials as Example 1, except that Compound 1-14 (HOMO: −5.6 eV, LUMO: −2.7 eV, $\Delta E_{ST}$: 0.10 eV) of Formula 3 as the first compound instead of Compound 1-6 was used in the EML.

Example 10 (Ex. 10): Fabrication of OLED

An OLED was fabricated using the same materials as Example 1, except that Compound 1-14 (HOMO: −5.6 eV, LUMO: −2.7 eV, $\Delta E_{ST}$: 0.10 eV) of Formula 3 as the first compound instead of Compound 1-6 and Compound 2-3 (HOMO: −5.5 eV, LUMO: −2.8 eV, $\Delta E_{ST}$: 0.0019 eV) of Formula 6 as the second compound instead of Compound 2-2 were used in the EML.

Comparative Example 1 (Ref. 1): Fabrication of OLED

An OLED was fabricated using the same materials as Example 1, except that the following Ref. 2-2 (HOMO: −5.5 eV, LUMO: −2.9 eV, $\Delta E_{ST}$: 0.18 eV) as the second compound instead of Compound 2-2 was used in the EML.

Comparative Example 2 (Ref. 2): Fabrication of OLED

An OLED was fabricated using the same materials as Example 1, except that Compound 1-17 of Formula 3 (HOMO: −5.5 eV, LUMO: −2.8 eV, $\Delta E_{ST}$: 0.09 eV) as the first compound instead of Compound 1-6 and the following Ref. 2-1 (HOMO: −5.6 eV, LUMO: −2.9 eV, $\Delta E_{ST}$: 0.18 eV) as the second compound instead of Compound 2-2 were used in the EML.

Comparative Example 3 (Ref. 3): Fabrication of OLED

An OLED was fabricated using the same materials as Example 1, except that the following Ref. 2-3 (HOMO: −5.2 eV, LUMO: −2.7 eV, $\Delta E_{ST}$: 0.6 eV) as the second compound instead of Compound 2-2 was used in the EML.

Comparative Example 4 (Ref. 4): Fabrication of OLED

An OLED was fabricated using the same materials as Example 1, except that the following Ref. 2-4 (HOMO: −5.2 eV, LUMO: −2.6 eV, $\Delta E_{ST}$: 0.5 eV) as the second compound instead of Compound 2-2 was used in the EML.

Comparative Example 5 (Ref. 5): Fabrication of OLED

An OLED was fabricated using the same materials as Example 1, except that the following Ref. 1-1 (HOMO: −5.9 eV, LUMO: −2.8 eV, $\Delta E_{ST}$: 0.12 eV) as the first compound instead of Compound 1-band the following Ref. 2-1 (HOMO: −5.6 eV, LUMO: −2.9 eV, $\Delta E_{ST}$: 0.18 eV) as the second compound instead of Compound 2-2 were used in the EML.

Comparative Example 6 (Ref. 6): Fabrication of OLED

An OLED was fabricated using the same materials as Example 1, except that the following Ref. 1-1 (HOMO: −5.9 eV, LUMO: −2.8 eV, $\Delta E_{ST}$: 0.12 eV) as the first compound instead of Compound 1-6 was used in the EML.

Comparative Example 7 (Ref. 7): Fabrication of OLED

An OLED was fabricated using the same materials as Example 1, except that the following Ref 1-1 (HOMO: −5.9 eV, LUMO: −2.8 eV, $\Delta E_{ST}$: 0.1 w eV) as the first compound instead of Compound 1-6 and the following Ref 2-3 (HOMO: −5.2 eV, LUMO: −2.7 eV, $\Delta E_{ST}$: 0.6 eV) as the second compound instead of Compound 2-2 were used in the EML.

Comparative Example 8 (Ref. 8): Fabrication of OLED

An OLED was fabricated using the same materials as Example 1, except that the following Ref. 1-1 (HOMO: −5.9 eV, LUMO: −2.8 eV, $\Delta E_{ST}$: 0.12 eV) as the first compound instead of Compound 1-6 and the following Ref 2-4 (HOMO: −5.2 eV, LUMO: −2.6 eV, $\Delta E_{ST}$: 0.5 eV) as the second compound instead of Compound 2-2 were used in the EML.

Comparative Example 9 (Ref. 9): Fabrication of OLED

An OLED was fabricated using the same materials as Example 1, except that the following Ref. 1-2 (HOMO: −6.0 eV, LUMO: −3.0 eV, $\Delta E_{ST}$: 0.21 eV) as the first compound instead of Compound 1-band the following Ref. 2-1 (HOMO: −5.6 eV, LUMO: −2.9 eV, $\Delta E_{ST}$: 0.18 eV) as the second compound instead of Compound 2-2 were used in the EML.

Comparative Example 10 (Ref. 10): Fabrication of OLED

An OLED was fabricated using the same materials as Example 1, except that the following Ref. 1-2 (HOMO: −6.0 eV, LUMO: −3.0 eV, $\Delta E_{ST}$: 0.21 eV) as the first compound instead of Compound 1-6 was used in the EML.

Comparative Example 11 (Ref. 11): Fabrication of OLED

An OLED was fabricated using the same materials as Example 1, except that the following Ref. 1-2 (HOMO: −6.0 eV, LUMO: −3.0 eV, $\Delta E_{ST}$: 0.21 eV) as the first compound instead of Compound 1-6 and the following Ref 2-3 (HOMO: −5.2 eV, LUMO: −2.7 eV, $\Delta E_{ST}$: 0.6 eV) as the second compound instead of Compound 2-2 were used in the EML.

Comparative Example 12 (Ref. 12): Fabrication of OLED

An OLED was fabricated using the same materials as Example 1, except that the following Ref. 1-2 (HOMO: −6.0 eV, LUMO: −3.0 eV, $\Delta E_{ST}$: 0.21 eV) as the first compound instead of Compound 1-6 and the following Ref 2-4 (HOMO: −5.2 eV, LUMO: −2.6 eV, $\Delta E_{ST}$: 0.5 eV) as the second compound instead of Compound 2-2 were used in the EML.

[Reference Compounds]

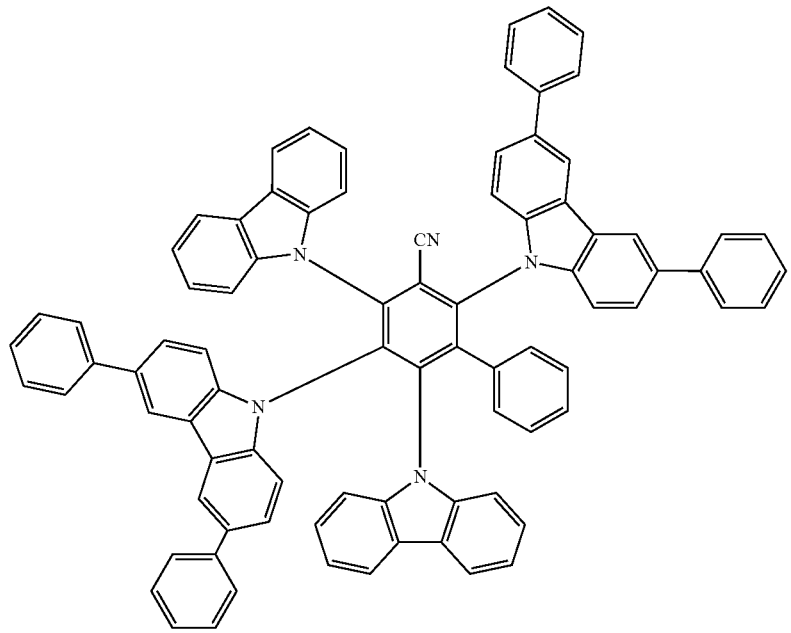

Ref. 1-1

Ref. 1-2
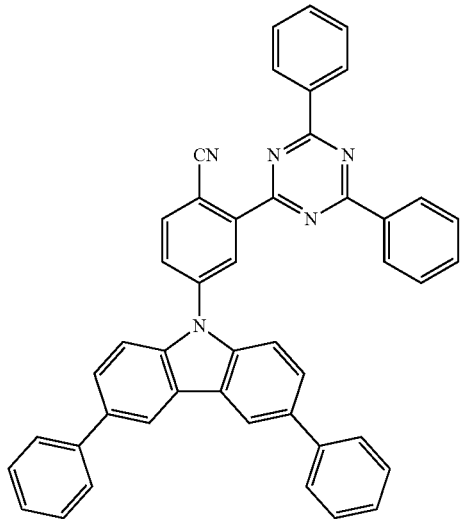
Ref. 2-1
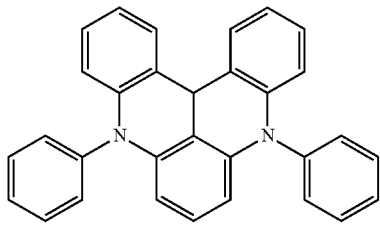
Ref. 2-2
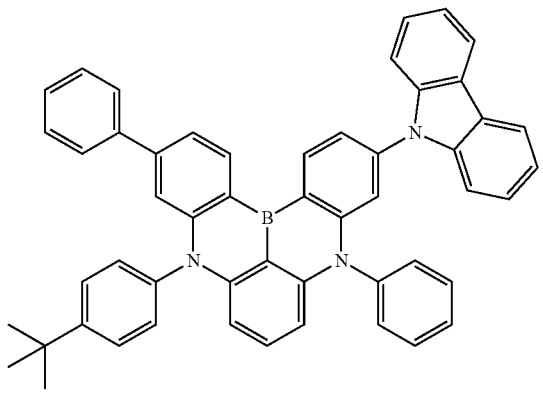
Ref. 2-3
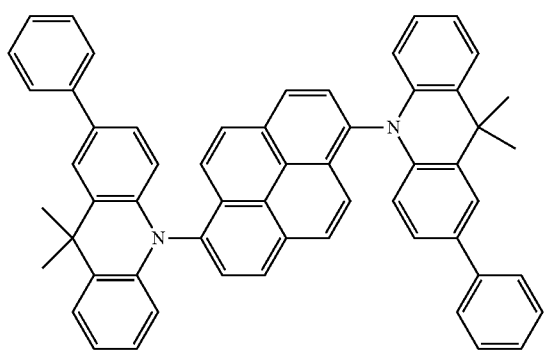

Ref. 2-4

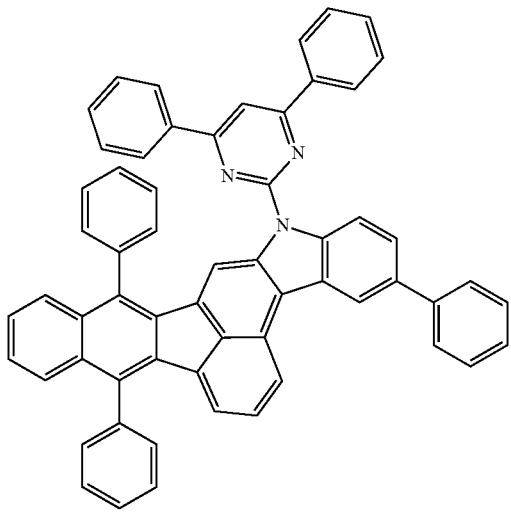

The following table 1 indicates the kinds of the first and second compounds and the energy level bandgap (ΔHOMO) between the HOMO energy level and energy level bandgap between HOMO and LUMO energy levels of the first compound and the second compound.

TABLE 1

First and Second Compounds in EML

| | First Compound | | Second Compound | | | |
|---|---|---|---|---|---|---|
| Sample | Material | HOMO (eV) | Material | HOMO (eV) | ΔHOMO (eV) | $\Delta E_{ST}{}^{a}$ (eV) |
| Ref. 1 | 1-6 | −5.6 | Ref. 2-2 | −5.5 | 0.1 | −0.08 |
| Ref. 2 | 1-17 | −5.5 | Ref. 2-1 | −5.6 | 0.1 | −0.09 |
| Ref. 3 | 1-6 | −5.6 | Ref. 2-3 | −5.2 | 0.4 | −0.5 |
| Ref. 4 | 1-6 | −5.6 | Ref. 2-4 | −5.2 | 0.4 | −0.4 |
| Ref. 5 | Ref. 1-1 | −5.9 | Ref. 2-1 | −5.6 | 0.3 | −0.06 |
| Ref. 6 | Ref. 1-1 | −5.9 | 2-2 | −5.4 | 0.5 | 0.1183 |
| Ref. 7 | Ref. 1-1 | −5.9 | Ref. 2-3 | −5.2 | 0.7 | −0.48 |
| Ref. 8 | Ref. 1-1 | −5.9 | Ref. 2-4 | −5.2 | 0.7 | −0.38 |
| Ref. 9 | Ref. 1-2 | −6.0 | Ref. 2-1 | −5.6 | 0.4 | 0.03 |
| Ref. 10 | Ref. 1-2 | −6.0 | 2-2 | −5.4 | 0.6 | 0.2083 |
| Ref. 11 | Ref. 1-2 | −6.0 | Ref. 2-3 | −5.2 | 0.8 | −0.39 |
| Ref. 12 | Ref. 1-2 | −6.0 | Ref. 2-4 | −5.2 | 0.8 | −0.29 |
| Ex. 1 | 1-6 | −5.6 | 2-2 | −5.4 | 0.2 | 0.0983 |
| Ex. 2 | 1-6 | −5.6 | 2-3 | −5.5 | 0.1 | 0.0981 |
| Ex. 3 | 1-17 | −5.5 | 2-2 | −5.4 | 0.1 | 0.0883 |
| Ex. 4 | 1-17 | −5.5 | 2-3 | −5.5 | 0 | 0.0881 |
| Ex. 5 | 1-11 | −5.6 | 2-2 | −5.4 | 0.2 | 0.0983 |
| Ex. 6 | 1-11 | −5.6 | 2-3 | −5.5 | 0.1 | 0.0981 |
| Ex. 7 | 1-9 | −5.6 | 2-2 | −5.4 | 0.2 | 0.0883 |
| Ex. 8 | 1-9 | −5.6 | 2-3 | −5.5 | 0.1 | 0.0881 |
| Ex. 9 | 1-14 | −5.6 | 2-2 | −5.4 | 0.2 | 0.0983 |
| Ex. 10 | 1-14 | −5.6 | 2-3 | −5.5 | 0.1 | 0.0981 |

$^{a}\Delta E_{ST}$ of the first compound − $\Delta E_{ST}$ of the second compound

Experimental Example 1: Measurement of Luminous Properties of OLED

Each of the OLED fabricated in Ex. 1-10 and Ref. 1-12 was connected to an external power source and then luminous properties for all the diodes were evaluated using a constant current source (KEITHLEY) and a photometer PR650 at room temperature. In particular, driving voltage (V), current efficiency (cd/A), power efficiency (lm/W), color coordinate, external quantum efficiency (EQE, %) and $LT_{95}$ (time period from initial luminance to 95%) at 8.6 mA/m² current density as well as whether or not hole trap and exciplex formation were measured. The measurement results for the OLEDs are shown in the following table 2 and FIGS. 20 and 21.

TABLE 2

Luminous Properties of OLED

| Sample | V | cd/A | lm/W | CIEy | EQE (%) | $LT_{95}$ (h) | Hole Trap | Exciplex Formation |
|---|---|---|---|---|---|---|---|---|
| Ref. 1 | 4.60 | 23.0 | 15.7 | 0.222 | 15.5 | 30 | N | N |
| Ref. 2 | 3.80 | 21.7 | 17.5 | 0.222 | 15.1 | 17 | N | N |
| Ref. 3 | 5.32 | 12.0 | 7.1 | 0.173 | 8.9 | 7 | Y | N |
| Ref. 4 | 4.53 | 15.9 | 11.1 | 0.191 | 11.0 | 3 | Y | N |
| Ref. 5 | 4.98 | 12.1 | 7.6 | 0.208 | 8.5 | 12 | Y | N |
| Ref. 6 | 4.87 | 12.3 | 8.4 | 0.216 | 10.8 | 5 | Y | N |
| Ref. 7 | 3.53 | 16.4 | 10.7 | 0.417 | 9.4 | 2 | Y | Y |
| Ref. 8 | 3.57 | 24.5 | 21 | 0.336 | 10.7 | 3 | Y | Y |
| Ref. 9 | 5.05 | 10.2 | 6.7 | 0.212 | 6.9 | 2 | Y | N |
| Ref. 10 | 3.49 | 14.9 | 13.4 | 0.375 | 6.4 | 1 | Y | Y |
| Ref. 11 | 3.35 | 17.1 | 13.5 | 0.405 | 8.3 | 15 | Y | Y |
| Ref. 12 | 4.22 | 21.7 | 16.1 | 0.435 | 8.7 | 10 | Y | Y |
| Ex. 1 | 4.02 | 35.1 | 27.4 | 0.289 | 18.9 | 120 | N | N |
| Ex. 2 | 3.28 | 55.6 | 53.2 | 0.259 | 24.8 | 180 | N | N |
| Ex. 3 | 3.86 | 37.4 | 30.4 | 0.259 | 22.4 | 150 | N | N |
| Ex. 4 | 3.51 | 42.7 | 38.2 | 0.287 | 23.5 | 220 | N | N |
| Ex. 5 | 4.12 | 28.8 | 22.0 | 0.223 | 18.7 | 100 | N | N |
| Ex. 6 | 3.19 | 17.3 | 17.1 | 0.252 | 18.1 | 105 | N | N |
| Ex. 7 | 3.36 | 21.7 | 20.3 | 0.136 | 21.6 | 197 | N | N |
| Ex. 8 | 3.91 | 21.1 | 16.9 | 0.184 | 17.0 | 160 | N | N |
| Ex. 9 | 3.94 | 42.5 | 33.9 | 0.329 | 20.9 | 120 | N | N |
| Ex. 10 | 3.43 | 38.3 | 35.1 | 0.315 | 17.8 | 130 | N | N |

Figure 20:
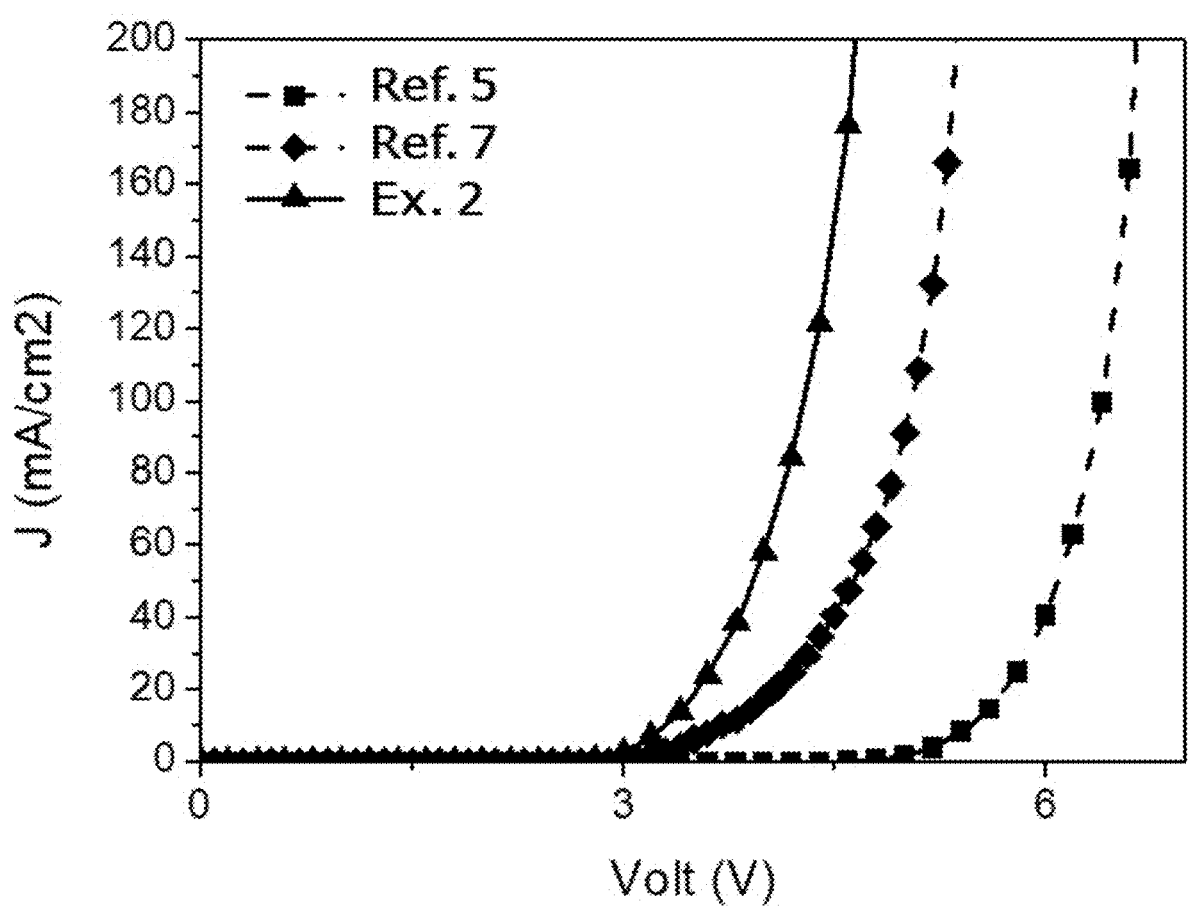
FIG. 20 is a graph illustrating voltage (V)—current density (J) measurement of the OLEDs fabricated in Examples and Comparative Examples.
Figure 21:
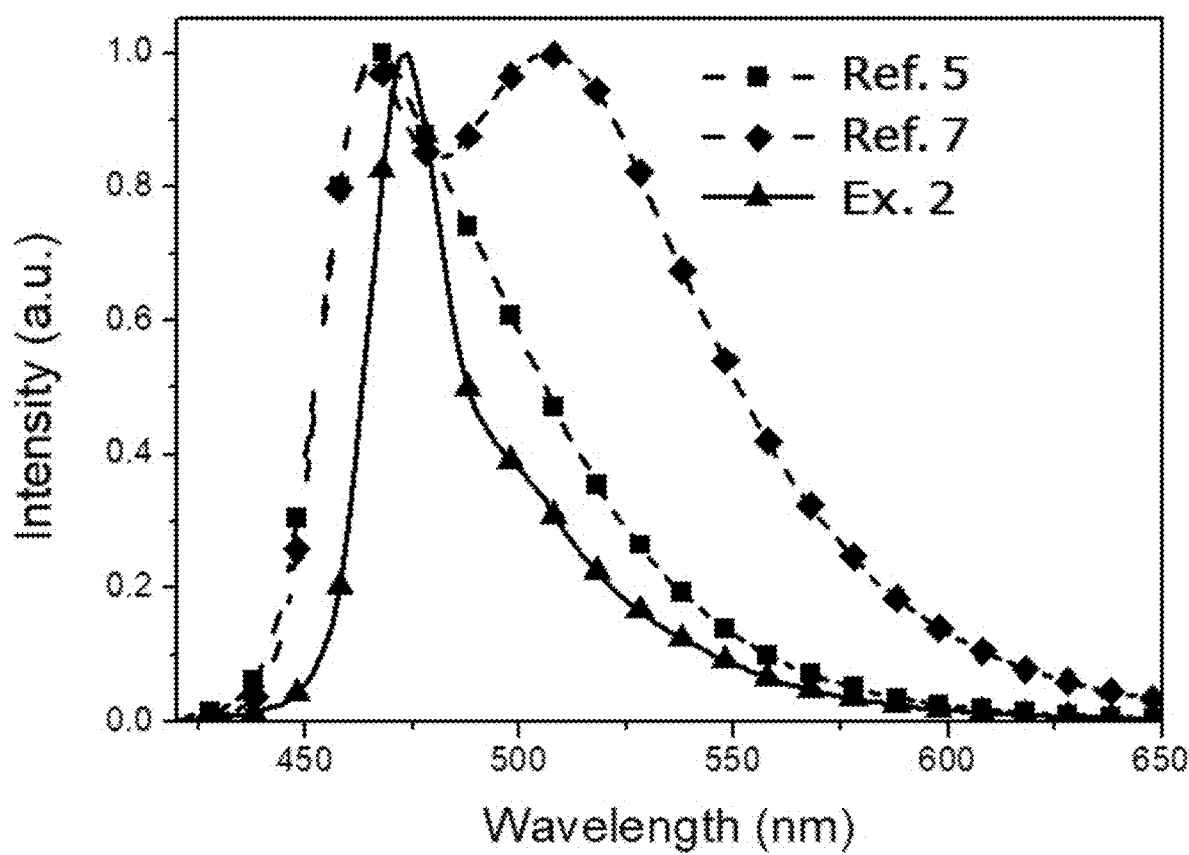
FIG. 21 is a graph illustrating electroluminescence peak intensity measurement of the OLEDs fabricated in Examples and Comparative Examples.

As indicated in Table 2 and FIGS. 20 and 21, holes were trapped in the OLEDs fabricated in Comparative Examples each of which is designed to have the HOMO energy level bandgap between the first and second compounds is equal to or more than 0.3 eV, and as a result, the driving voltages of the OLEDs were raised, electrical properties of the OLEDs were deteriorated significantly, and FWHM of the OLEDs was increased due to excitons that were not transferred to the second compound from the first compound. Particularly, it was confirmed that exciplex was formed between the LUMO of the first compound and the HOMO of the second compound in the OLEDs each of which is designed to have the HOMO energy level bandgap between the first and second compounds is more than 0.5 eV, and as a result, electrical properties of the OLEDs were further deteriorated and color purity of the OLEDs was decreased as the FWHM of the OLEDs is wide. On the other hand, holes were not trapped and exciplex was not formed in the OLEDs fabricated in Examples each of which is designed to have the HOMO energy level bandgap between the first and second compounds is less than 0.3 eV.

Also, compared to the OLEDs fabricated in Comparative Examples 3-12, the OLED fabricated in Examples decreased its driving voltage up to 40.0%, and improved its current efficiency, power efficiency, EQE and $LT_{95}$ up to 445.1%, 694.0%, 287.5% and 220 times, respectively.

In addition, Compared to the OLEDs in Comparative Examples 1-2 each of which is designed to have the $\Delta E_{ST}$ of the second compound more than the $\Delta E_{ST}$ of the first compound, the OLEDs in Examples decreased its driving voltage up to 30.7%, and improved its current efficiency, power efficiency, EQE and $LT_{95}$ up to 156.2%, 238.9%, 64.2% and 11.9 times, respectively.

It will be apparent to those skilled in the art that various modifications and variations can be made in the OLED and the organic light emitting device including the OLED of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light emitting diode, comprising:
   a first electrode;
   a second electrode facing the first electrode; and
   an emissive layer disposed between the first and second electrodes and including at least one emitting material layer,
   wherein the at least one emitting material layer includes a first compound and a second compound, and
   wherein the first compound has the following structure of Formula 1 and the second compound has the following structure of Formula 4:

[Formula 1]

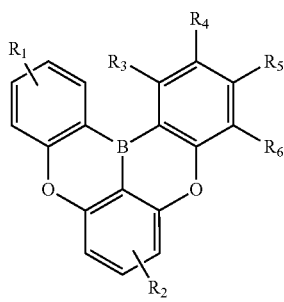

wherein each of $R_1$ and $R_2$ is independently selected from the group consisting of protium, deuterium, tritium, boryl, an unsubstituted or substituted amino group, an unsubstituted or substituted $C_1$-$C_{20}$ alkyl group, an unsubstituted or substituted $C_1$-$C_{20}$ alkyl amino group, an unsubstituted or substituted $C_6$-$C_{30}$ aromatic group and an unsubstituted or substituted $C_3$-$C_{30}$ hetero aromatic group; each of $R_3$ to $R_6$ is independently selected from the group consisting of protium, deuterium, tritium, boryl, an unsubstituted or substituted $C_1$-$C_{20}$ alkyl group, an unsubstituted or substituted $C_1$-$C_{20}$ alkyl amino group, an unsubstituted or substituted $C_6$-$C_{30}$ aromatic group and an unsubstituted or substituted $C_3$-$C_{30}$ hetero aromatic group, or adjacent two of $R_3$ to $R_6$ form an unsubstituted or substituted fused ring including boron and oxygen, and wherein at least two adjacent $R_3$ to $R_6$ form an unsubstituted or substituted fused ring including boron and oxygen;

[Formula 4]

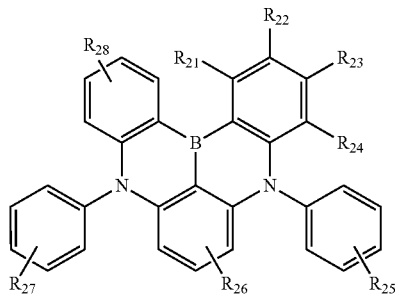

wherein each of $R_{21}$ to $R_{24}$ is independently selected from the group consisting of protium, deuterium, tritium, boryl, an unsubstituted or substituted amino group, an unsubstituted or substituted $C_1$-$C_{20}$ alkyl group, an unsubstituted or substituted $C_1$-$C_{20}$ alkyl amino group, an unsubstituted or substituted $C_6$-$C_{30}$ aromatic group and an unsubstituted or substituted $C_3$-$C_{30}$ hetero aromatic group, or adjacent two of $R_{21}$ to $R_{24}$ form an unsubstituted or substituted fused ring having boron and nitrogen and wherein at least two adjacent $R_{21}$ to $R_{24}$ form an unsubstituted or substituted fused ring having boron and nitrogen; each of $R_{25}$ to $R_{28}$ is independently selected from the group consisting of protium, deuterium, tritium, boryl, an unsubstituted or substituted $C_1$-$C_{20}$ alkyl group, an unsubstituted or substituted $C_1$-$C_{20}$ alkyl amino group, an unsubstituted or substituted $C_6$-$C_{30}$ aromatic group and an unsubstituted or substituted $C_3$-$C_{30}$ hetero aromatic group.

2. The organic light emitting diode of claim 1, wherein a Highest Occupied Molecular Orbital (HOMO) energy level of the first compound and a HOMO energy level of the second compound satisfy the following relationship in Equation (1):

$$|HOMO^{DF2} - HOMO^{DF1}| < 0.3 \text{ eV} \tag{1}$$

wherein $HOMO^{DF2}$ is a HOMO energy level of the second compound and $HOMO^{DF1}$ is a HOMO energy level of the first compound.

3. The organic light emitting diode of claim 1, wherein an energy level bandgap between a singlet energy level and a triplet energy level of the second compound is less than an energy level bandgap between a singlet energy level and a triplet energy level of the first compound.

4. The organic light emitting diode of claim 1, wherein an energy level bandgap between a Highest Occupied Molecular Orbital (HOMO) energy level and a Lowest Unoccupied Molecular Orbital (LUMO) energy level of the first compound is between about 2.6 eV and about 3.1 eV.

5. The organic light emitting diode of claim 1, wherein the first compound has the following structure of Formula 2A or Formula 2B:

[Formula 2A]

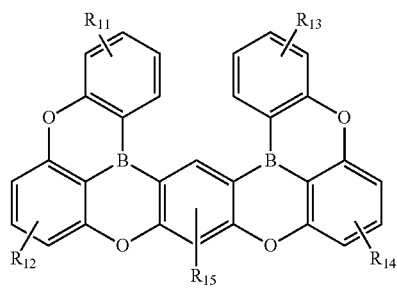

[Formula 2B]

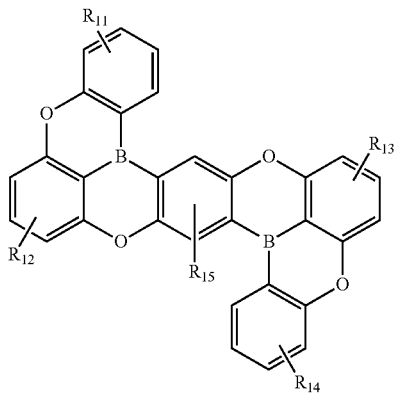

wherein each of $R_{11}$ to $R_{15}$ is independently selected from the group consisting of protium, deuterium, tritium, boryl, an unsubstituted or substituted amino group, an unsubstituted or substituted $C_1$-$C_{20}$ alkyl group, an unsubstituted or substituted $C_1$-$C_{20}$ alkyl amino group, an unsubstituted or substituted $C_6$-$C_{30}$ aromatic group and an unsubstituted or substituted $C_3$-$C_{30}$ hetero aromatic group, and wherein at least one of $R_{11}$ to $R_{14}$ is selected from the group consisting of an unsubstituted or substituted carbazolyl moiety, an unsubstituted or substituted acridinyl moiety, an unsubstituted or substituted acridonyl moiety, an unsubstituted or substituted phenazinyl moiety, an unsubstituted or substituted phenoxazinyl moiety and an unsubstituted or substituted phenothiazinyl moiety.

6. The organic light emitting diode of claim 1, wherein the first compound is selected from the following compounds:

[Formula 3]

1-1

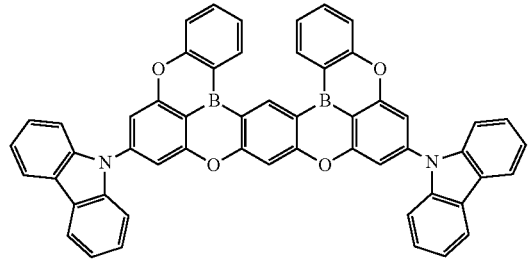

1-2

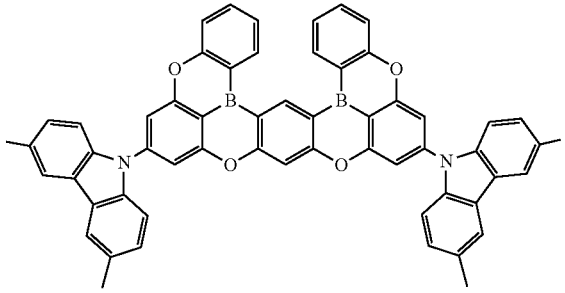

1-3

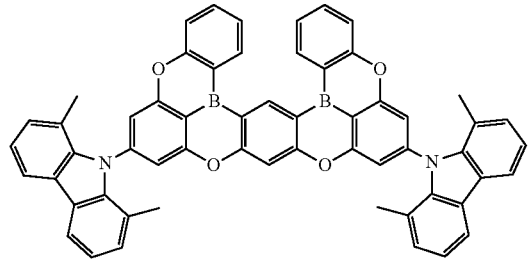

1-4

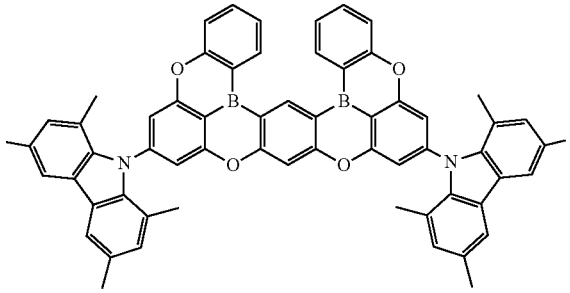

1-5
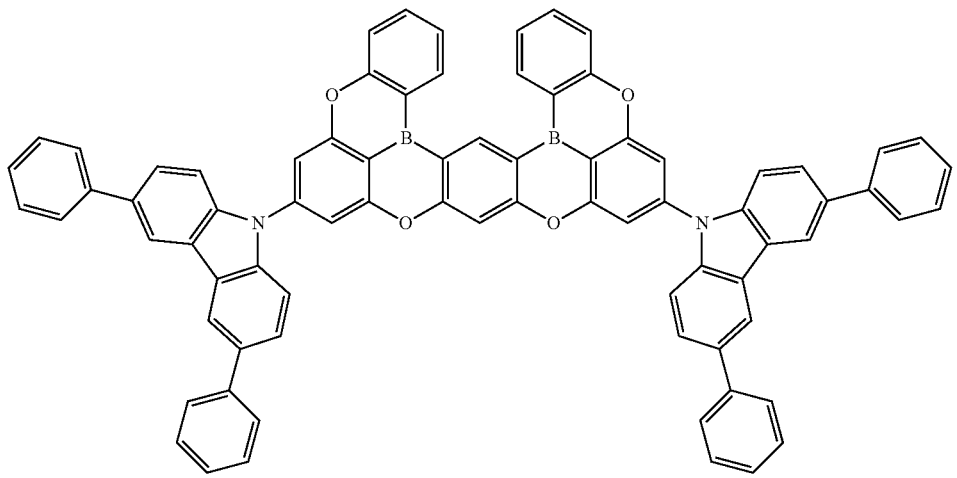
1-6
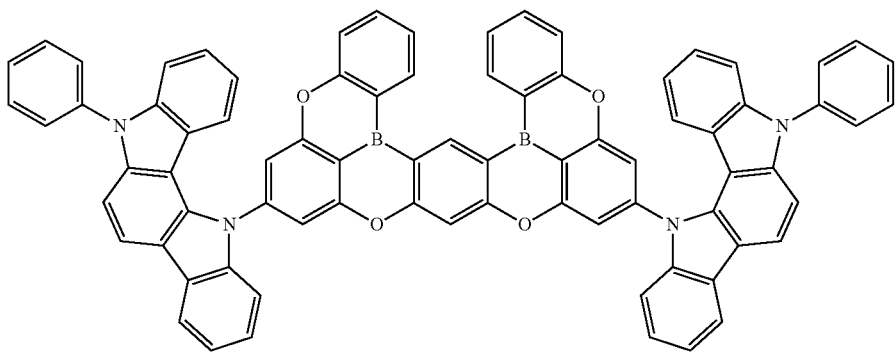
1-7
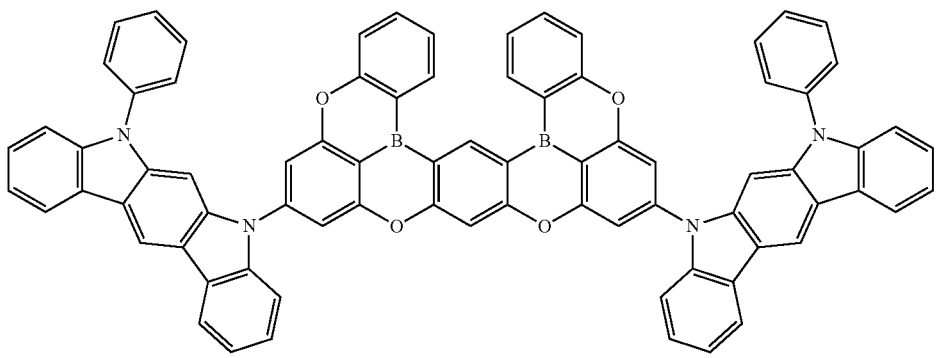
1-8
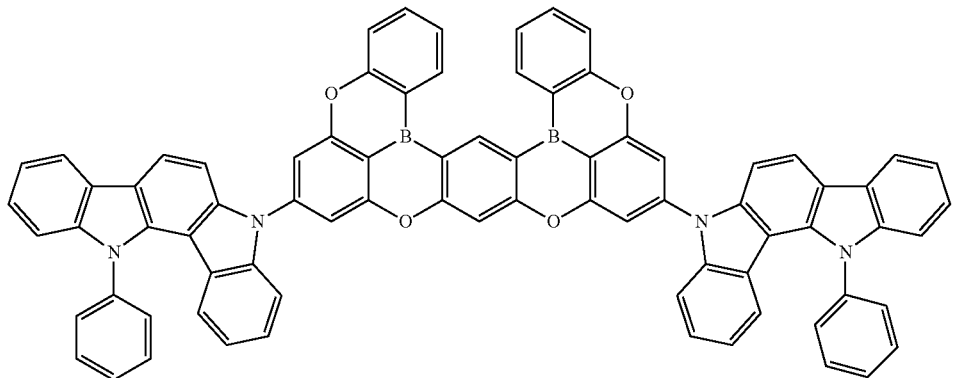

1-9
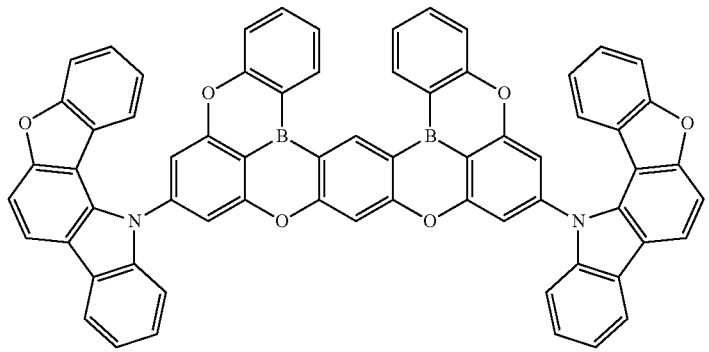
1-10
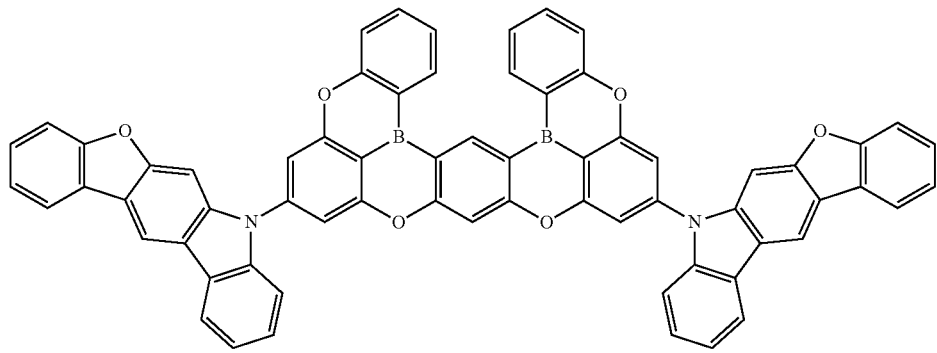
1-11
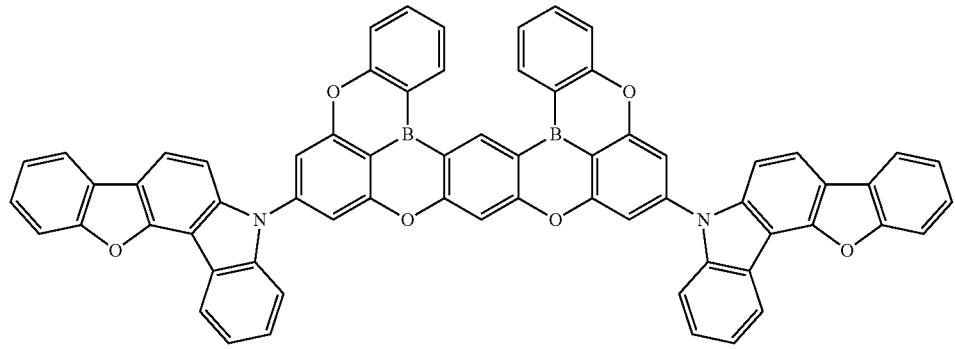
1-12
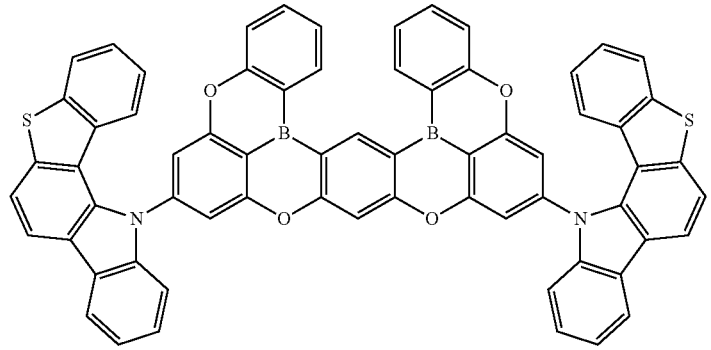

1-13
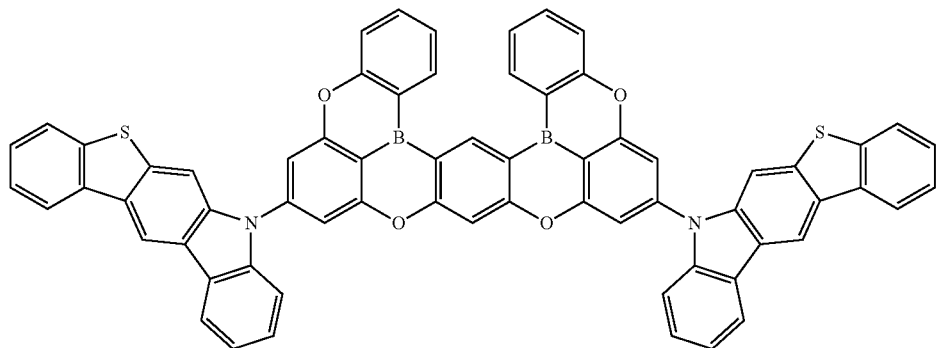
1-14
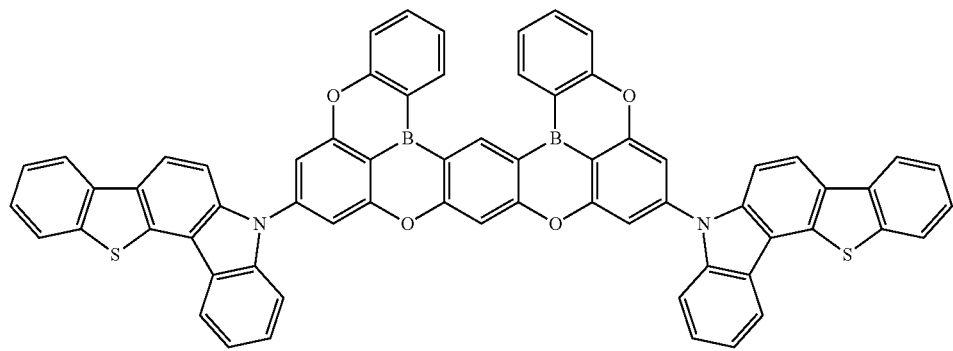
1-15
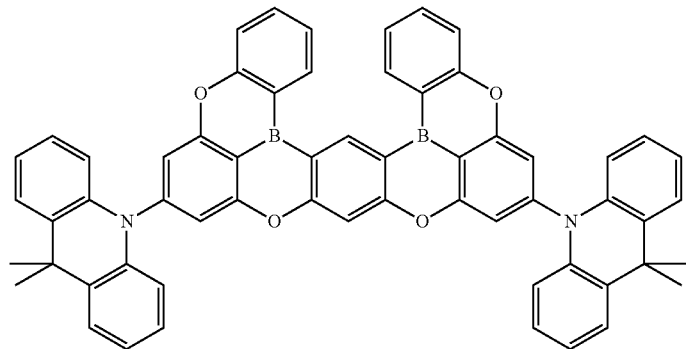
1-16
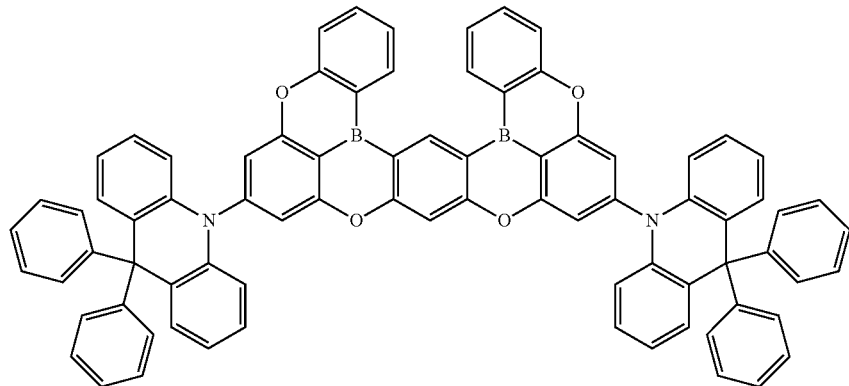

1-17
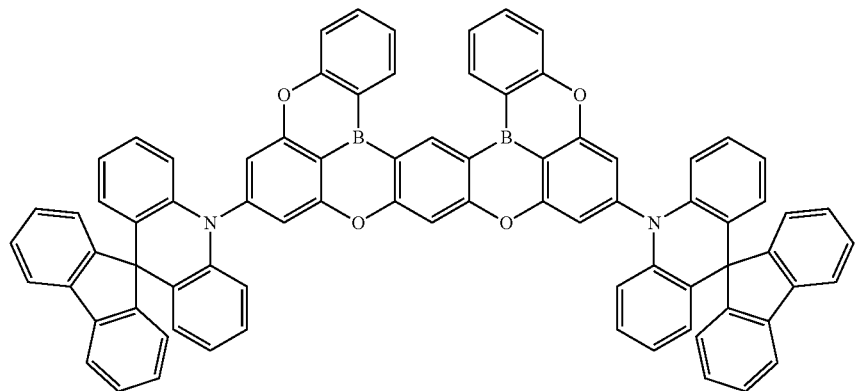
1-18
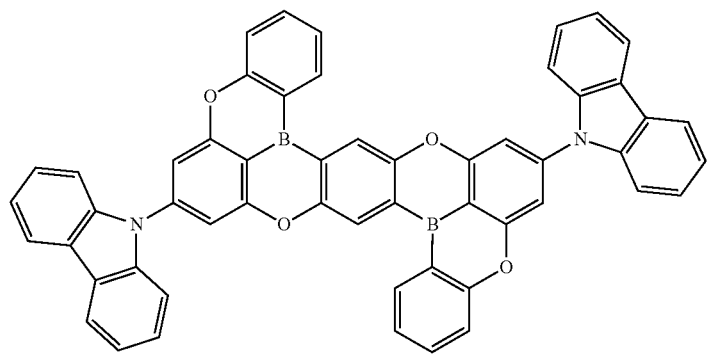
1-19
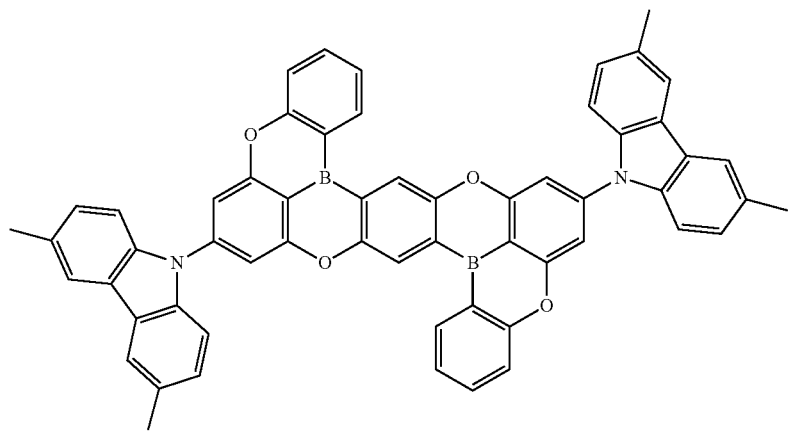
1-20
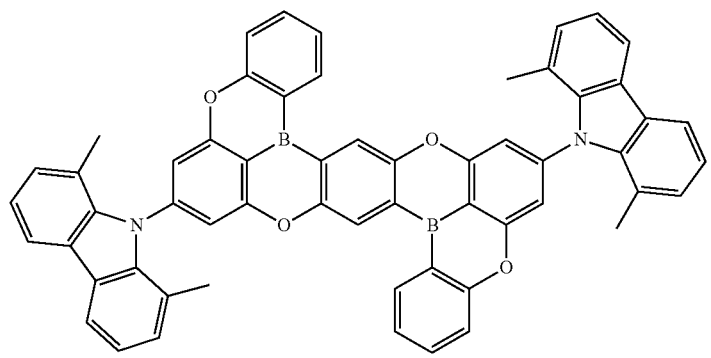

1-21
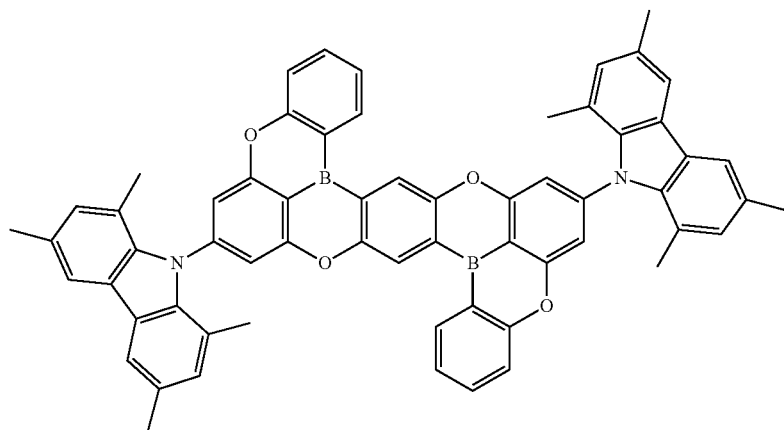
1-22
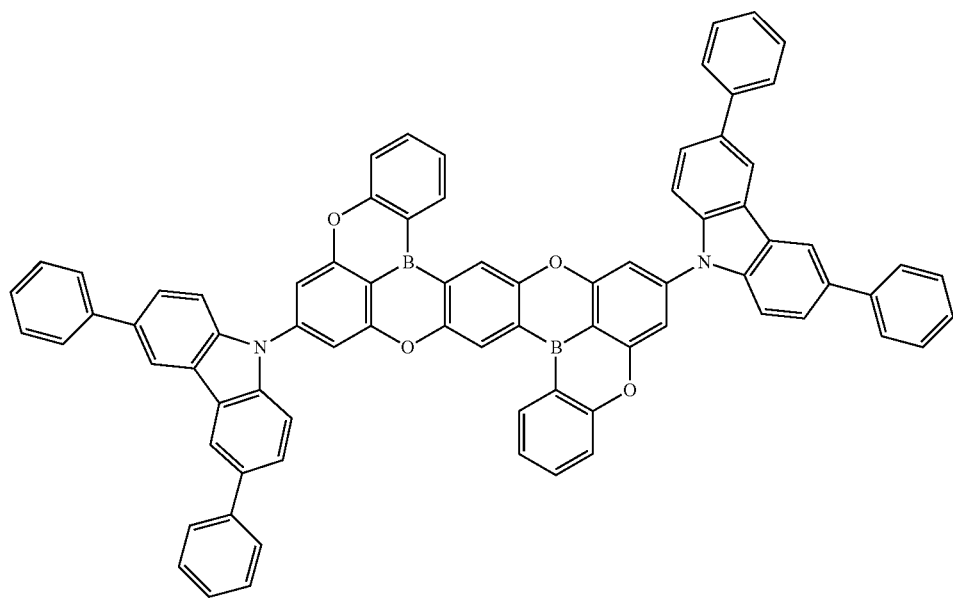
1-23
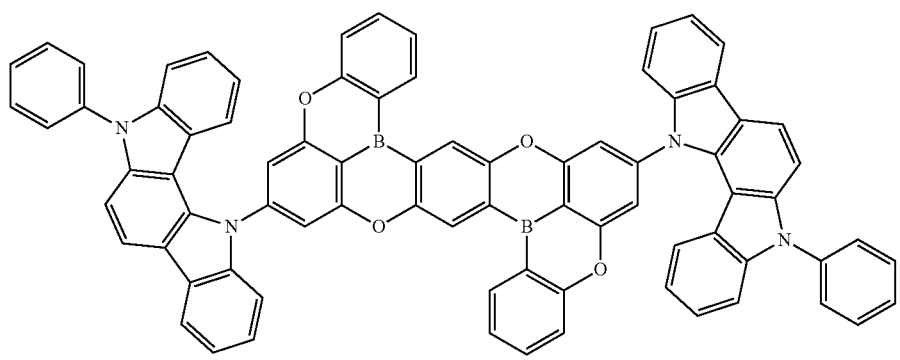

1-24
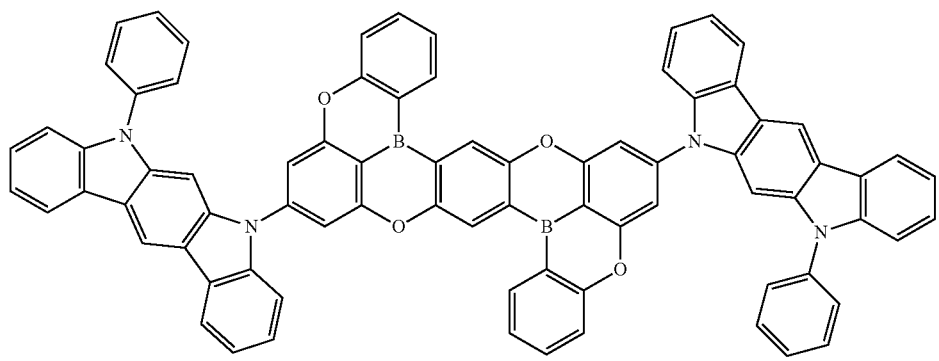
1-25
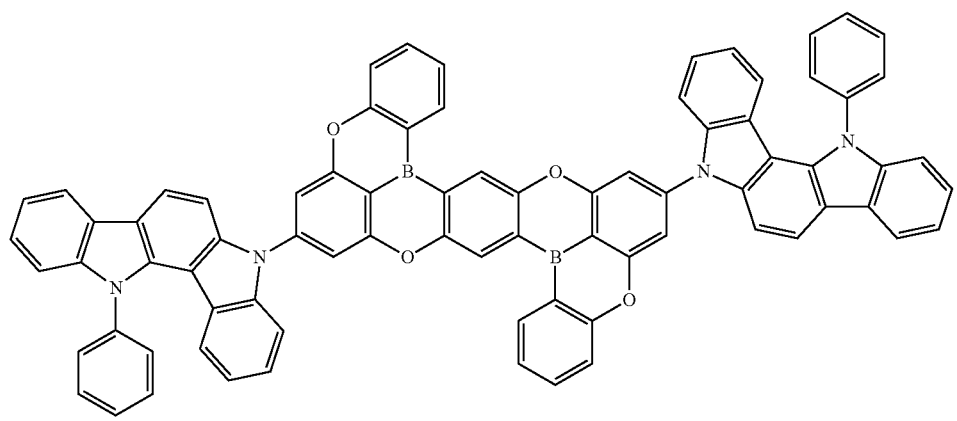
1-26
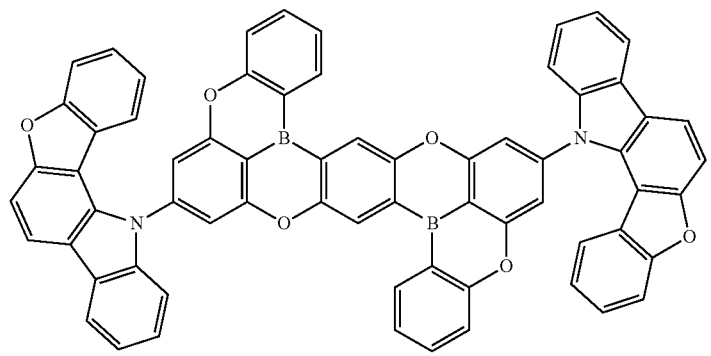
1-27
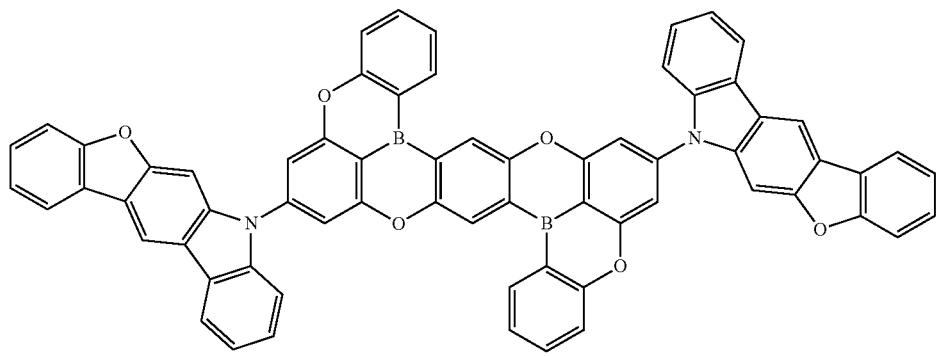

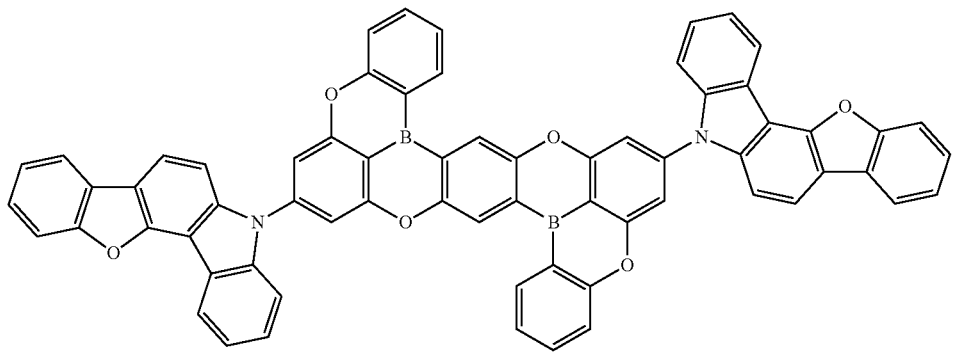
1-28
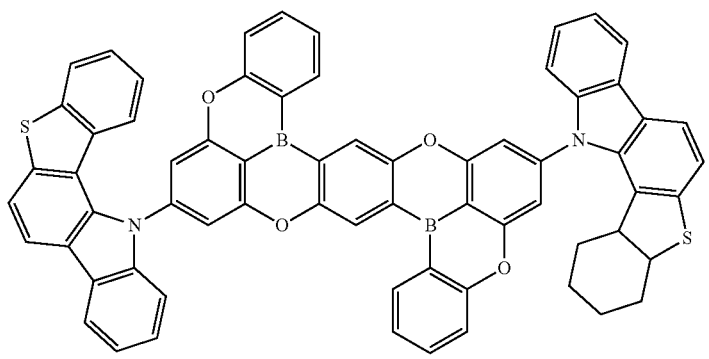
1-29
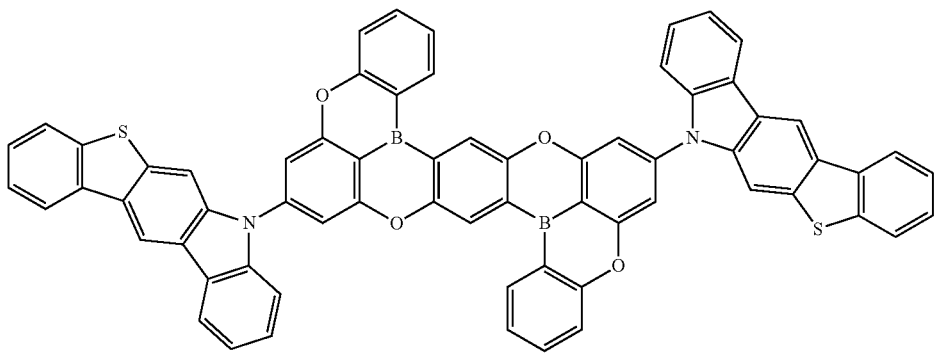
1-30
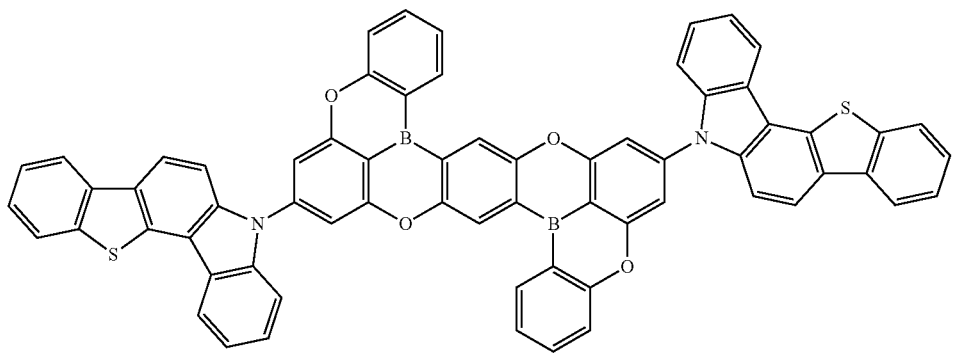
1-31

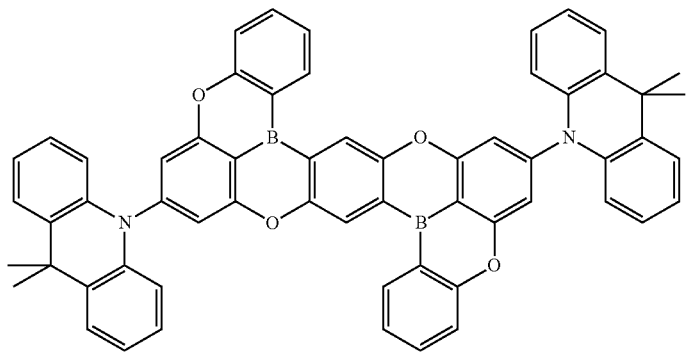
1-32
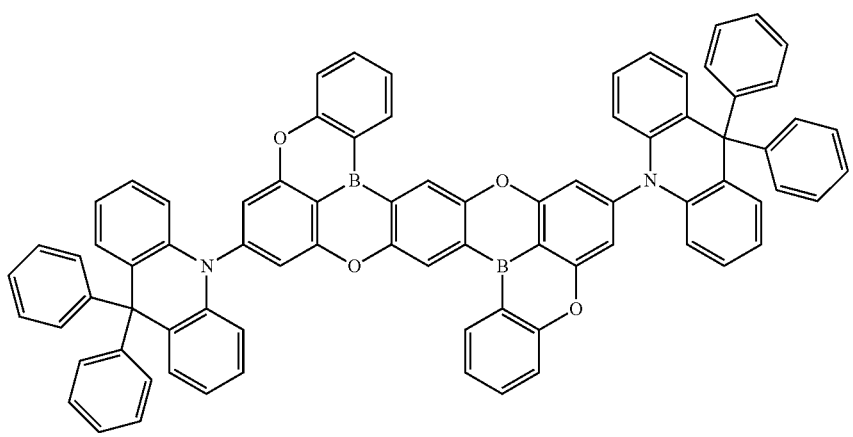
1-33
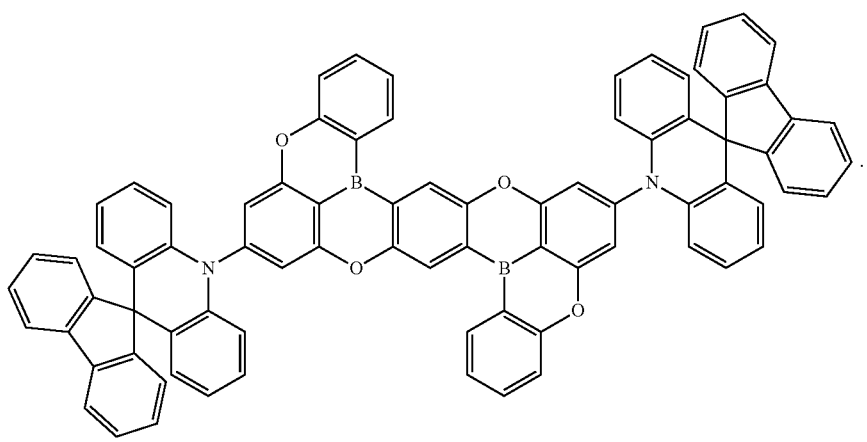
1-34

7. The organic light emitting diode of claim 1, wherein the second compound has the following structure of Formula 5A or Formula 5B:

[Formula 5A]

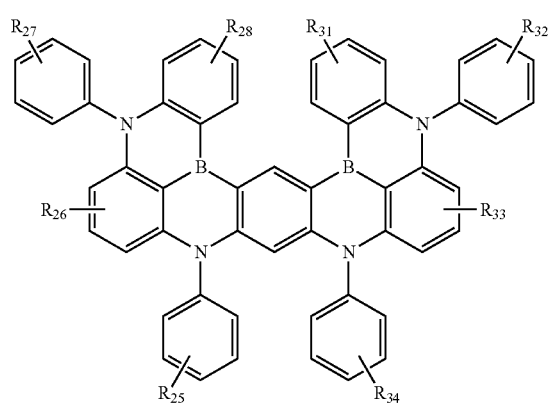

[Formula 5B]

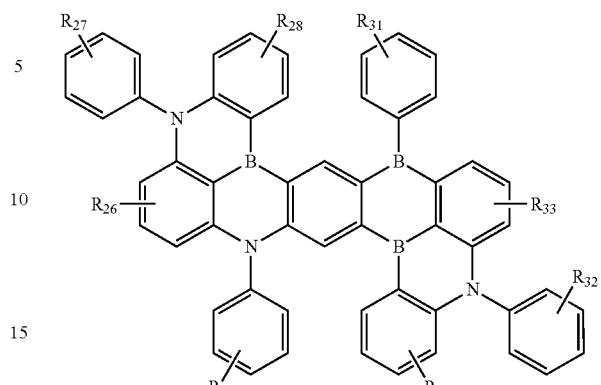

wherein each of $R_{25}$ to $R_{28}$ and each of $R_{31}$ to $R_{34}$ is independently selected from the group consisting of protium, deuterium, tritium, boryl, an unsubstituted or substituted $C_1$-$C_{20}$ alkyl group, an unsubstituted or substituted $C_1$-$C_{20}$ alkyl amino group, an unsubstituted or substituted $C_6$-$C_{30}$ aromatic group and an unsubstituted or substituted $C_3$-$C_{30}$ hetero aromatic group.

8. The organic light emitting diode of claim 1, wherein the second compound is selected from the following compounds:

[Formula 6]

2-1

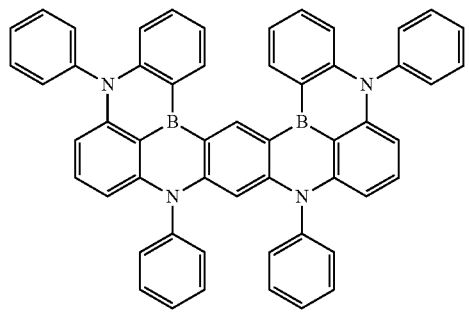

2-2

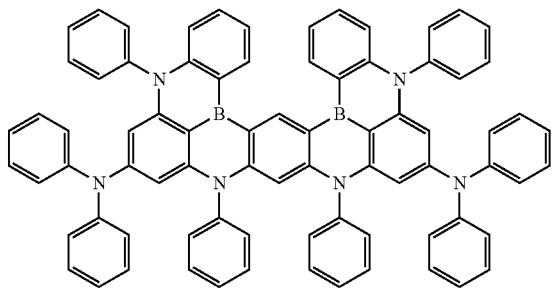

2-3

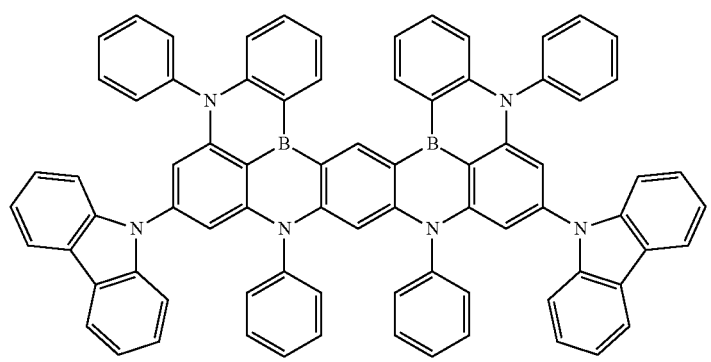

2-4
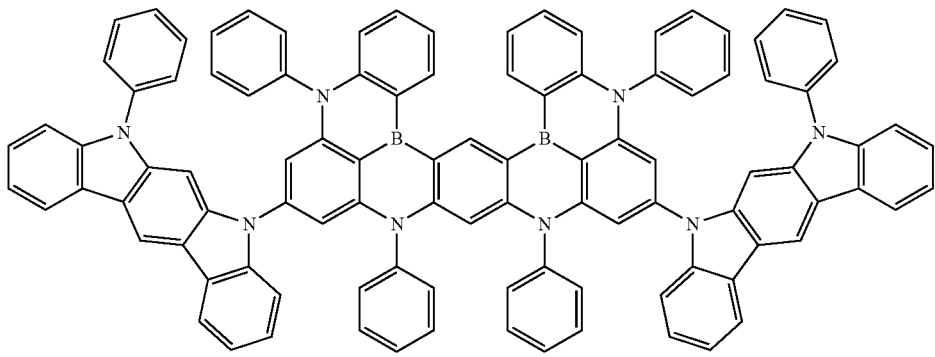
2-5
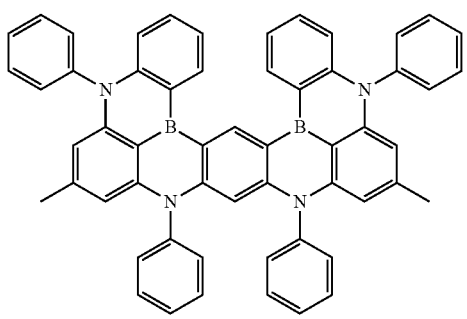
2-6
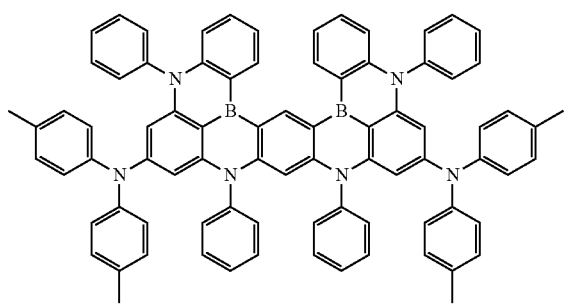
2-7
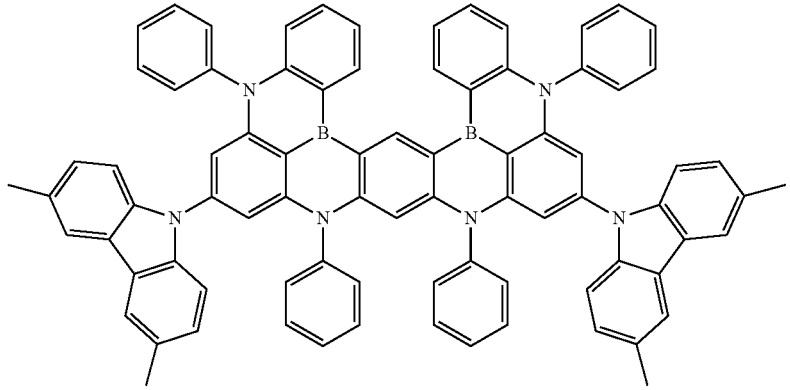
2-8
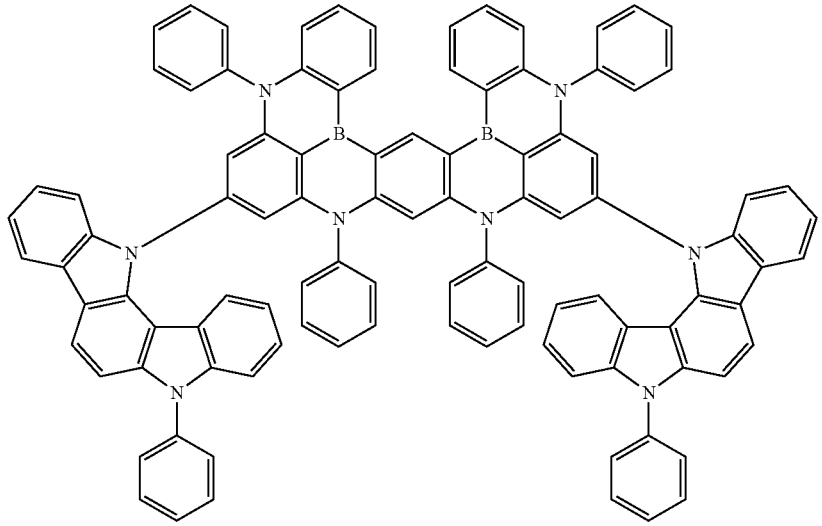

2-9
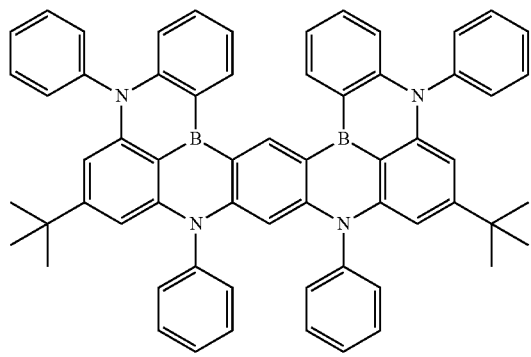
2-10
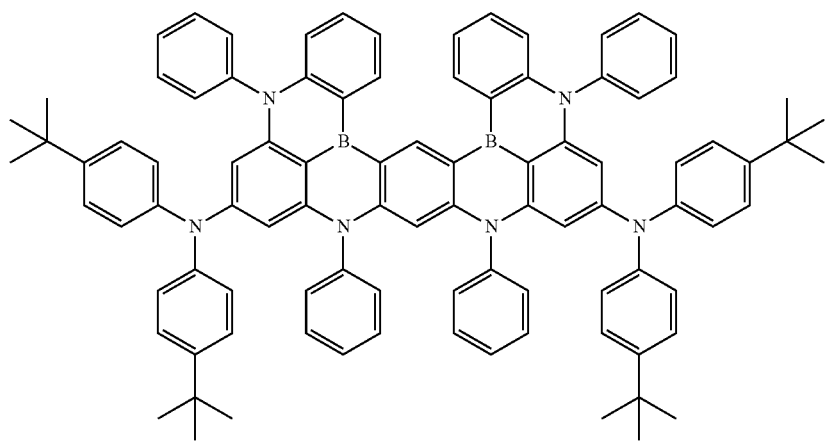
2-11
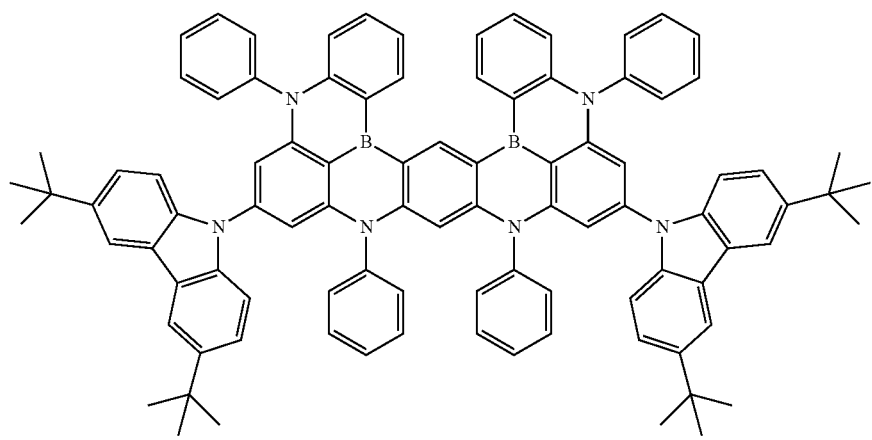
2-12
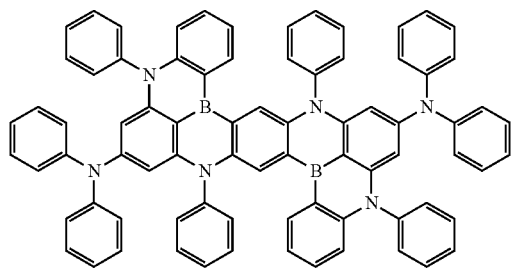
2-13
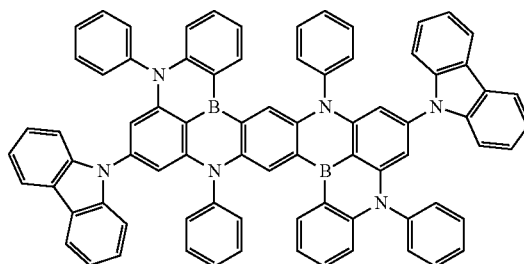

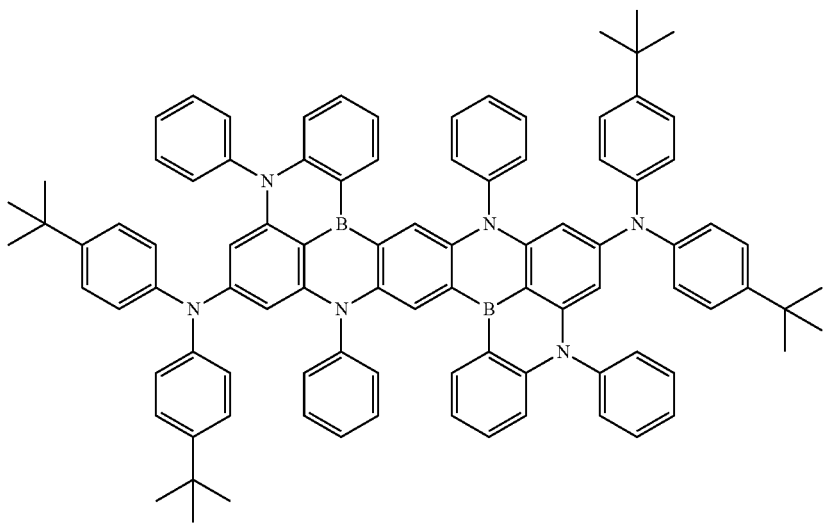

2-14

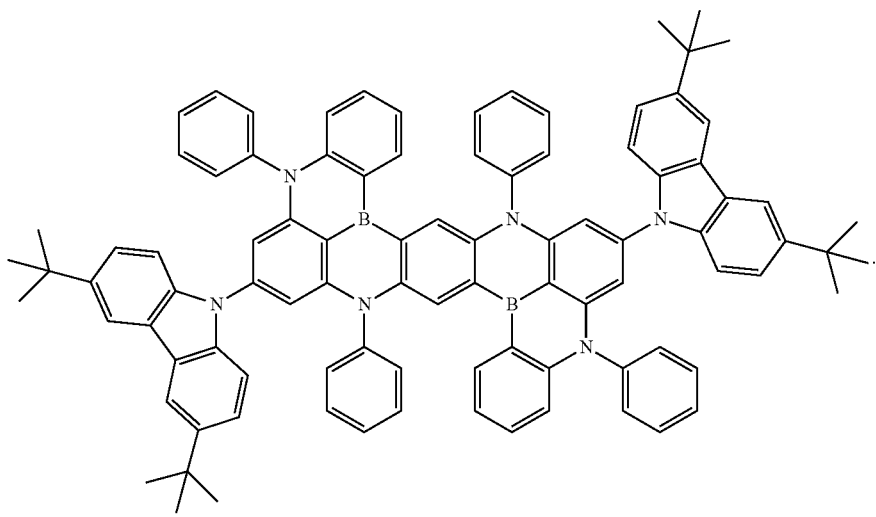

2-15

9. The organic light emitting diode of claim 1, wherein the at least one emitting material layer has a mono-layered structure.

10. The organic light emitting diode of claim 9, wherein the at least one emitting material layer further comprise a third compound.

11. The organic light emitting diode of claim 10, wherein a singlet exciton energy level of the third compound is higher than a singlet exciton energy level of the first compound.

12. The organic light emitting diode of claim 10, wherein contents of the first compound is between about 10 wt % and about 40 wt %, contents of the second compound is between about 0.1 wt % and about 5 wt % and contents of the third compound is between about 55 wt % to about 85 wt % in the at least one emitting material layer.

13. The organic light emitting diode of claim 1, wherein the at least one emitting material layer includes a first emitting material layer disposed between the first and second electrodes and a second emitting material layer disposed between the first electrode and the first emitting material layer or between the first emitting material layer and the second electrode, and wherein the first emitting material layer includes the first compound and the second emitting material layer includes the second compound.

14. The organic light emitting diode of claim 13, wherein the first emitting material layer further comprises a fourth compound and the second emitting material layer further comprises a fifth compound.

15. The organic light emitting diode of claim 14, wherein a singlet exciton energy level of the fourth compound is higher than a singlet exciton energy level of the first compound.

16. The organic light emitting diode of claim 14, wherein a singlet exciton energy level of the fifth compound is higher than a singlet exciton energy level of the second compound.

17. The organic light emitting diode of claim 13, wherein the at least one emitting material layer further comprises a third emitting material layer disposed oppositely to the second emitting material layer with respect to the first emitting material layer.

18. The organic light emitting diode of claim 17, wherein the third emitting material layer includes the second compound.

19. The organic light emitting diode of claim 1, wherein the emissive layer includes a first emitting part disposed between the first and second electrodes, a second emitting part disposed between the first emitting part and the second electrode and a charge generation layer disposed between the first and second emitting parts, and wherein at least one of the first and second emitting parts includes the at least one emitting material layer.

20. The organic light emitting diode of claim 1, wherein the first compound has the following structure of Formula 1':

[Formula 1']

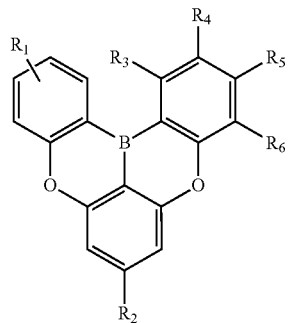

wherein the definitions of $R_1$ to $R_6$ are the same as the definitions in claim 1.

21. The organic light emitting diode of claim 1, wherein the second compound has the following structure of Formula 4':

[Formula 4']

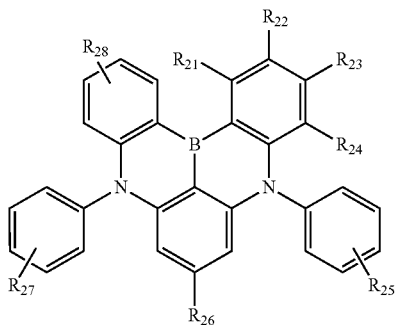

wherein the definitions of $R_{21}$ to $R_{28}$ are the same as definitions in claim 1.

22. An organic light emitting device comprising:
a substrate; and
an organic light emitting diode of claim 1 over the substrate.

* * * * *